United States Patent
Beardslee et al.

(10) Patent No.: US 7,072,818 B1
(45) Date of Patent: Jul. 4, 2006

(54) METHOD AND SYSTEM FOR DEBUGGING AN ELECTRONIC SYSTEM

(75) Inventors: John Mark Beardslee, Menlo Park, CA (US); Nils Endric Schubert, Sunnyvale, CA (US); Douglas L. Perry, San Ramon, CA (US)

(73) Assignee: Synplicity, Inc., Sunnyvale, CA (US)

( * ) Notice: Subject to any disclaimer, the term of this patent is extended or adjusted under 35 U.S.C. 154(b) by 827 days.

(21) Appl. No.: 09/724,585

(22) Filed: Nov. 28, 2000

Related U.S. Application Data

(60) Provisional application No. 60/230,068, filed on Aug. 31, 2000, and provisional application No. 60/168,266, filed on Nov. 30, 1999.

(51) Int. Cl.
G06F 17/50 (2006.01)

(52) U.S. Cl. .................. 703/14; 703/16; 716/4

(58) Field of Classification Search .................. 703/17, 703/15, 13, 16, 14; 438/14; 250/207; 371/21.1; 324/765; 714/741; 716/4, 6; 717/124; 395/704, 395/384, 500
See application file for complete search history.

(56) References Cited

U.S. PATENT DOCUMENTS

| 4,306,286 A | 12/1981 | Cocke et al. .................. 703/15 |
| 4,590,581 A | 5/1986 | Widdoes, Jr. .................. 703/2 |
| 4,635,218 A | 1/1987 | Widdoes, Jr. ................ 703/14 |

(Continued)

FOREIGN PATENT DOCUMENTS

| WO | WO 00/043884 A1 | 7/2000 |
| WO | WO 01/063434 A1 | 8/2001 |
| WO | WO 01/171876 A1 | 9/2001 |

OTHER PUBLICATIONS

Bulet Dervisoglu, "Design for Testability: It is time to deliver it for Time–to–Market," Proceedings of the International Test Conference, 1999.

Keshava Iyengar Satish, "Tutorial on Design For Testability (DFT): An ASIC Design Philosophy for testability from Chips to Systems," Sixth Annual IEEE International ASIC Conference and Exhibit, 1993.

Jan Liband, "Techniques for Real–Time Debugging," Embedded Systems Programming, vol. 8, No. 4, Apr. 1995.

Dr. Vinod Agarwal, "Embedded IC Test: A New Plateau for DFT," Evaluation Engineering, vol. 38, No. 9, Sep. 1999.

Stephen O'Reilly, "Debugging Drivers with Emulators and Logic Analyzers," Embedded Systems Programming, vol. 11, No. 2, Feb. 1998.

Jack G. Ganssle, "Debuggers for Modern Embedded Systems," Embedded Systems Programming, Nov. 1998.

Brent Miller, "Scan Conversion of ASICs," Circuit Design, vol. 7, No. 2, Feb. 1990.

(Continued)

*Primary Examiner*—Kevin J. Teska
*Assistant Examiner*—Kandasamy Thangavelu
(74) *Attorney, Agent, or Firm*—Blakely, Sokoloff, Taylor & Zafman LLP

(57) ABSTRACT

Techniques and systems for debugging an electronic system having instrumentation circuitry included therein are disclosed. The techniques and systems facilitate analysis, diagnosis and debugging fabricated hardware designs at a Hardware Description Language (HDL) level. Although the hardware designs (which were designed in HDL) have been fabricated in integrated circuit products with limited input/output pins, the invention enables the hardware designs within the integrated circuit products to be comprehensively analyzed, diagnosed, and debugged at the HDL level at speed. The ability to debug hardware designs at the HDL level facilitates correction or adjustment of the HDL description of the hardware designs.

46 Claims, 26 Drawing Sheets

U.S. PATENT DOCUMENTS

| | | |
|---|---|---|
| 4,675,646 A | 6/1987 | Lauer .................... 340/146.2 |
| 4,845,712 A | 7/1989 | Sanner et al. .............. 714/736 |
| 4,901,259 A | 2/1990 | Watkins ........................ 703/2 |
| 4,937,770 A | 6/1990 | Samuels et al. ............. 703/16 |
| 4,937,827 A | 6/1990 | Beck et al. ................... 714/33 |
| 5,036,473 A | 7/1991 | Butts et al. ................... 703/23 |
| 5,146,460 A | 9/1992 | Ackerman et al. ........... 714/33 |
| 5,281,864 A | 1/1994 | Hahn et al. |
| 5,321,828 A | 6/1994 | Phillips et al. |
| 5,329,470 A | 7/1994 | Sample et al. |
| 5,329,471 A | 7/1994 | Swoboda et al. |
| 5,369,593 A | 11/1994 | Papamarcos et al. |
| 5,412,260 A | 5/1995 | Tsui et al. |
| 5,425,036 A | 6/1995 | Liu et al. |
| 5,537,580 A | 7/1996 | Giomi et al. |
| 5,546,562 A | 8/1996 | Patel |
| 5,560,009 A | 9/1996 | Lenkov et al. |
| 5,568,437 A | 10/1996 | Jamal ........................ 365/201 |
| 5,572,712 A | 11/1996 | Jamal ........................ 716/18 |
| 5,574,388 A | 11/1996 | Barbier et al. |
| 5,581,742 A | 12/1996 | Lin et al. |
| 5,596,587 A | 1/1997 | Douglas et al. |
| 5,640,542 A | 6/1997 | Whitsel et al. |
| 5,644,515 A | 7/1997 | Sample et al. |
| 5,661,662 A | 8/1997 | Butts et al. ................... 716/16 |
| 5,663,900 A | 9/1997 | Bhandari et al. |
| 5,717,699 A | 2/1998 | Haag et al. |
| 5,748,875 A | 5/1998 | Tzori |
| 5,751,735 A | 5/1998 | Tobin et al. |
| 5,754,827 A | 5/1998 | Barbier et al. |
| 5,757,819 A | 5/1998 | Segars |
| 5,777,489 A | 7/1998 | Barbier et al. |
| 5,790,832 A | 8/1998 | Barbier et al. |
| 5,801,956 A | 9/1998 | Kawamura et al. ......... 364/489 |
| 5,805,859 A | 9/1998 | Giramma et al. |
| 5,812,414 A | 9/1998 | Butts et al. |
| 5,812,562 A | 9/1998 | Baeg |
| 5,822,564 A | 10/1998 | Chilton et al. |
| 5,831,868 A | 11/1998 | Beausang et al. ........... 364/489 |
| 5,859,993 A * | 1/1999 | Snyder ....................... 395/384 |
| 5,870,410 A | 2/1999 | Norman et al. |
| 5,905,883 A | 5/1999 | Kasuya ....................... 395/500 |
| 5,907,697 A | 5/1999 | Barbier et al. |
| 5,937,190 A * | 8/1999 | Gregory et al. ............. 395/704 |
| 5,943,490 A | 8/1999 | Sample |
| 5,960,191 A | 9/1999 | Sample et al. |
| 5,963,735 A | 10/1999 | Sample et al. |
| 5,991,523 A | 11/1999 | Williams et al. ....... 395/500.19 |
| 5,999,725 A | 12/1999 | Barbier et al. |
| 6,006,022 A * | 12/1999 | Rhim et al. ............ 395/500.02 |
| 6,009,256 A | 12/1999 | Tseng et al. |
| 6,014,334 A | 1/2000 | Patel et al. ........... 365/189.08 |
| 6,021,447 A | 2/2000 | Szeto et al. |
| 6,026,230 A | 2/2000 | Lin et al. |
| 6,041,176 A | 3/2000 | Shiell |
| 6,057,706 A | 5/2000 | Barbier et al. |
| 6,107,821 A | 8/2000 | Kelem et al. |
| 6,132,109 A | 10/2000 | Gregory et al. |
| 6,157,210 A | 12/2000 | Zaveri et al. |
| 6,182,247 B1 | 1/2001 | Herrmann et al. ............ 714/39 |
| 6,182,268 B1 | 1/2001 | McElvain |
| 6,188,975 B1 | 2/2001 | Gay |
| 6,195,629 B1 * | 2/2001 | Bargh et al. .................. 703/17 |
| 6,212,650 B1 | 4/2001 | Guccione |
| 6,240,376 B1 | 5/2001 | Raynaud et al. |
| 6,247,147 B1 | 6/2001 | Beenstra et al. |
| 6,272,451 B1 * | 8/2001 | Mason et al. ................. 703/13 |
| 6,286,114 B1 | 9/2001 | Veenstra et al. |
| 6,311,317 B1 | 10/2001 | Khoche et al. |
| 6,336,087 B1 * | 1/2002 | Burgun et al. ................ 703/15 |
| 6,353,906 B1 * | 3/2002 | Smith et al. ................. 714/741 |
| 6,389,586 B1 | 5/2002 | McElvain |
| 6,438,735 B1 | 8/2002 | McElvain et al. |
| 6,449,762 B1 | 9/2002 | McElvain |
| 6,470,478 B1 * | 10/2002 | Bargh et al. .................... 716/4 |
| 6,551,844 B1 * | 4/2003 | Eldridge et al. .............. 438/14 |
| 6,587,995 B1 | 7/2003 | Duboc et al. |
| 6,618,854 B1 * | 9/2003 | Mann ......................... 717/124 |
| 6,625,787 B1 * | 9/2003 | Baxter et al. ................... 716/6 |
| 6,779,145 B1 | 8/2004 | Edwards et al. |
| 6,785,854 B1 | 8/2004 | Jaramillo et al. |
| 6,789,217 B1 | 9/2004 | Slaugh et al. |
| 6,791,352 B1 | 9/2004 | Verdoorn et al. |
| 6,795,963 B1 | 9/2004 | Andersen et al. |
| 6,799,128 B1 | 9/2004 | Duff et al. |
| 6,822,474 B1 | 11/2004 | Chaudhari |
| 6,823,224 B1 | 11/2004 | Wood et al. |
| 6,826,717 B1 | 11/2004 | Draper et al. |
| 6,839,654 B1 | 1/2005 | Röllig et al. |
| 6,839,874 B1 | 1/2005 | Fang |
| 6,859,892 B1 | 2/2005 | Bolding et al. |
| 6,868,376 B1 | 3/2005 | Swoboda |
| 6,894,530 B1 | 5/2005 | Davidson et al. |
| 6,895,365 B1 | 5/2005 | Voorhees et al. |
| 6,895,372 B1 | 5/2005 | Knebel et al. |
| 6,904,577 B1 | 6/2005 | Schubert et al. |
| 2004/0111252 A1 | 6/2004 | Burgun et al. |
| 2004/0181385 A1 | 9/2004 | Milne et al. |

OTHER PUBLICATIONS

Jerry Bauer et al., "A Reconfigurable Logic Machine for Fast Event–Driven Simulation," Design Automation Conference Proceedings (DAC), Jun. 1998, pp. 668–671.

Synopsys, Inc., "BSD Compiler" datasheet, www.synopsys.com/products/test/bsd_ds.html.

Synopsys, Inc., "DFT Compiler" Next Generation 1–Pass Test Synthesis Technology Backgrounder, Apr. 2000.

Cynthia Cousineau et al., "Design of a JTAG Based Run Time Reconfigurable System," 7th IEEE Symposium on Field Programmable Custom Computing Machines, 1999.

John Andrews, "An Embedded JTAG, System Test Architecture," Proceedings of ELECTRO, 1994.

Shen XuBang et al., "Design and Implementation of a JTAG Boundary–Scan Interface Controller," Proceedings of the 2nd IEEE Asian Test Symposium, 1993.

"JTAG for system emulation," Electronic Engineering, vol. 65, No. 794, Feb. 1993.

R.P. van Riessen et al., "Design and Implementation of a Hierarchical Testable Architecture using the Boundary Scan Standard," 1st European Test Conference, IEEE, 1989.

Ing–Jer Huang et al., "ICEBERG: An Embedded In–circuit Emulator Synthesizer for Microcontrollers," Proceedings of the 36th Design Automation Conference (DAC), 1999.

Ross Bannatyne, "Debugging Aids for Systems–on–a–Chip," Proceedings of North Con, 1998.

Robert J. Hasslen et al., "A Validation Strategy for Embedded Core ASICS," Proceedings of the Third Annual IEEE ASIC Seminar and Exhibit, Sep. 1990.

Max Baron et al., "A Real–Time Performance Analyzer," VLSI Systems Design, May 4, 1987.

Indradeep Ghosh, "A BIST Scheme for RTL Circuits Based on Symbolic Testability Analysis," IEEE Transactions on Computer–Aided Design of Integrated Circuits and Systems, vol. 19, No. 1, Jan. 2000.

Indradeep Ghosh, "A Design–for–Testability Technique for Register–Transfer Level Circuits Using Control/Data Flow Extraction," IEEE Transactions on Computer–Aided Design of Integrated Circuits and Systems, vol. 17, No. 8, Aug. 1998.
Barbara Tuck, "Test–bench tools ease tedious, time–consuming manual efforts," Computer Design, May 1996.
Krzysztof Badzmirowski et al., "Diagnosis of Digital/Analogue Measurement System with Application of Test Bus and Distributed Diagnostic Subsystem," Proceedings of the IEEE Instrumentation and Measurement Technology Conference, 1998.
Stephen Pateras et al., "BIST: A Test & Diagnosis Methodology for Complex, High Reliability Electronics Systems," 1997 IEEE Autotestcon Proceedings.
John Sweeney, "A Method For Using JTAG Boundary Scan For Diagnosing Module Level Functional Failures," Proceedings of WesCon Conference, 1988.
Wen–Jong Fang et al., "A Multi–Level FPGA Synthesis Method Supporting HDL Debugging for Emulation–Based Designs," Proceedings of the Asian and South Pacific Design Automation Conference, 1999.
David Ruimy Gonzales, "Tool Reusable for DSP System Emulation and Board Production Testing," IEEE Technical Applications Conference, Northcon, 1996.
Ray Weiss, "ICEs try to target higher clock rates, more processors," Computer Design, vol. 35, No. 2, Feb. 1996.
Mike Winters, "Using IEEE–1149.1 For In–Circuit Emulation," Proceedings of WesCon, 1994.
Christopher Perez, "Tools for Embedded–Systems Debugging," Dr. Dobbs Journal, Mar. 1993.
Kristen Ahrens, "Test Standard Speeds On–Board Programming," Electronic Design, Nov. 7, 1994.
Oliver Bringmann et al., "Target Architecture Oriented High–Level Synthesis for Multi–FPGA Based Emulation," Proceedings of the Design Automation and Test Conference, DATE, 2000.
Karlheinz Weiss et al., "Exploiting FPGA—Features during the Emulation of a Fast Reactive Embedded System," Proceedings of the 1999 ACM/SIGDA International Symposium on Field Programmable Gate Arrays, ACM, 1999.
Gernot Koch et al., "Breakpoints and Breakpoint Detection in Source Level Emulation," $9^{th}$ International Symposium on System Synthesis, 1996.
Gernot Koch et al., "Co–Emulation and Debugging of HW/SW–Systems," $10^{th}$ International Symposium on System Synthesis (ISSS), 1997.
Gernot Koch et al., "System prototyping in the COBRA Project," International Journal Microprocessors and Microsystems, Elsevier Science, vol. 20, No. 3, 1996.
G. Haug et al., "Behavioral Emulation of Synthesized RT–level Descriptions Using VLIW Architectures," $9^{th}$ International Workshop on Rapid System Prototyping, 1998.
Gernot Koch et al., "System Validation by Source Level Emulation of Behavioral VHDL Specifications," $6^{th}$ International Workshop on Rapid System Prototyping, 1995.
Peter Clarke, "DATE99: Temento to launch scan insertion tool," EETimes.com, Mar. 4, 1999.
Alexander Miczo, "Digital Logic Testing and Simulation," Harper & Row, Publishers, 1996.
Xilinx, "ChipScope Software and ILA Cores User Manual," v1.1, Jun. 30, 2000.
Gernot Koch et al., "Breakpoints and Breakpoint Detection in Source Level Emulation," ACM Transactions on Design Automation of Electronic Systems, vol. 3, No. 2, 1998.
Samiha Mourad et al., "123 Logic Analyzers", The Engineering Handbook, pp. 1325–1330, CRC Press, Inc., 1996.
PCT International Search Report, re PCT/US 00/32543, Jun. 28, 2001.
U.S. Appl. No. 09/724,840, filed Nov. 28, 2000.
U.S. Appl. No. 09/724,839, filed Nov. 28, 2000.
U.S. Appl. No. 09/724,702, filed Nov. 28, 2000.
Ableidinger et al., "Multi–Core Embedded Debug for Structured ASIC Systems", DesignCon 2004, Feb. 2004, 23 pgs.
Actel Corporation, "Actel Silicon Explorer II –User's Guide", Mar. 2004; cover page, page ii and pp.3–43.
Altera Corporation, "Quartus II Handbook, vol. 3", Section IV–1, May 2005; pp. 9/1–9/14; pp. 10/1–10/46; pp. 11/1–11/46; pp. 12/1–12/10.
Altera Corporation, "SignalTap II Features", http://www.altera.com/products/software/products/quartus2/verification/signaltap2/sig–feature_descriptions.html, Jun. 2005, pp. 1–4.
ASSET Intertech, Inc., "ScanWorks Diagnostic & Repair Station Bundle", Document 20019–H, Jun. 2005, pp. 1–6.
Automotive DesignLine, "Lattice Semi in–system configuration engine goes into JTAG system", http://www.automotivedesignline.com, Feb. 14, 2005, pp. 1–3.
Bennetts, R.G., "Boundary Scan Tutorial", ASSET Intertech Inc., Sep. 2002, pp. 1–58.
First Silicon Solutions, Technical Data for CLAM System for Actel FPGA Devices , http://www.fs2.com, Jun. 2005, 2 pgs.
First Silicon Solutions, Inc., "Trace Instrumentation and Architectures for OCP Buses", DATE Conference 2005, Mar. 2005, 16 pgs.
First Silicon Solutions, Inc., "Getting Started – FS2 System Analyzer for QuickLogic Eclipse Devices", http://www.fs2.com, Jan. 2004, pp. 1–29.
First Silicon Solutions, Inc., "Getting Started –System Analyzer for AMD Geode GX and Geode LX Processors", http://www.fs2.com, May 2005, pp. 1–45.
First Silicon Solutions, Inc., "Technical Data for ISA–ACTEL51 In–Target System Analyzer for Actel Core8051 Microcontroller Cores", http://www.fs2.com, Jun. 2005, 2 pages.
First Silicon Solutions, Inc., "Technical Data for ISA–ARM System Analyzer for ARM Processors and Cores", http://www.fs2.com, Jun. 2005, 2 pgs.
First Silicon Solutions, Inc., "Technical Data for ISA–CAST51 In–Target System Analyzer for CAST 8051 Synthesizable Microcontroller Cores", http://www.fs2.com, Jun. 2005, 2 pgs.
First Silicon Solutions, Inc., "Technical Data for FS2 System Analyzer for QuickLogic Eclipse FPGA Devices", http://www.fs2.com, Jun. 2005, 2 pp.
First Silicon Solutions, Inc., "Technical Data for System Navigator OE for AMD Geode GX Processors", http://www.fs2.com, Jun. 2005, 2 pgs.
First Silicon Solutions, Inc., "Technical Data for System Navigator OE for MIPS32 and MIPS64 Cores", http://www.fs2.com, Jun. 2005, 2 pgs.
First Silicon Solutions, Inc., "Technical Data for In–Target System Analyzer for Altera Nios Embedded Processor Systems", http://www.fs2.com, Jun. 2005, 2 pgs.

First Silicon Solutions, Inc., "Technical Data for FS2 System Analyzer for QuickLogic QuickMIPS ESP Devices", http://www.fs2.com, Jun. 2005, 2 pgs.

First Silicon Solutions, Inc., "Technical Data for In–Target System Analyzer for LSI Logic ZSP500 DSP Core", http://www.fs2.com, Jun. 2005, 2 pgs.

First Silicon Solutions, Inc., "Getting Started –ISA–Jazz Debugger", http://www.fs2.com, Apr. 2004, pp. 1–22.

First Silicon Solutions, Inc., "Technical Data for FS2 On–Chip Logic Navigator System for Actel FPGA Devices", http://www.fs2.com, Jun. 2005, 2 pgs.

First Silicon Solutions, Inc., "Technical Data for Logic Navigator System for Atmel FPGA Devices", http://www.fs2.com, Jun. 2005, 3 pgs.

First Silicon Solutions, Inc., "Preliminary Technical Data for FS2 MED System for SoC Multi–Core Embedded Debug", http://www.fs2.com, Feb. 2004, 2 pgs.

First Silicon Solutions, Inc., "Technical Data for ISA–M8051EW In–Target System Analyzer for Mentor Grphics M8051EW Synthesizable Microcontroller Core", http://www.fs2.com, Jun. 2005, 2 pgs.

First Silicon Solutions, Inc., "Getting Started –System Navigator for MIPS Cores", http://www.fs2.com, Mar. 2005, pp. 1–49.

First Silicon Solutions, Inc., "Preliminary Technical Data for AMBA Navigator AMBA On–Chip Bus Analyzer for AHB Bus Systems", http://www.fs2.com, Jun. 2005, 2 pgs.

First Silicon Solutionsm Inc., "Preliminary Technical Data for OCP Navigator On–Chip Bus Socket Analyzer for OCP Bus Systems", http://www.fs2.com, Jun. 2005, 2 pgs.

First Silicon Solutions, Inc., "Preliminary Technical Data for SiliconBackplane Navigator On–Chip Bus Analyzer for Sonics SiliconBackplane uNetwork", http://www.fs2.com, Jun. 2005, 2 pgs.

First Silicon Solutions, Inc., "NIOS II Hardware Reference–System Analyzer for the Nios II Processor Core", http://www.fs2.com, Nov. 2004, pp. 1–33.

First Silicon Solutions, Inc., "NIOS II Software User Guide–System Analyzer for the Nios II Processor Core", http://www.fs2.com, Nov. 2004, pp. 1–34.

First Silicon Solutions, Inc., "Getting Started –FS2 System Analyzer for QuickLogic QuickMIPS Devices", http://www.fs2.com, Feb. 2004, pp. 1–44.

First Silicon Solutions, Inc., "Technical Data for System Navigator for AMD Geode GX Processors", http://www.fs2.com, Jun. 2005, 2 pgs.

First Silicon Solutions, Inc., "Technical Data for System Navigator for MIPS32 ad MIPS64 Cores", http://www.fs2.com, Jun. 2005, 2 pgs.

First Silicon Solutions, Inc., "Technical Data for System Navigator for Tensilica Xtensa Processors", http://www.fs2.com, Jun. 2005, 2 pgs.

First Silicon Solutions, Inc., "Getting Started –VAutomation System Analyzer, VSA–186", Version 1.8.0.2, http://www.fs2.com, Oct. 2002, pp. 1–19.

First Silicon Solutions, Inc., "Technical Data for VSA–8X/18X System Analyzer for ARC International (formerly VAutomation) V186 and Turbo 186 Synthesizable Cores", http://www.fs2.com, Jun. 2005, 2 pgs.

Goel et al., "On–Chip Test Infrastructure Design for Optiomal Multi–Site Testing of System Chips", DATE Conference 2005, Mar. 2005, 6 pgs.

Lauterbach, "BDM/JTAG Debuggers", http://www.lauterbach.com, Jan. 2005, pp. 1–51.

Lauterbach, "ICD In–Circuit Debugger", http://www.lauterbach.com, Jan. 2005, pp. 1–23.

Lauterbach, "Lauterbach –Basic Concept", http://www.lauterbach.com, Jan. 2005, pp. 1–15.

Mayer et al., "Debug Support, Calibration and Emulation for Multiple Processor and Powertrain Control SoCs", Date Conference 2005, Mar. 2005, 5 pgs.

S2C Inc., "IP Porter Introduction", http://www.s2cinc.com/aaipi3.asp, Jun. 2005, 9 pgs.

Stollon et al., "Multi–Core Embedded Debug for Structured ASIC Systems", DesignCon 2004, Feb. 2004, pp. 1–23.

Xilinx, Inc., "ChipScope Pro Software and Cores User Guide", UG029, Version v7.1, Feb. 2005, 122 pgs.

Yang et al., "Extraction Error Modeling and Automated Model Debugging in High–Peformance Low Power Custom Designs", Date Conference 2005, Mar. 2005, 6 pgs.

* cited by examiner

METHOD AND SYSTEM FOR DEBUGGING AN ELECTRONIC SYSTEM

CROSS-REFERENCE TO RELATED APPLICATIONS

This application claims the benefit of: (i) U.S. Provisional Patent Application No. 60/168,266, filed Nov. 30, 1999, and entitled "INTERACTIVE DEBUGGING OF HDL SOURCE CODE", and which is hereby incorporated by reference herein; and (ii) U.S. Provisional Patent Application No. 60/230,068, filed Aug. 31, 2000, and entitled "HDL-BASED HARDWARE DEBUGGING", and which is hereby incorporated by reference herein.

BACKGROUND OF THE INVENTION

1. Field of the Invention

The present invention relates to electronic systems and, more particularly, to debugging of electronic systems.

2. Description of the Related Art

Electronic systems are designed by designers to operate in specific ways. Electronic systems are systems that contain digital and/or analog electronic components connected together to perform specific operations or functions. Besides the electronic components, electronic systems may also include software. Once designed, the electronic systems may need to be debugged. Debugging electronic systems is a process which involves detection, diagnosis, and correction of functional failures. In the detection step, the designer of the electronic system observes a functional failure. When the designer is able to gather enough information about the incorrect behavior of the electronic system, the designer of the electronic system can draw the necessary conclusions to diagnose the functional failure. For correction of the functional failure, a fix is applied and subsequently tested. When the design is provided in a Hardware Description Language (HDL), such a fix may be a textual change to the HDL description of the electronic system.

In general, debugging has conventionally been performed by various different approaches. In particular, debugging has been performed by computer software debugging, hardware description language functional verification, hardware logic level analysis, or hardware behavioral source level emulation. These different approaches are discussed below.

Computer software debugging is conventionally performed using a computer software debugger. A computer software debugger is a software tool that allows a software developer to control the execution of a running computer software program by setting break-points, sequentially single-stepping through the execution of the computer software program, and looking at the program's state by examining and displaying variables and expressions. One example of such a software debugging tool is the GNU Debugger (GDB), which can be obtained from Red Hat, Inc. in Sunnyvale, Calif.

Software debuggers usually offer interactive debugging of software programs which are sequentially executed on computers. However, some software debuggers also support limited concurrency such as threaded program execution. Some software debuggers support debugging programs written at different levels of abstraction from high-level computer languages such as C++ down to assembler code and/or machine code. To assist with debugging of programs written in high-level computer languages, the software debugging system can add extra debug information (e.g., symbolic names and references to source code) to the compiled code during compilation of the computer software program. In combination with in-circuit emulators, software debuggers may provide a limited capability to analyze the underlying Central Processing Unit (CPU) of the computer executing the computer software program. A major disadvantage of software debuggers is, however, that they cannot be used for efficiently debugging general hardware of electronic systems.

Hardware description language functional verification is used to verify that the parts of an electronic system which are described using HDL match their functional specification. Such functional verification can be achieved through functional simulation or formal verification.

Functional simulation is performed by a functional simulator. A functional simulator is a software program that runs on a host computer and simulates the operation of an electronic system using its HDL description. Examples of functional simulators include VCS and VSS from Synopsys, Inc. in Mountain View, Calif., and ModelSim from Mentor Graphics Corp. in Wilsonville, Oreg. To increase simulation performance some functional simulators additionally make use of special purpose hardware which acts as a co-processor and accelerates the simulation. An example of a hardware-accelerated functional simulator is the Hammer system from Tharas Systems, Inc. in Santa Clara, Calif. Unfortunately, one major disadvantage of functional simulation is the need for simulation models. In order to be able to simulate, there must exist a simulation model with the proper functional behavior for each component of the HDL design for the electronic system. For some components such simulation models may not be readily available and must be generated. Additionally, the HDL design must be stimulated by a testbench. Since the ideal testbench must correctly and exhaustively match the behavior of the target environment, creation of a testbench can be very difficult and time consuming. On the other hand, a testbench that is too simple will not provide the necessary coverage to find all the design errors. Although functional simulation is useful, using functional simulation to debug design errors is too burdensome. Not only are the testbenches difficult to create, but also the more complex the HDL design is, the lower the performance of functional simulation. For state-of-the-art HDL designs simulation is now a million times slower than the fabricated hardware. Hardware-acceleration can typically speedup functional simulation by a factor on the order of one-hundred. Accordingly, its low performance makes it impractical to use functional simulation either to debug real-time applications or to concurrently debug hardware and software of complex electronic systems.

Formal verification is performed by a formal verification tool. Formal verification can help with the problem of incomplete coverage in functional simulation due to testbench limitations. One approach checks the HDL description for properties. Such properties may be explicitly provided by the designer of the electronic system or implicitly extracted from the HDL description by the formal verification tool. An example of such a formal verification tool is Solidify from Averant, Inc. in Sunnyvale, Calif. One disadvantage of formal verification is that it is impractical to use to re-produce functional failures observed in a running electronic system.

Both techniques, functional simulation and formal verification, have the major disadvantage that they do not operate on fabricated hardware. Instead, both techniques operate on a model of the electronic system and a model of the environment in which the electronic system runs, i.e., a testbench. Thus, their use is limited to debugging design errors. As such, neither technique is applicable for debugging manufacturing faults, environment errors, timing errors and/or tool errors. Also, inadequacies in the testbench have the potential to hide or introduce design errors in the HDL design during functional simulation which can later, when the HDL design is fabricated, show up as functional failures of the running electronic system.

Hardware logic level analysis is a technique that works at the logic level of a fabricated electronic system. The logic level of abstraction is also referred to as gate-level. Since electronic systems have been designed at the logic level for many years (for example using schematic entry of logic gates and flip-flops), there exists a wide variety of different techniques for debugging at logic level, including: digital logic analyzers, in-circuit emulators, Design-For-Test (DFT) techniques, and hardware emulation, each of these different techniques are discussed below.

Digital logic analyzers operate to probe a limited number of digital signals and record their logic values. Probing is accomplished by physically connecting probes of the digital logic analyzer to exposed pins and/or circuitry on the fabricated design. Recording is controlled by trigger conditions, which are conditional expressions built upon the values of the recorded signals provided by the probes. The values for the recorded signals are stored in dedicated memory inside the digital logic analyzer so as to be available for subsequent display. Digital logic analyzers can be external devices or blocks embedded inside the digital circuits of an electronic system. An example of an external digital logic analyzer is the Agilent 16715A from Agilent Technologies, Inc. in Palo Alto, Calif. Examples of embedded logic analyzers are SignalTap from Altera Corporation in San Jose, Calif., or ChipScope from Xilinx, Inc. in San Jose, Calif. Another example of an embedded logic analyzer was presented at the 1999 IEEE International Test Conference by Bulent Dervisoglu in "Design for Testability: It is time to deliver it for Time-to-Market". Since embedded logic analyzers are added to the circuitry of the design, they can probe internal signals. Thus, embedded digital logic analyzers overcome the limited access to internal signals problem of external logic analyzers because access to the internal signals is not restricted by the pins of the fabricated circuits.

An in-circuit emulator is a specialized piece of hardware that connects to a CPU for debugging the CPU and the software that runs on the CPU. An example of an in-circuit emulator is visionICE from Windriver in Alameda, Calif. However, since in-circuit emulators only work for the specific target CPU for which they were built, in-circuit emulators are inappropriate for debugging general digital circuits.

DFT techniques, such as boundary scan and built-in self test, provide access to the internal registers of a running fabricated digital circuit. An example of such technique is described in the IEEE 1149.1 JTAG standard available from the Institute of Electrical and Electronic Engineers in Piscataway, N.J. DFT techniques are also to described in "Digital Logic Testing and Simulation" by Alexander Miczo, published by Wiley, John and Sons Inc., 1985. DFT techniques were originally developed for and applied to testing of manufacturing faults and have the major disadvantage that they do not relate back to the HDL description.

Hardware emulation systems map a synthesized HDL design onto special emulation hardware. Such emulation hardware comprises many re-programmable FPGA devices and/or special purpose processors. The emulation hardware then executes a model of the HDL design. Thus hardware emulation has the same disadvantage as functional simulation, namely, that it works on a model of the electronic system and not on the fabricated hardware. As a result, hardware emulation systems are limited to design error debugging, and cannot be used for diagnosing manufacturing faults, tool errors, timing errors, etc. An example of such a hardware emulation system is System Realizer from Quickturn Systems, in San Jose, Calif. Specially built prototyping systems comprising FPGAs/PLDs can also be seen as hardware emulation systems. Since hardware emulation is usually much faster than functional simulation, hardware emulation systems may enable use of the software that is supposed to run on the HDL design to be used as a testbench. Even so, hardware emulation typically runs at speeds below one MegaHertz (MHz) while the HDL design is supposed to run at many hundred MegaHertz. In some cases the emulator speed may allow the user to connect the HDL design to the target environment which makes the design of testbenches unnecessary. Even so, with the high speeds of state-of-the-art HDL designs, hardware emulation is not capable of debugging the majority of real-time applications. Another disadvantage is that the special synthesis, mapping, and multi-chip partitioning steps required to bring an HDL design into a hardware emulation system are very complicated and time consuming.

A major drawback of all logic level debugging techniques is that they work at the logic level of abstraction. Since the HDL-based design methodology of electronic systems is much more efficient for todays complex designs, HDL designs have largely replaced logic level designs. Application of logic level debugging techniques to HDL design methodology is highly inefficient. Since logic level debugging does not relate back to the HDL description, it normally would not provide the designer of the electronic system with sufficient information to correctly diagnose a functional to failure.

Hardware behavioral source level emulation provides hardware emulation of source level designs. One technique for debugging HDL designs described at the behavioral level HDL using hardware emulation is described in "Interaktives Debugging algorithmischer Hardware-Verhaltensbeschreibungen mit Emulation" by Gernot H. Koch, Shaker Verlag, Germany, 1998. Some of which is also described in Koch et al., "Breakpoints and Breakpoint Detection in Source Level Emulation," ACM Transactions on Design Automation of Electronic Systems, Vol. 3, No. 2, 1998. The therein described technique is referred to as Source Level Emulation (SLE) and offers an approach for emulating HDL designs, however only if such designs are described in behavioral VHDL. During behavioral synthesis a behavioral HDL design is enhanced for debugging by generating and adding additional circuitry for break-point detection. The behavioral synthesis tool writes out synthesized VHDL which contains a register transfer level description of the enhanced HDL design. The register transfer level description is then synthesized, mapped, and multi-chip partitioned into the emulation hardware. During hardware emulation with a hardware model of the HDL design, the user is able to examine particular variables in the behavioral HDL description.

Control is provided via break-points which are detected using the additional circuitry inside the running hardware model. Break-points in SLE have a very specific meaning. In particular, such break-points are closely tied to behavioral operations in the data-flow of the behavioral HDL description, and are associated with particular states of a controller which is generated by the behavioral synthesis.

Additionally, break-points can be made conditioned upon particular values of data-path registers. When a break-point is detected, the execution of the hardware model is stopped. This is done by halting some or all of the system clocks and prevents the registers from changing their current values. Once halted, internal registers can be read. These registers form a scan-chain such that their values can be read by an emulation debugging tool.

Examination of variables in the behavioral HDL description is done in two ways. For variables which are mapped by the behavioral synthesis into registers in the hardware model, their values can be read and related back to HDL identifiers. This is done using map files which keep track of the transformations in behavioral synthesis, register transfer level synthesis, mapping, and multi-chip partitioning. For variables which have not been mapped to registers in the hardware model, their values are computed using a functional model of the behavioral HDL design. This functional model is created during behavioral synthesis and requires the existence of functional models of its components. The values, either read or computed, are then displayed in the behavioral HDL description. Optionally, by overwriting some or all of the registers of the hardware model while the hardware model is halted, the behavior of the HDL design can be modified once the execution of the hardware model is resumed.

Although source level emulation provides a debugging method which works at the level of the HDL description (in this case behavioral VHDL), it has various drawbacks which limits its use in practice. Several of the drawbacks are as follows. First, enhancements for source level emulation must be done inside a behavioral synthesis tool, since it needs special information about the behavioral HDL design which is only available during the behavioral synthesis process. Second, source level emulation does not allow the designer to perform customization. For example, a designer is not able to select trade-offs between hardware overhead and debugging support. Third, source level emulation cannot handle HDL descriptions on levels of abstraction other than the one provided by behavioral VHDL. Explicitly, source level emulation is not applicable for the most commonly used levels of abstraction of RTL HDL and gate-level HDL. Fourth, source level emulation supports neither hierarchy nor re-use of pre-designed blocks. Fifth, there are various limitations and difficulties in relating registers back to behavioral HDL source code. Sixth, in order to examine the state of the hardware model, it is required that some or all of the system clocks be halted and the hardware stopped, which makes source level emulation inapplicable for debugging the majority of today's electronic systems which are not to be stopped.

Thus, there is a need for efficient and effective approaches for debugging HDL-based electronic system designs.

SUMMARY OF THE INVENTION

Broadly speaking, the invention relates to techniques and systems for debugging an electronic system having instrumentation circuitry included therein. The invention facilitates analysis, diagnosis and debugging fabricated hardware designs at a Hardware Description Language (HDL) level. Although the hardware designs (which were designed in HDL) have been fabricated in integrated circuit products with limited input/output pins, the invention enables the hardware designs within the integrated circuit products to be comprehensively analyzed, diagnosed, and debugged at the HDL level at speed. The ability to debug hardware designs at the HDL level facilitates correction or adjustment of the HDL description of the hardware designs.

The invention can be implemented in numerous ways including, a method, system, device, and a computer readable medium. Several embodiments of the invention are discussed below.

As a method for debugging an electronic system having instrumentation circuitry included therein, wherein the electronic system is described with an HDL, one embodiment of the invention includes at least the acts of: activating certain design visibility, design patching or design control aspects of the instrumentation circuitry available for examining or modifying the electronic system via the instrumentation circuitry; determining configuration information based on the certain design visibility, design patching or design control aspects that are activated; configuring the instrumentation circuitry in accordance with the configuration information; receiving debug data from the configured instrumentation circuitry operating within the integrated circuit product; translating the debug data into HDL-related debug information; and relating the HDL-related debug information to the HDL description.

As a method for debugging an integrated circuit product having instrumentation circuitry included therein, wherein the integrated circuit product was designed with a high-level HDL description, one embodiment of the invention includes at least the acts of: activating certain aspects available for examining or modifying by the instrumentation circuitry; determining configuration information based on the certain aspects that are activated; configuring the instrumentation circuitry in accordance with the configuration information; receiving debug data from the configured instrumentation circuitry operating within the integrated circuit product; translating the debug data into HDL-related debug information; relating the HDL-related debug information to the high-level HDL description; thereafter retrieving circuit status information for the integrated circuit product via the instrumentation circuitry; and displaying state information concerning the integrated circuit product based on the retrieved circuit status information.

As a computer readable medium including at least computer program code for debugging an electronic system having instrumentation circuitry included therein, wherein the electronic system is described with an HDL, one embodiment of the invention includes at least: computer program code for activating certain design visibility, design patching or design control aspects of the instrumentation circuitry available for examining or modifying the electronic system via the instrumentation circuitry; computer program code for determining configuration information based on the certain design visibility, design patching or design control aspects that are activated; computer program code for configuring the instrumentation circuitry in accordance with the configuration information; computer program code for receiving debug data from the configured instrumentation circuitry operating within the integrated circuit product; computer program code for translating the debug data into HDL-related debug information; and computer program code for relating the HDL-related debug information to the HDL description.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

Figure 1A:
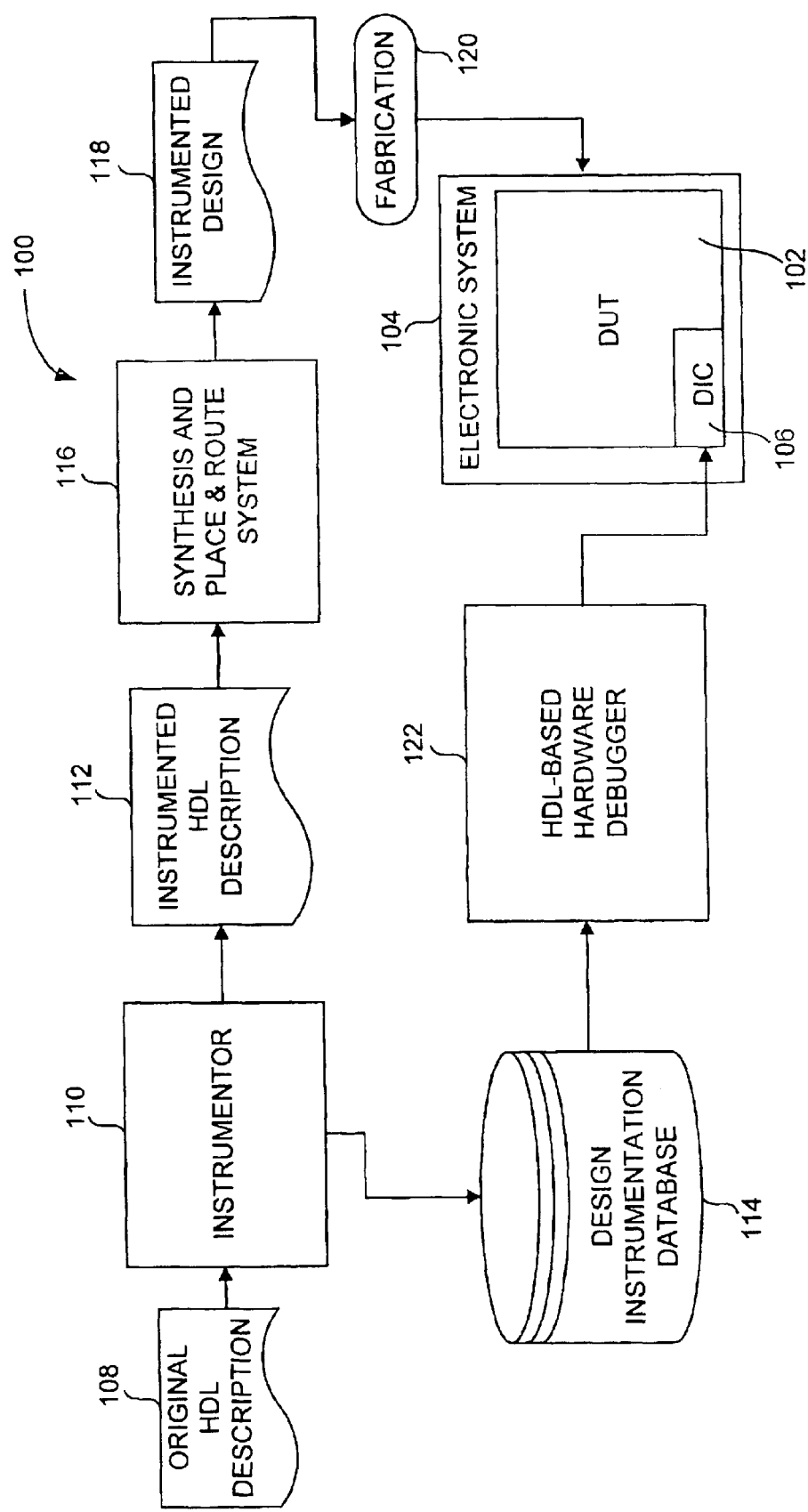
FIG. 1A is a block diagram of a hardware debugging system according to one embodiment of the invention.

The present invention relates to techniques and systems for debugging an electronic system having instrumentation circuitry included therein. The invention facilitates analysis, diagnosis and debugging fabricated hardware designs at a Hardware Description Language (HDL) level. Although the hardware designs (which were designed in HDL) have been fabricated in integrated circuit products with limited input/output pins, the invention enables the hardware designs within the integrated circuit products to be comprehensively analyzed, diagnosed, and debugged at the HDL level at speed. The ability to debug hardware designs at the HDL level facilitates correction or adjustment of the HDL description of the hardware designs.

The following discussions will be made clearer by a brief review of the relevant terminology as it is typically (but not exclusively) used. Accordingly, to assist readers in understanding the terminology used herein, the following definitions are provided.

"Software" is defined as but not limited to programming language content written using a programming language. Examples of programming languages include C, C++, Basic, assembly, and Java.

"HDL" is a Hardware Description Language. A hardware description language is defined as any programming language that can describe the hardware portion of an electronic system. Examples of HDLs include VHDL which is described in the IEEE Standard VHDL Language Reference Manual available from the Institute of Electrical and Electronic Engineers in Piscataway, N.J., which is hereby incorporated by reference; Verilog HDL which is described in Hardware Modeling with Verilog HDL by Eliezer Sternheim, Rajvir Singh, and Yatin Trivedi, published by Automata Publishing Company, Palo Alto, Calif., 1990, which is hereby incorporated by reference; and SystemC which stems from the Open SystemC Initiative (OSCI) originally started by Synopsys, Inc. of Mountain View, Calif. General purpose programming languages such as C++, C, and assembly languages may also be used as a HDL.

A "high level HDL description" is a HDL description in which at least a portion of the description is at register transfer level (RTL) or higher. For VHDL this synthesizable, register transfer level subset is described in the IEEE 1076.6-1999 Standard for VHDL Register Transfer Level (RTL) Synthesis, available from the Institute of Electrical and Electronic Engineers in Piscataway, N.J., which is hereby incorporated by reference. The synthesizable register transfer level subset of the Verilog HDL is described in "Verilog HDL: A Guide to Digital Design and Synthesis" by Samir Palnitkar, SunSoft Press, 1996.

A "RAM" is a Random Access Memory—defined as an electronic component capable of storing data.

"ASIC" is an Application Specific Integrated Circuit. An ASIC device is an electronic component of a system. ASICs are custom devices created for a specific purpose within the electronic system. ASIC devices are easier and faster to create with respect to a full custom semiconductor device. An ASIC may be described using HDL and implemented using synthesis.

An "FPGA" is a Field Programmable Gate Array. FPGAs are electronic components that have a configurable function. These devices are able to change their functionality via an information stream transferred to the device. These electronic components are available from a number of different suppliers in a wide range of sizes and speeds. One example of these devices are the Virtex FPGA devices from Xilinx, Inc. located in San Jose, Calif. An FPGA design may be described using HDL and implemented using synthesis.

A "Central Processing Unit" or "CPU" is circuitry controlling the interpretation and execution of software programmed instructions, performs arithmetic and logical operations on data, and controls input/output functions. For the following descriptions the term CPU will be used to also denote other processing elements such as microprocessors, digital signal processors, microcontrollers, etc.

A "register" is an element in digital circuitry which can store one or more bits. Examples for registers are the various types of flip-flops and latches.

A "PLD" is an Programmable Logic Device. PLDs are electronic components that have a configurable function. These devices are able to change their functionality via an information stream transferred to the device. These electronic components are available from a number of different suppliers in a wide range of sizes and speeds. One example of these devices are the Apex PLD devices from Altera Corporation in San Jose, Calif. A PLD design may be described using HDL and implemented using synthesis.

"Electronic Components" are defined as but not limited to, transistors, logic gates, integrated circuits, semi-custom integrated circuits, full custom integrated circuits, application specific integrated circuits (ASICs), gate arrays, programmable logic devices (PLDs), field programmable gate arrays (FPGAs), CPUs, Random Access Memory (RAM), mixed signal integrated circuits, systems on a chip (SOC), and systems on a printed circuit board.

An "Electronic System" is defined as a system that contains one or more digital and/or analog Electronic Components connected together to perform specific operations or functions. An Electronic System can be implemented entirely of hardware (Electronic Components) or consist of a mix of hardware and software (programming language content).

"Mixed-signal designs" are defined as Electronic System designs which incorporate both digital and analog signals.

The "HDL Design" is referred to as the portion of the electronic system which is described in HDL and implemented in hardware. It is also referred to as the "Design under Test" (DUT).

An "SOC" is a System On Chip. A SOC is defined as a device large enough to contain an entire electronic system implementation. SOC devices can integrate a number of electronic devices into one device.

An "HDL description" is the textual description of an HDL Design.

"HDL source code" is referring to the text files which contain the HDL description.

An "HDL identifier" is an object in an HDL description which represents a signal, a set of signals, a storage element, or a set of storage elements and which can take a value from a set of possible values. Each HDL identifier is associated with a particular scope defined by the syntax of the underlying hardware description language.

A "Technology Mapping Process" is defined as the process of transforming a particular representation of an electronic design into a design consisting entirely of primitive electronic elements from a design library for a target technology. The representation of said electronic design from which the Technology Mapping Process begins is dependent on the particular Technology Mapping Process being employed. However, said representation usually consists of simple boolean elements. For example, said representation may consist entirely of an interconnected set of 2-input/1-output logic elements with each said element performing the NAND function. An example of a tool that performs the Technology Mapping Process is Design Compiler from Synopsys in Mountain View, Calif.

"Synthesis" is defined as the process of creating an electronic implementation from the functional description of a system. An example of a tool that performs this operation is Design Compiler from Synopsys in Mountain View, Calif. which reads electronic system descriptions written in a synthesizable subset of VHDL and Verilog and produces a technology mapped design as an output.

"Behavioral HDL" is an HDL description at an algorithmic level of abstraction in which neither the timing behavior nor the structure of the HDL Design is explicitly described.

"Behavioral synthesis" transforms a behavioral HDL description into a register transfer level (RTL) description where the timing behavior and the structure of the HDL Design is fixed. This RTL description is then processed in synthesis and technology mapping. An example of a tool that performs behavioral synthesis is Behavioral Compiler from Synopsys, Inc. of Mountain View, Calif.

A "System Clock" is defined as a main timekeeping signal in a design. All operations that are relative to the System Clock will proceed when the System Clock becomes active.

"Constraints" are defined as limits placed on parameters for the implementation of an electronic system. Parameters of an electronic system can include but are not limited to register to register propagation delay, system clock frequency, primitive element count, and power consumption. These constraints can be used by synthesis tools to guide the implementation of the electronic design.

"Fabrication" is the process of transforming a synthesized and technology mapped design into one or more devices of the target technology. For example, the fabrication of ASICs involves manufacturing and the fabrication of FPGAs and PLDs involves device configuration.

"DFT" is Design-for-test. DFT is defined as a process in which an electronic system designer will include structures in the electronic system that facilitates manufacturing testing.

"Design Rule Check" (DRC) are checks performed before integrated circuit manufacturing to ensure that in the placed and routed technology mapped design none of the rules of the target technology process is violated. Examples for such DRC are checks for shorts, spacing violations, or other design-rule problems between logic cells. An example for a tool that does DRC is Dracula from Cadence Design Systems, Inc. in San Jose, Calif.

"Functional Specification" is defined as the documentation that describes the necessary features and operations of a system.

A "functional failure" is a behavior of a design which does not meet the functional specification which was used in the creation of the design. Every step in the design process can potentially cause a functional failure. Functional failures can be classified depending on which step of the design process caused the functional failure.

A "fault" is a specific type of functional failure. This type of failure is due to one or more manufacturing defects causing a functional failure in the fabricated design.

A "design error" is a specific type of functional failure where the HDL description's behavior did not match the functional specification.

A "tool error" is a specific type of functional failure which was introduced by design tools because the HDL description was not properly processed such that the functional specification is not met by the implementation.

An "environment error" is a specific type of functional failure caused by a particular combination of environmental parameters such as temperature, humidity, pressure, etc.

A "Functional Simulator" is a tool that mimics the functional behavior of a model of an electronic system which is described using HDL.

A "Testbench" is defined as an electronic system description that presents stimulus to and/or gathers information from the target electronic system design to be verified. In some cases the testbench ignores the response from the target electronic system design. A testbench is used to mimic the behavior of the target environment in which the electronic system being developed will operate. A testbench may comprise both hardware and software.

A "Target Environment" is the system the electronic system is specified to interact with and/or to run in. A target environment may comprise both hardware and software.

The "Target Speed" of an electronic system is the speed and/or the speed range the electronic system is specified to run at. Examples for measures for the target speed and the speed range are clock frequency, response time, time to propagate, and cycle time.

"Debugging" is the process of comparing the behavior of an implementation of the electronic system to the electronic system functional specification. The purpose of debugging is to find causes and remedies for functional failures.

"Co-Debugging" or "hardware/software co-debugging" is defined as the process of debugging the software and hardware of an electronic system concurrently.

A "FSM" is Finite State Machine—defined as an electronic system control structure. The design and implementation of FSM is described in great detail in Synthesis and Optimization of Digital Circuits, by Giovanni DeMicheli, McGraw Hill, 1994.

A "HDL Building Block" is a functional unit of an HDL Design from which the HDL Design is constructed. A HDL Building Block (BB) performs calculations on the signals to which it is connected and communicates with other BBs in the design. The communication is through connecting internal signals of a BB to communication ports of the BB and/or connecting internal signals of the BB to communication ports of other BBs in the HDL Design. Examples of BBs are Entities in the VHDL language and Modules in the Verilog language.

A "Hard Block" is an electronic system which has a pre-defined functionality and which can be incorporated into another electronic system. Commonly, the form of the Hard Block is such that the functionality of the Hard Block can not be altered. An example of a hard block is an HDL Design which implements a industry standard bus controller.

A "Design State" is defined as the logical values taken by the storage elements of the design at a particular time, combined with the logical values taken by the inputs of the design taken at the same particular time.

The "System State" or "State of the System" is a synonym for "Design State." "Real-time" means a task, process or response occurs substantially immediately. The term is used to describe a number of different computer features. For example, real-time operating systems are systems that respond to input immediately. Real-time is also used for describing tasks in which the computer must react to a steady flow of new information without interruption. Real-time can also refer to events simulated by a computer at the same speed that they would occur in real life.

Embodiments of this aspect of the invention are discussed below with reference to FIGS. 1–21. However, those skilled in the art will readily appreciate that the detailed description given herein with respect to these figures is for explanatory purposes as the invention extends beyond these limited embodiments.

FIG. 1A is a block diagram of a hardware debugging system 100 according to one embodiment of the invention. The hardware debugging system 100 operates to debug a hardware product referred to herein as a Device Under Test (DUT) 102. The DUT 102 is typically part of a larger hardware product referred to as an electronic system 104. The DUT 102 can pertain to a single integrated circuit chip, multiple integrated circuit chips, a system on a chip, or a system on a printed circuit board.

According to the invention, the DUT 102 includes Design Instrumentation Circuitry (DIC) 106. The DIC 106 is provided within the DUT 102 in order to facilitate debugging of the DUT 102. The DIC 106 can be provided within the DUT 106 in either a centralized or distributed manner.

The hardware debugging system 100 operates to determine the DIC 106 that is provided within the DUT 102. In this regard, an original HDL description 108 of the electronic system 104 is received at an instrumentor 100. The instrumentor 100 modifies or alters the original HDL description 108 to produce an instrumented HDL description 112. The instrumented HDL description 112 represents not only the electronic system 104 with the DUT 102 provided therein, but also the DIC 106 that is provided within the DUT 102. The instrumentor 100 also stores DIC information to a design instrumentation database 114. By storing the DIC information in the design instrumentation database 114, the hardware-based debugging of the DUT 102 is facilitated.

The hardware debugging system 100 also includes synthesis and place & route systems 116. The synthesis and place & route systems 116 receives the instrumented HDL description 112 and performs conventional synthesis as well as place & route operations in order to produce an instrumented design 118. Although not shown in FIG. 1A, other additional tools can be utilized to produce or enhance the instrumented design 118. Examples of additional tools include a Design-For-Test (DFT) tool or a Design Rule Check (DRC) tool. The instrumented design 118 represents a description (e.g., design files) of the electronic system 104 that would be thereafter fabricated.

Hence, once the instrumented design 118 is available, fabrication 120 can be performed. The fabrication 120 produces the electronic system 104 having the DUT 102 with the DIC 106 provided therein. Fabrication is the process of transforming a synthesized and technology mapped design (e.g., the instrumented design 118) into one or more devices of the target technology. For example, if the target technology is Application Specific Integrated Circuits (ASICs) then the fabrication involves manufacturing, and if the target technology is Field Programmable Gate Arrays (FPGAs) or Programmable Logic Devices (PLDs) the fabrication involves device configuration.

At this point, the electronic system 104 is a hardware product that has been produced. This hardware product can then be debugged using a HDL-based hardware debugger 122. More particularly, the HDL-based hardware debugger 122 couples to the DIC 106 so that it is able to communicate with the DIC 106 when debugging the DUT 102. The HDL-based hardware debugger 122 also couples to the design instrumentation database 114 so that access to the DIC information is available. As a result, the HDL-based hardware debugger 122 enables a user to debug the DUT 102 and/or hardware and/or software interacting with the DUT 102 in close relation to the original HDL description 108. Further, in one embodiment, debugging can be performed while the electronic system 104 and the DUT 102 operate in the target environment, at target speed.

FIG. 11B is a block diagram of a hardware debugging system 150 according to another embodiment of the invention. The hardware debugging system 150 is similar to the hardware debugging system 100 and includes many of the same components. Hence, the hardware debugging system 150 enables a user of the HDL-based hardware debugger 122 to debug the DUT 102 of the electronic system 104 and/or hardware and/or software interacting with the DUT 102, as noted above. However, the hardware debugging system 150 includes a synthesis and place & route system 152 that includes an instrumentor 154. Hence, the original HDL description 108 is supplied to the synthesis and place & route system 152. The synthesis and place & route system 152 can then produce the instrumented design 118 while using not only synthesis and place & route tools but also the instrumentor 154. In this embodiment, the instrumentor 154 is able to be embedded within synthesis and place & route system 152. Here, the instrumentor 154 assists with producing the instrumented design 118 which represents the electronic system 104 having the DIC 106 provided within the DUT 102. However, with the hardware debugging system 150, the original HDL description 108 need not be modified to produce an instrumented HDL description.

Figure 1B:
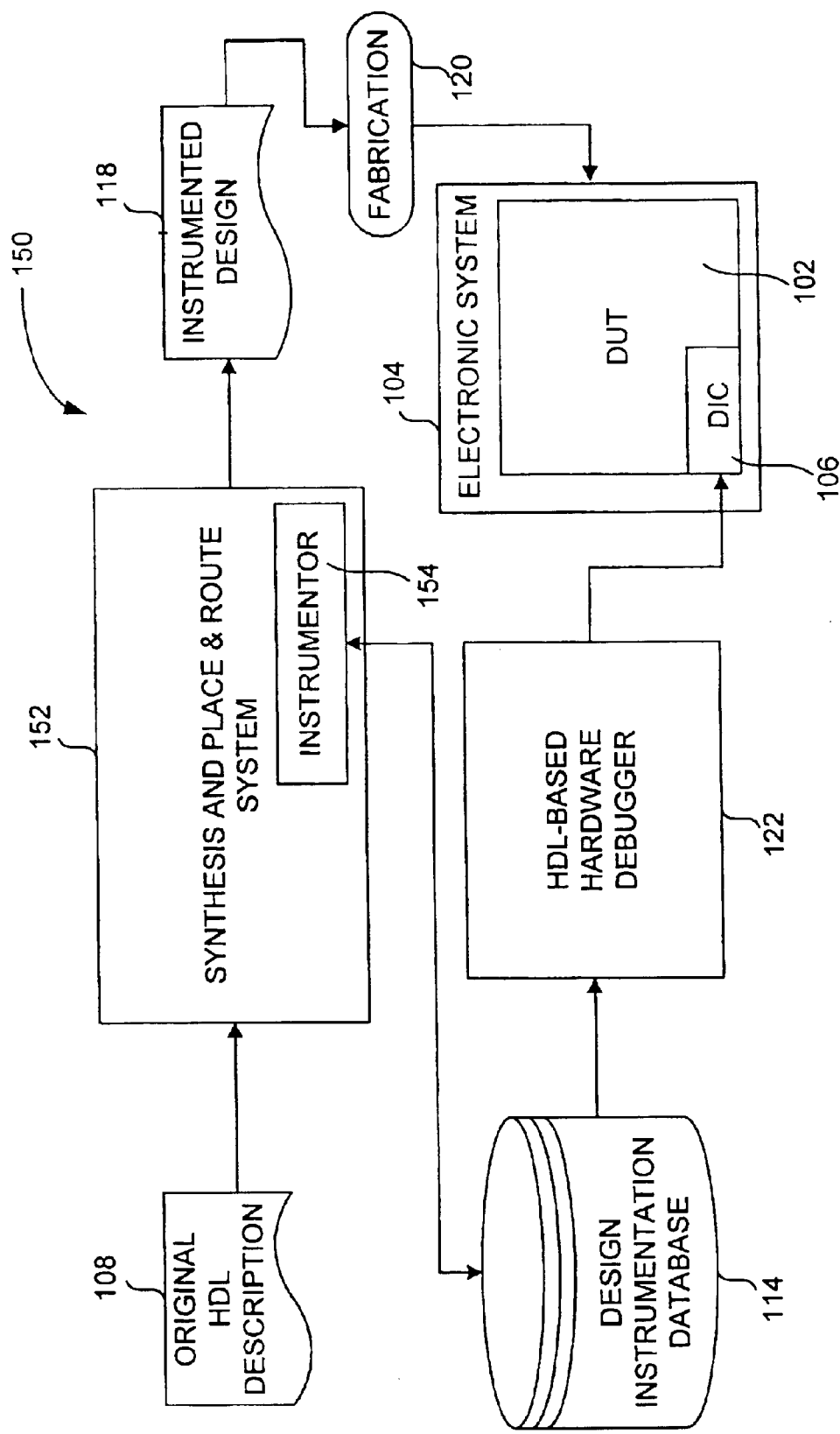
FIG. 1B is a block diagram of a hardware debugging system according to another embodiment of the invention.
Figure 2:
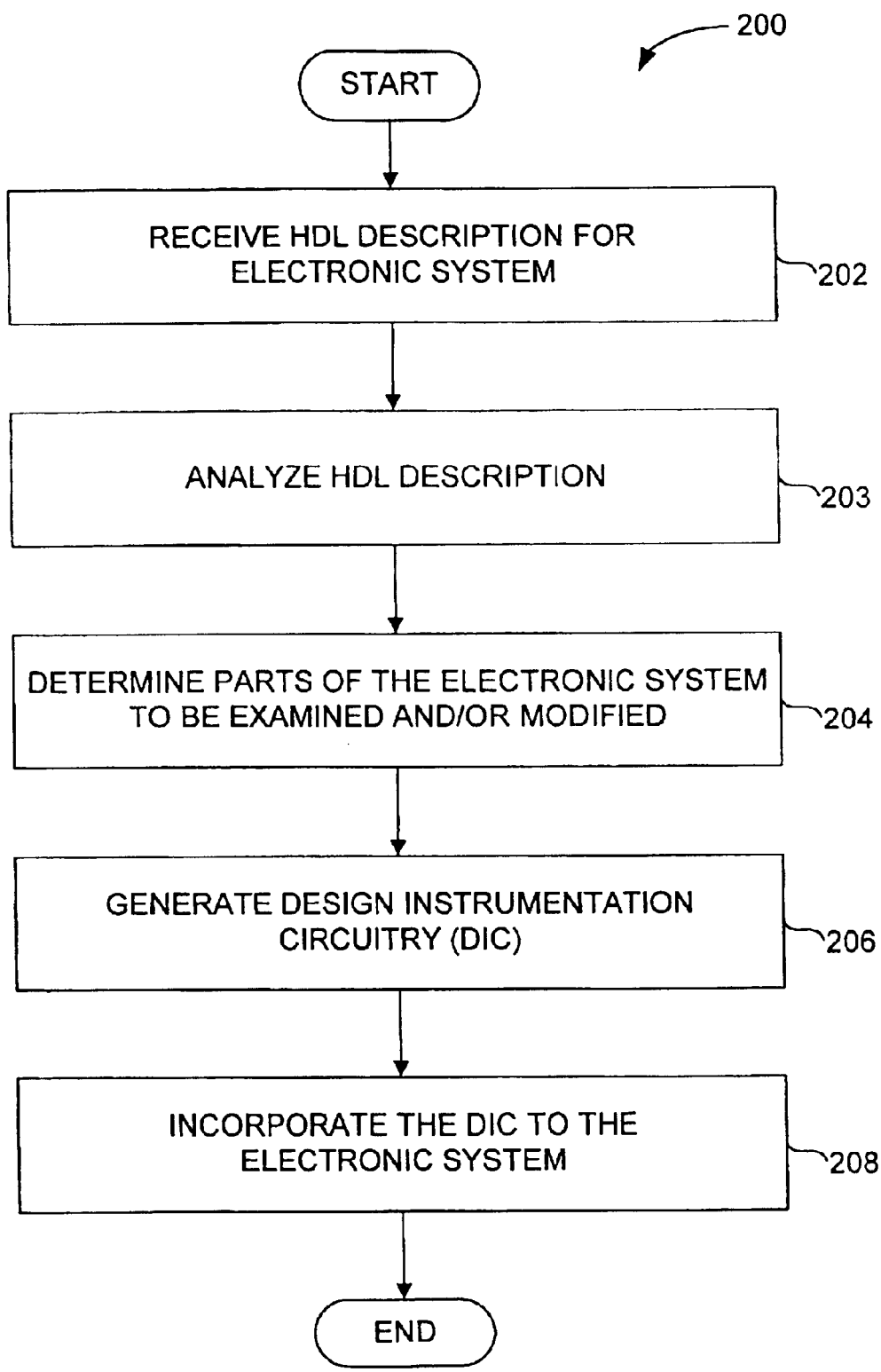
FIG. 2 is a flow diagram of basic instrumentation processing according to one embodiment of the invention.

FIG. 2 is a flow diagram of basic instrumentation processing 200 according to one embodiment of the invention. The basic instrumentation processing 200 is, for example, performed by the instrumentor 110 illustrated in FIG. 1A or the instrumentor 154 illustrated in FIG. 1B.

The basic instrumentation processing 200 initially receives 202 a HDL description for an electronic system. The HDL description is then analyzed 203 to understand the characteristics of the electronic system. Next, parts (or portions) of the electronic system that are to be examined and/or modified are determined 204. Typically, the parts of the electronic system to be examined and/or modified (e.g., instrumented) are within a DUT such as the DUT 102 illustrated in FIGS. 1A and 1B. Hence, the parts of the electronic system to be examined and/or modified represent various signals and/or components within the DUT. After the parts of the electronic system to be examined and/or modified have been determined 204, design instrumentation circuitry (DIC) is generated 206. Preferably, the DIC is determined 204 based on the parts of the electronic system to be examined and/or modified. In this regard, the DIC can be at least partially customized to the application such as the amount or degree of testing or debugging desired. Thereafter, the DIC is incorporated 208 into the electronic system. The DIC can be incorporated 208 into the electronic system (namely, the DUT) in various ways. In one embodiment, the DIC can be incorporated by adding HDL to the original HDL for the electronic system. In another embodiment, the DIC can be incorporated by modifying a netlist description for the electronic system. Following the operation 208, the basic instrumentation processing 200 is complete and ends.

Design instrumentation (DI) is a process by which a HDL description of an electronic system is analyzed, and then a DIC computed. The DIC is thereafter incorporated (e.g., added) into the electronic system to facilitate debugging. The DIC can be added to the electronic system in a variety of ways. In one embodiment, DIC can be added to the electronic system by adding an HDL description of the DIC to the HDL description of the electronic system. In another embodiment, the DIC can be added to the electronic system during synthesis. The DIC provides mechanisms to control the examination and/or modification of a running electronic system. Thus, the DIC allows to analyze, diagnose, and/or debug the DUT by giving detailed and accurate information about its current state of operation, as well as the state history.

Figure 3:
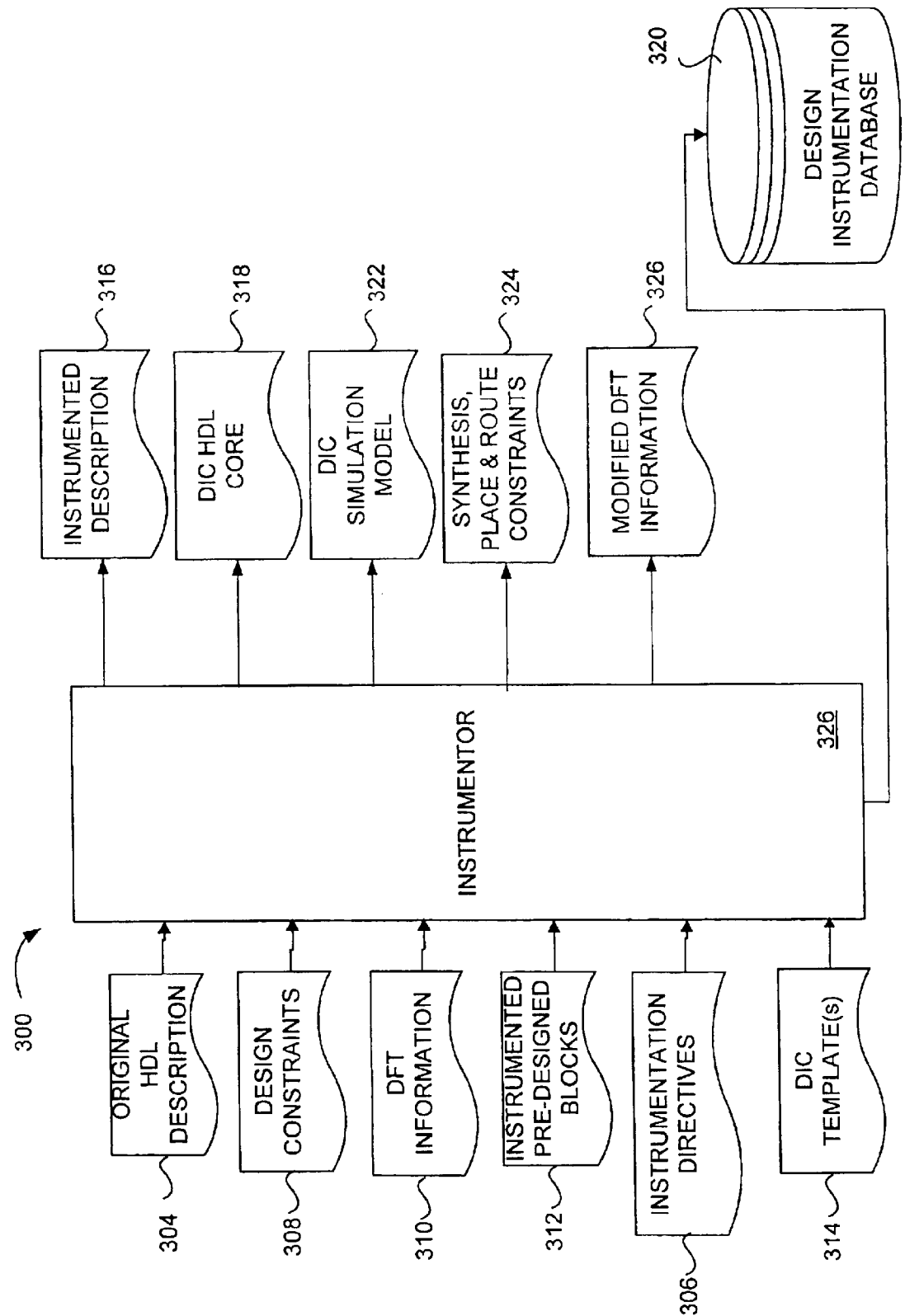
FIG. 3 is a block diagram of an instrumentation system according to one embodiment of the invention.

FIG. 3 is a block diagram of an instrumentation system 300 according to one embodiment of the invention. The instrumentation system 300 operates to perform design instrumentation operations to produce an appropriate DIC.

The instrumentation system 300 includes an instrumentor 302. The instrumentor 302 operates to determine the appropriate DIC for the electronic system (namely, the DUT) that is to be eventually hardware debugged. The instrumentor 302 receives an original HDL description 304 as well as instrumentation directives 306. The instrumentation directives 306 are instructions to the instrumentor 302 that inform the instrumentor 302 of the portions, parts or areas of the original HDL description 304 that are to be examined and/or modified. The instrumentation directives 306 can be predetermined or interactively provided by a user through a user interface. Additionally, the instrumentor 302 can further receive design constraints 308, Design For Test (DFT) information 310, instrumented pre-designed blocks 312 and DIC template(s) 314.

The design constraints 308 are constraints on the particular design associated with the original HDL description 304. More particularly, design constraints are limits placed on parameters for an implementation of an electronic system. Some examples of the parameters that can be limited by design constraints include register-to-register propagation delay, system clock frequency, primitive element count, and power consumption. The constraints on the parameters are used by synthesis and place & route tools to guide the implementation of the electronic design.

The DFT information 310 is information about features (e.g., structures) of the original HDL description 304 that pertain to testing. The DFT information is used to facilitate manufacturing testing. For example, the DFT information 310 can provide a description of a scan-chain provided within the original HDL description 304. The instrumentor 302 can utilize portions of the DFT information 310 to reduce the circuitry required for the DIC.

The DIC can make use of previously instrumented pre-designed blocks 312. In case the electronic system contains pre-designed blocks which have been instrumented, the DIC can communicate with the previously instrumented pre-designed blocks 312 to facilitate their debugging. The DIC template(s) 314 provide one or more templates for the instrumentor 302 to utilize when producing the DIC.

The instrumentor 302 outputs an instrumented description 316. In one embodiment, the instrumented description 316 can be represented as an instrumented HDL description in which the original HDL description 304 has been enhanced to include a HDL description of the DIC (see FIG. 1A). In another embodiment, the instrumented description 316 can represent an instrumented netlist (see FIG. 1B). The instrumentor 302 also produces an optional DIC HDL description 318. The DIC HDL description 318 can be utilized by a functional simulator or synthesis and place & route tools. The instrumentor 302 can also produce an optional DIC simulation model 322 that permits functional simulation of the instrumented description 316. Still further, the instrumentor 302 can output synthesis and place & route constraints 324 and modified DFT information 326. The synthesis and place & route constraints 324 can be utilized by the synthesis and place & route tools. The modified DFT information 326 can also be used by the synthesis and place & route tools, so that the resulting electronic system is able to be tested as originally designed.

The instrumentation system 300 also includes a design instrumentation database 320 that stores instrumentation information. The instrumentation information includes information on the types of instrumentations that have been done, the DIC and other information as explained in greater detail below. As noted above, an HDL-based hardware debugger (e.g., debugger 122) eventually utilizes the DIC information stored in the design instrumentation database 320 when performing hardware debugging of the electronic system. Additional details on the design instrumentation database 320 are provided in FIG. 6 below.

Figure 4A:
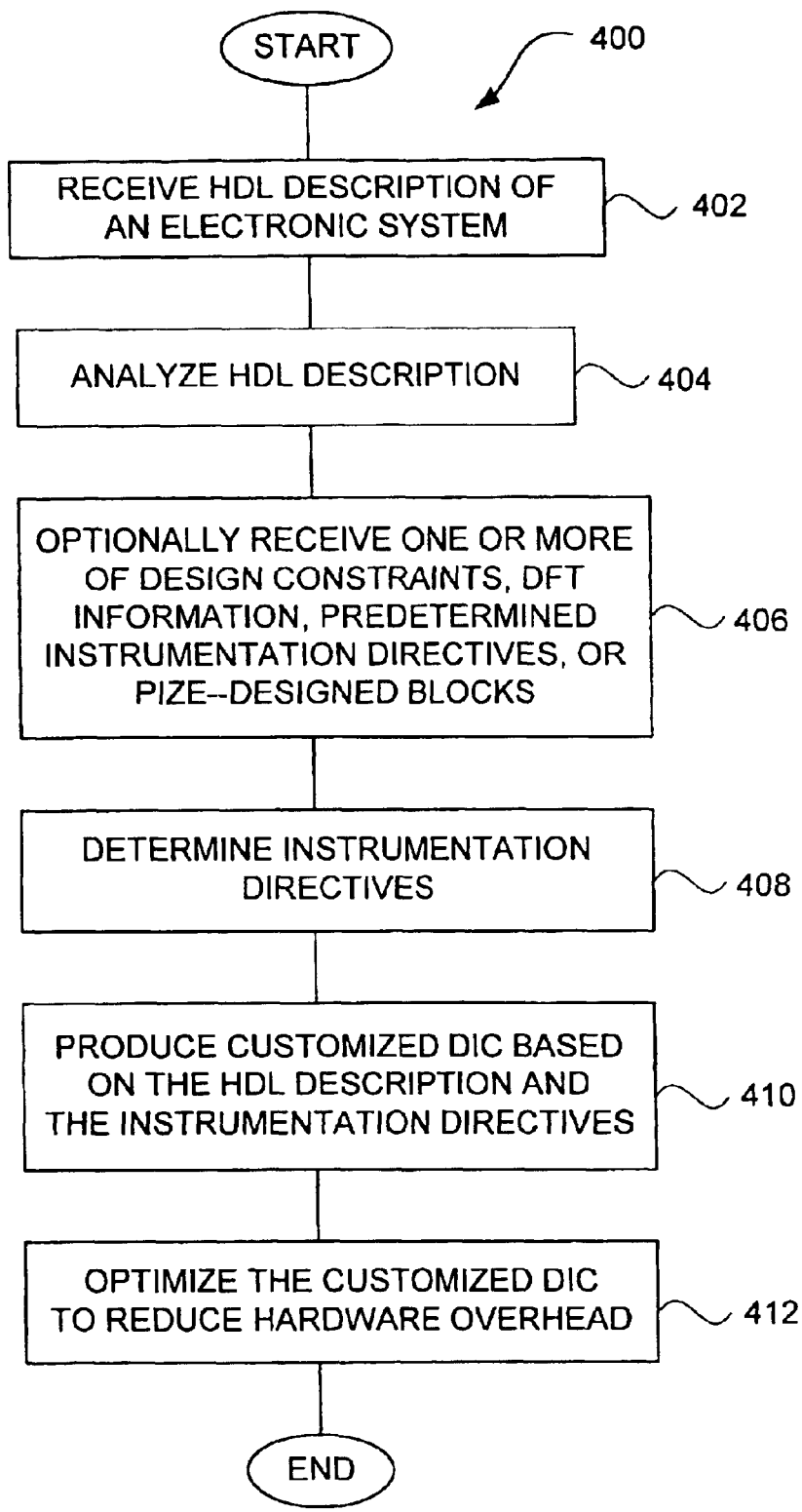
FIGS. 4A and 4B are flow diagrams of detailed design instrumentation processing according to one embodiment of the invention.
Figure 4B:
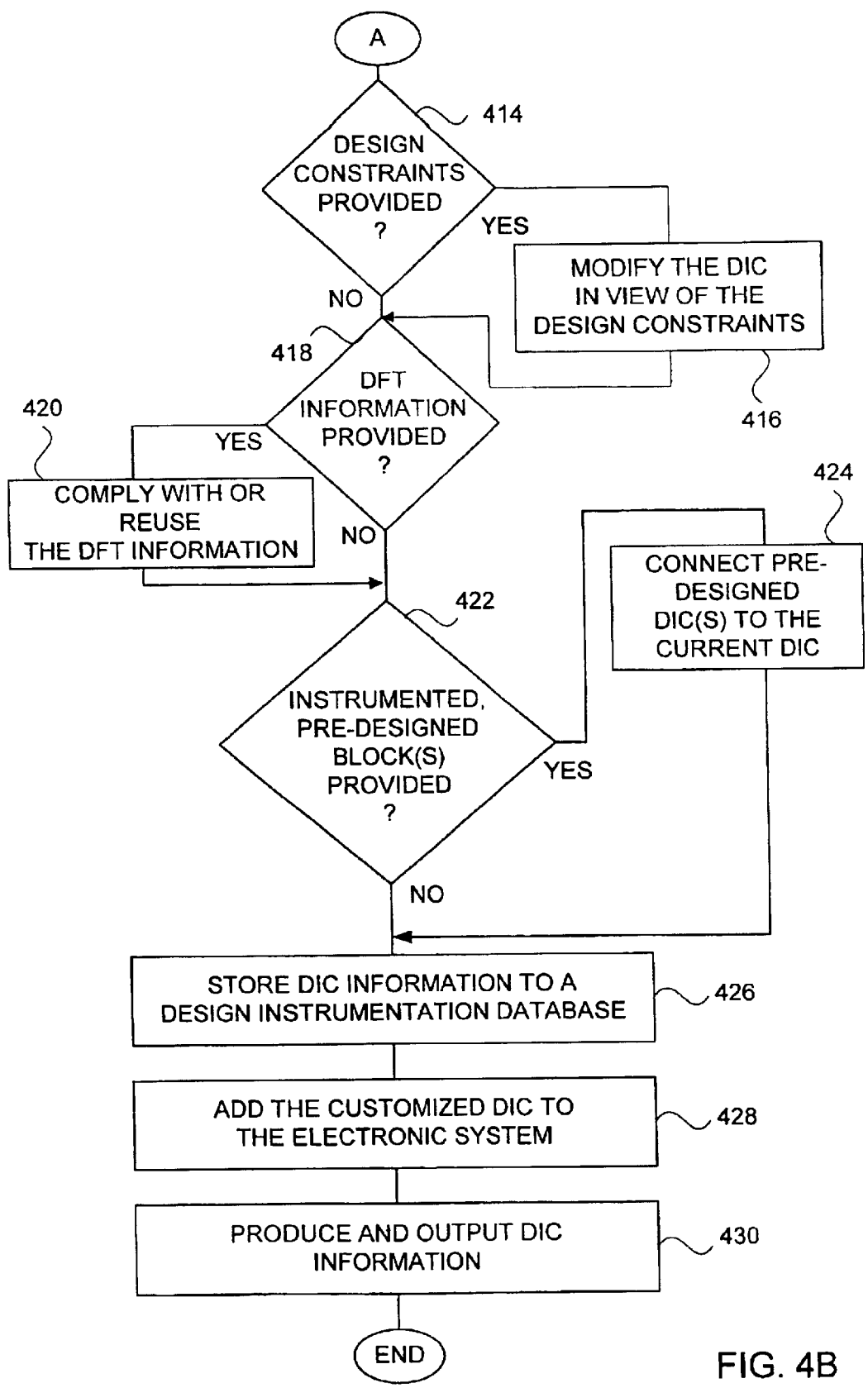

FIGS. 4A and 4B are flow diagrams of detailed design instrumentation processing 400 according to one embodiment of the invention. The detailed design instrumentation processing 400 is, for example, performed by the instrumentor 110 illustrated in FIG. 1A, the instrumentor 154 illustrated in FIG. 1B, or the instrumentor 302 illustrated in FIG. 3.

The detailed design instrumentation processing 400 initially receives 402 a HDL description of an electronic system. The HDL description is then parsed and analyzed 404. The analysis 404 of the HDL description can identify portions that cannot be instrumented or that can only be instrumented in certain ways. The result of the analysis 404 can be used to determine whether particular instrumentation directives are valid, and thus can be followed by the instrumentor.

Additionally, one or more of design constraints, DFT information, predetermined instrumentation directives, or pre-designed blocks may also optionally be received 406. Then, instrumentation directives are determined 408. Here, instrumentation directives can be predetermined and thus provided or can be determined through user interaction. FIGS. 5A–5D, discussed below, pertain to user interaction to produce instrumentation directives.

After the instrumentation directives are determined 408, a customized DIC is produced 410 based on the HDL description and the instrumentation directives. Hence, the customized DIC is tailored to the particular HDL description and the particular instrumentation directives. By tailoring the DIC to the particular HDL description and the particular instrumentation directives, the customized DIC makes efficient use of its circuitry. Since the DIC consumes area (e.g., die space) on the hardware product (e.g., semiconductor chip), making the customized DIC efficient and compact is advantageous. In producing the customized DIC, the detailed design instrumentation processing 400 is able to reuse pre-designed blocks that have already been instrumented. In other words, the customized DIC can communicate with existing DICs of pre-designed blocks that represent other portions of the electronic system (or even external systems).

Additionally, the DIC can be optimized 412 to reduce hardware overhead and/or maximize coverage. Here, the optimization 412 to the DIC enables the hardware overhead associated with the DIC to be reduced which is advantageous in producing or using integrated circuit products. For example, cost analysis can be performed during the optimization to explore the different structures in the context of a given implementation technology and given design constraints. Variations of the DIC can thus be explored in order to minimize the overhead of the DIC on the hardware in terms of area, delay, power consumption, routability, and/or testability. Variations of the DIC can be described via DIC templates. The optimization 412 can also try to increase the effects of the instrumentation with regards to the hardware overhead. For example, if some certain signals can be examined, some other signals may also be able to be examined without any or minimal hardware overhead.

Next, a decision 414 determines whether design constraints have been provided. Typically, the design constraints are provided in a file which contains specifications for area, delay, power consumption, routability and testability. When the decision 414 determines that design constraints have been provided, then the DIC may be modified 416 in view of the design constraints: Also, modifications to the design constraints may be performed so that the overall design of the electronic system (including the DIC) complies with the intent of the original design constraints. For example, timing constraints may be changed to reflect the insertion of the DIC. In addition, additional design constraints might be generated, which, for example, may be used to guide synthesis and place & route tools in optimizing the DIC.

Following operation 416, as well as following the decision 414 when design constraints are not provided, a decision 418 determines whether DFT information has been provided. When the decision 418 determines that DFT information has been provided, then the DFT information is complied with or reused 420. When complied with, the detailed design instrumentation processing 400 renders the customized DIC compatible or compliant with the DFT information (e.g., existing DFT structures in the design). For example, scan-chains or boundary-scans can be provided or modified to take into account the DIC. Alternatively, when the DFT information is reused, the customized DIC can make use of portions of the circuitry made available through the DFT information and thereby make use of existing circuitry. The modifications to the DFT information can reflect the ability of the DIC to utilize portions of the circuitry within the electronic system associated with the DFT information as well as with the ability to modify the DFT information to preserve the intent of the designer after the DIC is included within the electronic system.

Following the operation 420, as well as following the decision 418 when the DFT information is not provided, a decision 422 determines whether instrumented, pre-designed blocks have been provided. When the decision 422 determines that instrumented, pre-determined blocks have been provided, then the DIC of each instrumented, pre-designed block is connected 424 to the current DIC. This facilitates debugging of the electronic system which contains pre-designed blocks.

Following operation 424, as well as following the decision 422 when instrumented, pre-designed blocks are not provided, DIC information is stored 426 to a design instrumentation database. The DIC information includes a description of the DIC, the instrumentation directives, and DIC connectivity information. The DIC information can also include cross-reference data that relates elements in the design of the electronic system (i.e., hardware implementation) to and from the HDL description. Then, the customized DIC can then be added 428 to the electronic system. The customized DIC can be added 428 to the electronic system in a variety of different ways. For example, with respect to an embodiment such as illustrated in FIG. 1A, the customized DIC can be added 428 to the electronic system by producing the instrumented HDL description which describes the electronic system with the DIC included therein. Alternatively, with respect to an embodiment such as illustrated in FIG. 1B, the customized DIC can be added to the electronic system by modifying a netlist that defines the electronic system.

Following operation 428 the detailed design instrumentation processing 400 operates to produce and output 430 the instrumented description, an optional DIC simulation model and an optional DIC HDL description. The DIC simulation model can be used by a simulator when functionally simulating the operation of the DUT. The DIC HDL description may for example also be used for simulation. Following the operation 430, the detailed design instrumentation processing 400 is complete and ends.

As noted above, the instrumentation directives can be predetermined and thus provided or can be determined through user interaction. When the instrumentation directives are predetermined, they can be obtained from a design instrumentation file. In one embodiment, the instrumentation directives specify design visibility, design patching and design control criteria for particular portions of the design for the electronic system.

Design Visibility (DV) is monitoring the entire or partial state of the DUT at, and relative to, predetermined events. An important aspect of DV is relating the states of operation back to identifiers in the original HDL description for examination during HDL-based hardware debugging. In one embodiment, DV is done by sampling the values of one or more signals of the DUT for a particular time interval determined by one or more predetermined events. The events are determined by Design Control which is described below. Design Visibility serves to monitor the state of operation of the DUT, but does not alter the DUT's behavior in any way. However, in some situations, it is advantageous to have a method to alter the behavior of the DUT after the hardware has been fabricated. Design Patching (DP) is to alter the behavior of the DUT to a predetermined particular desired state at predetermined events. The events are determined by Design Control which is described below. A particular desired state of a DUT is a particular setting of the values of all or a subset of all storage components in the DUT.

Design Control (DC) provides the designer with a method to specify the events that control DV and DP. DC can be accomplished by one or more trigger conditions. A trigger condition is a conditional expression comprising HDL identifiers where the conditional expression denotes a combination comprising a particular state and/or state transition, and/or history of states and/or history of state transitions, the DUT, or a portion of it, can be in. Each time a particular trigger condition is met an associated trigger event is produced. One or more trigger events can be combined to issue a particular predetermined trigger action which may control the DV and DP and may control other functions related to HDL-based hardware debugging. A unique combination comprising one or more units of DV and/or DP all controlled by the same trigger action forms a trigger action group.

A watch-point is a special case of a trigger condition which is explicitly defined using a predetermined conditional expression of HDL identifiers. A watch-point has no direct relationship with the HDL description other than its expression is made up with identifiers of the HDL description.

A break-point is a special case of a trigger condition, where the trigger condition is implicitly specified by selecting a particular source code location in the HDL description. A source code location is a unique combination comprising a file name, a line number and a column position within a textual HDL description.

An error trap is a special case of a watch-point where the trigger condition describes an erroneous or undesired state of the hardware. A property check is a special case of an error trap where the trigger condition is explicitly specified by a particular property of a portion of the hardware. In the event such property is not fulfilled the trigger condition is met. Properties to be checked can either be implicitly derived from the functionality of the hardware or explicitly given by the designer of the electronic system.

Figure 5A:
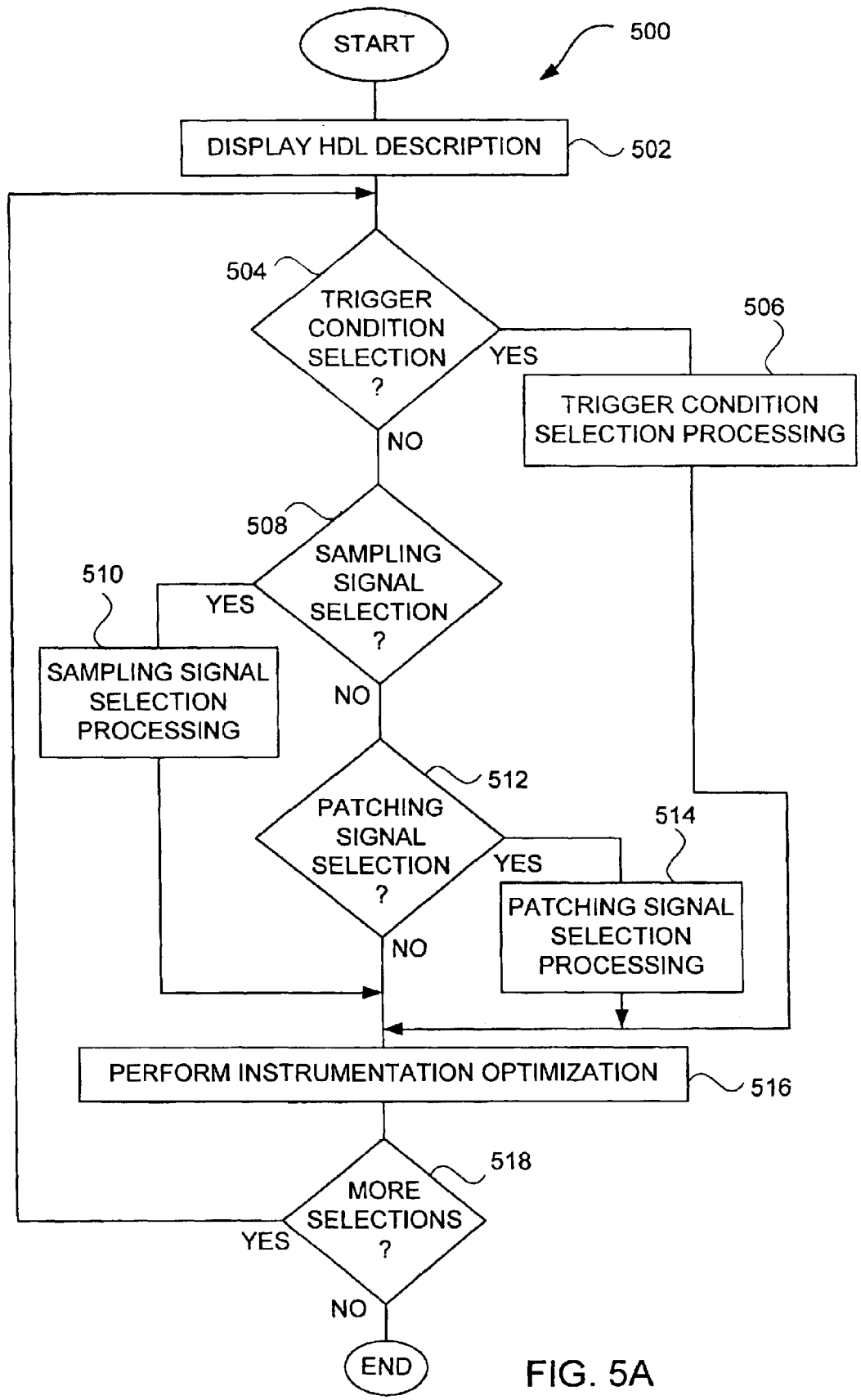
FIG. 5A is a flow diagram of selection processing according to one embodiment of the invention.

FIG. 5A is a flow diagram of selection processing 500 according to one embodiment of the invention. The selection processing 500 pertains to user interaction with the HDL description to produce instrumentation directives. The selection processing 500 is, for example, performed by operation 406 illustrated in FIG. 4A when determining instrumentation directives.

The selection processing 500 initially displays 502 a HDL description. The HDL description pertains to the electronic system. At this point, a user can interact with a graphical user interface to make a specific instrumentation directive with respect to the HDL description being displayed. Optionally, to guide a user in his selections, the results of an analysis of the original HDL description can be displayed as well (e.g., operation 404, FIG. 4A). Examples of the particular types of instrumentation directives include a selection of a trigger condition, a sampling signal or a patching signal. Hence, a decision 504 determines whether a trigger condition selection has been made. When the decision 504 determines that a trigger condition selection has been made, then trigger condition selection processing 506 is performed. Alternatively, when the decision 504 determines that a trigger condition selection has not been made, then a decision 508 determines whether a sampling signal selection has been made. When the decision 508 determines that a sampling signal selection has been made, then sampling signal selection processing 510 is performed. On the other hand, when the decision 508 determines that a sampling signal selection has not been made, then a decision 512 determines whether a patching signal selection has been made. When the decision 512 determines that a patching signal selection has been made, then patching signal selection processing 514 is performed. Following any of operations 506, 510 and 514, as well as following the decision 512 when a patching signal selection has not been made, instrumentation optimization can be performed 516. The instrumentation optimization operates to consolidate the various selections so that the DIC required to implement the various trigger conditions, sampling signals and patching signals can be efficiently implemented. Following the operation 516, a decision 518 determines whether more selections are to be made by the user. When the decision 518 determines that more selections are to be made, then the selection processing 500 returns to repeat the decision 504 and subsequent operations. Alternatively, once the decision 518 determines that no more selections are to be made, the selection processing 500 is complete and ends.

The trigger condition selection processing 506 illustrated in FIG. 5A can be utilized to select or establish implicit trigger conditions or explicit trigger conditions. An example of an implicit trigger condition is a break-point, and an example of an explicit trigger condition is a watch-point, or an error trap, or a property check.

Figure 5B:
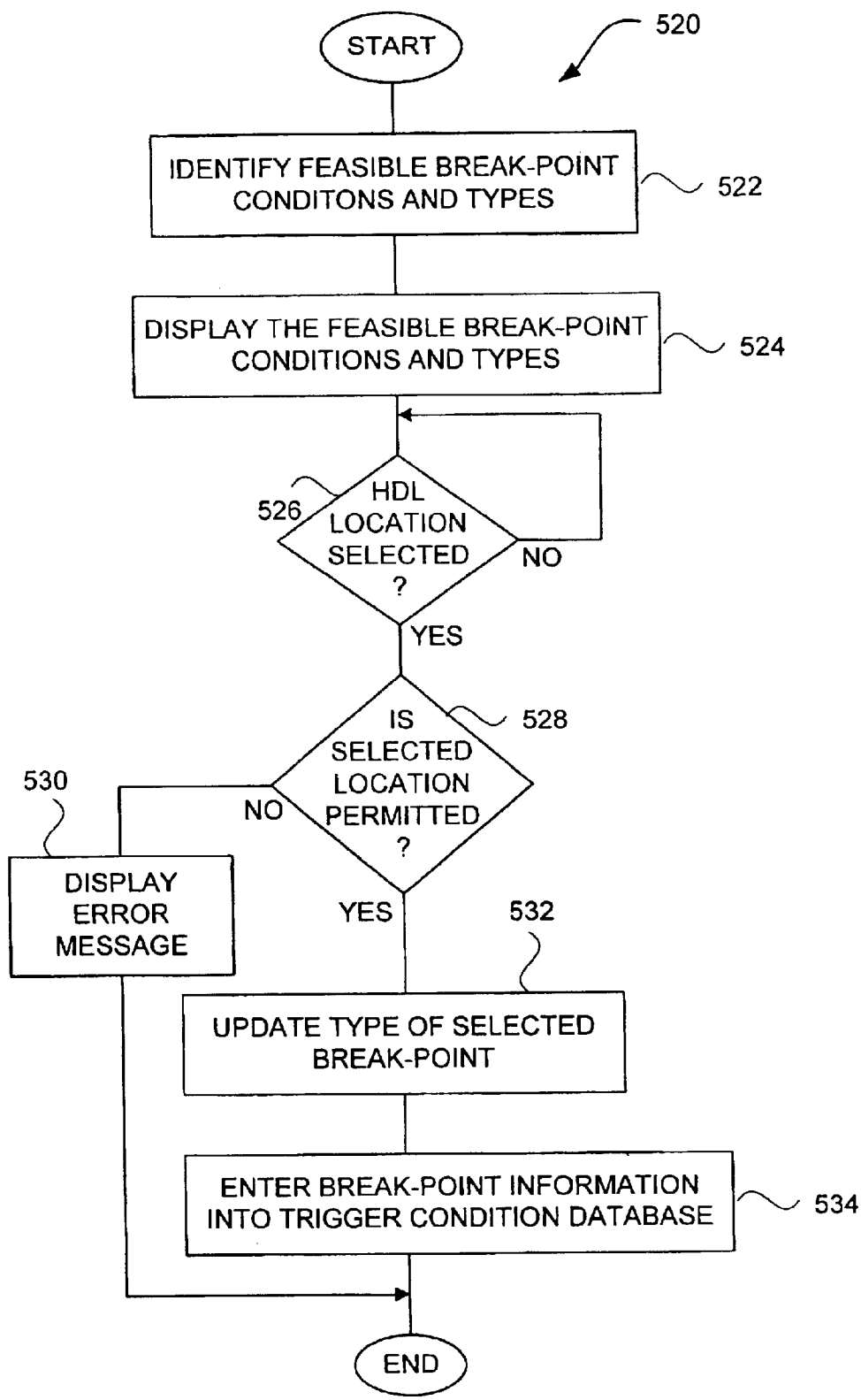
FIG. 5B is a flow diagram of break-point processing according to one embodiment of the invention.

FIG. 5B is a flow diagram of break-point processing 520 according to one embodiment of the invention. The break-point processing 520 represents an embodiment of the trigger condition selection processing 506 in the case in which an implicit trigger condition (namely, a break-point) is involved.

The break-point processing 520 initially identifies 522 feasible break-point conditions and types. Typically, such information is obtained analyzing the original HDL description (e.g., operation 404, FIG. 4A). Next, the feasible break-point conditions and types are displayed 524. Here, the feasible break-point conditions and types can be displayed to a user by a user interface. At this point, a user is able to select a location within the HDL description of the electronic system where a break-point is to be set. In one embodiment, a user interface assists the user in making such a location selection with respect to the HDL description (i.e., HDL location). A decision 526 determines whether a HDL location has been selected. When the decision 526 determines that a HDL location selection has not yet been made, then the decision 526 causes the break-point processing 520 to await such a selection. Once the decision 526 determines that a HDL location has been selected, then a decision 528 determines whether the selected HDL location is permitted. In other words, the decision 528 determines whether it is valid to instrument the location within the HDL description of the electronic system with a break-point. When the decision 528 determines that the selected HDL location is not permitted, then an error message is displayed 530. On the other hand, when the decision 528 determines that the selected HDL location is permitted, then the status type of the selected break-point is updated 532. Next, break-point information is entered 534 into the trigger condition database for later processing. The break-point information comprises the HDL location of the selected break-point, and the current status type. According to one embodiment, the status type for a selected break-point is "selected".

Figure 5C:
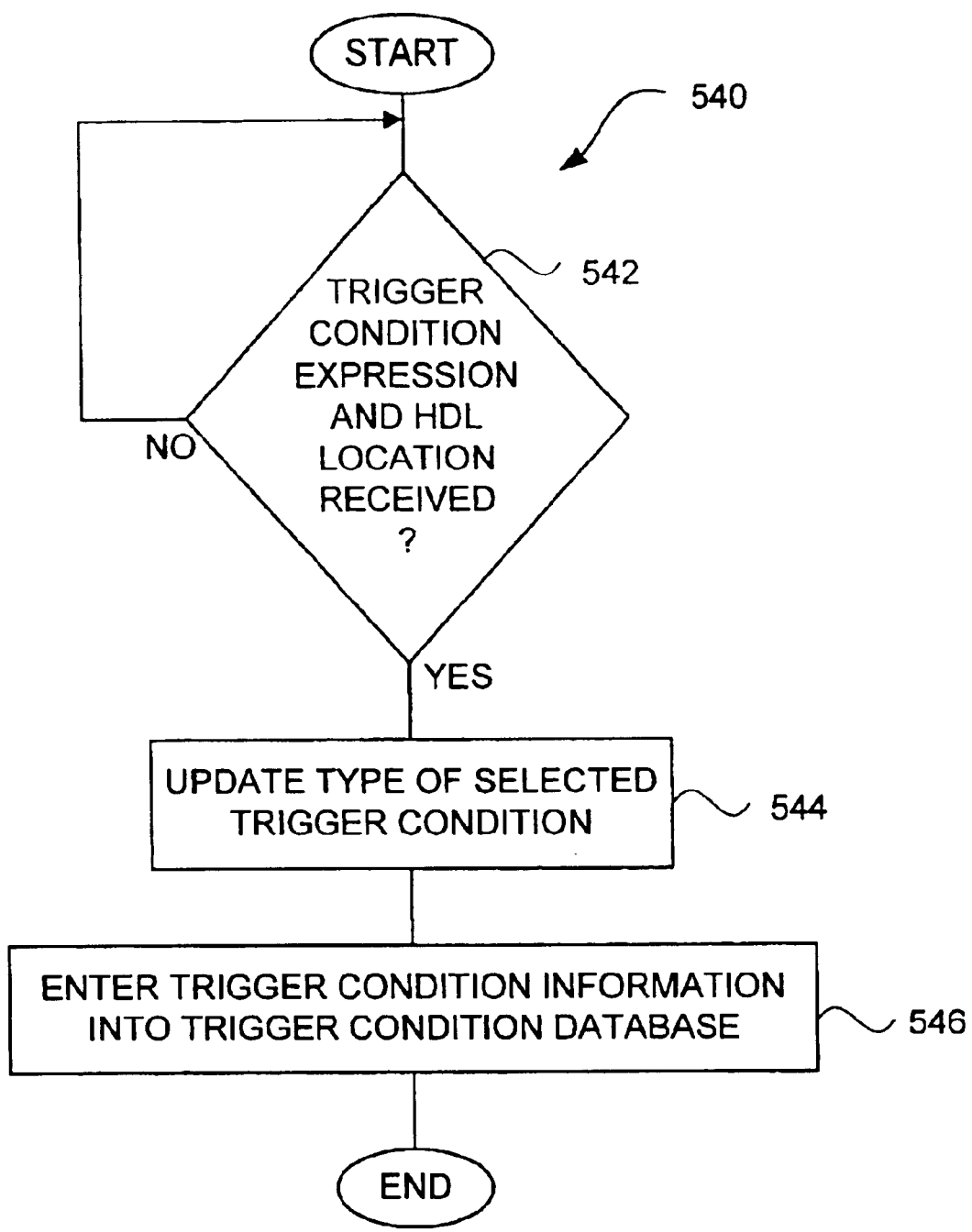
FIG. 5C is a flow diagram of explicit trigger condition selection processing according to one embodiment of the invention.

FIG. 5C is a flow diagram of explicit trigger condition selection processing 540 according to one embodiment of the invention. As noted previously, one example of an explicit trigger condition is a watch-point. The explicit trigger condition selection processing 540 begins with a decision 542 that determines whether a trigger condition expression has been received. In one embodiment, a user interface assists the user in providing such information. The trigger condition expression defines the explicit trigger condition being set. When the trigger condition expression has not yet been received, the decision 542 causes the explicit trigger condition processing 540 to await receipt of such information (selections). When the decision 542 determines that a trigger condition expression has been received, the status type of the selected trigger condition is updated 544. For example, the status type for the selected (explicit) trigger condition is "selected". Then trigger condition information is entered 546 into the trigger condition database. The trigger condition information includes the trigger condition expression, the HDL identifiers involved in building the trigger condition expression, and a status type.

Although the break-point processing 520 and the explicit trigger condition processing 540 illustrated in FIGS. 5B and 5C pertain to selection and/or entry of trigger conditions, it should be noted that selections can also be made to de-select previously selected trigger conditions. Such processing is generally similar to the selection processing, with the major exception being that the status type of the selected trigger condition is updated to "non_selected", meaning that no instrumentation shall be performed regarding to that portion of the HDL description.

Figure 5D:
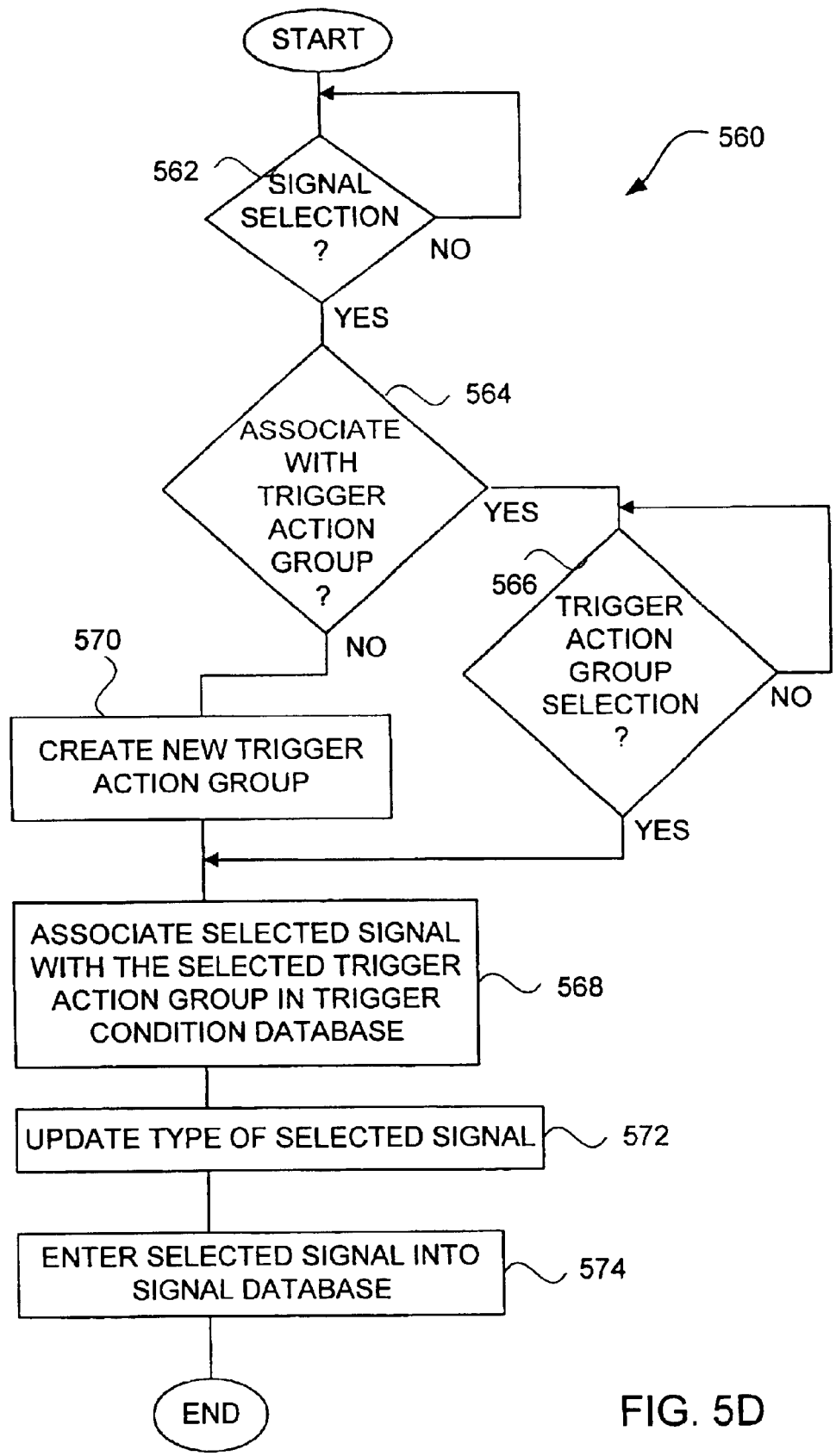
FIG. 5D is a flow diagram of sampling signal selection processing according to one embodiment of the invention.

FIG. 5D is a flow diagram of sampling signal selection processing 560 according to one embodiment of the invention. The sampling signal selection processing 560 is, for example, one representative implementation of the sampling signal selection processing 510 illustrated in FIG. 5A.

The sampling signal selection processing 560 begins with a decision 562 that determines whether a signal selection has been received. Here, a user is able to select signals by selection of an HDL identifier within the HDL description of the electronic system. In one embodiment, a user interface assists the user in making such a selection with respect to the HDL description. Hence, the decision 562 determines whether such a signal selection has occurred. When the decision 562 determines that a signal selection has not yet occurred, the sampling signal selection processing 560 awaits such a selection. Once the decision 562 determines that a signal selection has been received, then a decision 564 determines whether the selected signal is to be associated with an existing trigger action group of a prior signal selection or whether it becomes a member of a new trigger action group. When decision 564 determines that the signal selection is to be associated with an existing trigger action group, a decision 566 determines whether the user has selected an existing trigger action group. In one embodiment, a user interface assists the user in making such a selection. When the decision 566 determines that a trigger action group selection has not yet been received, the sampling signal selection processing 560 awaits such a selection. Once the decision 566 determines that a trigger action group has been selected, the selected signal is associated 568 with the selected trigger action group. On the other hand, when the decision 564 determines that the selected signal shall become a member of a new trigger action group, a new trigger action group is created 570 and the selected signal is associated 568 with that new trigger action group. Following operation 568, the status type of the selected signal is updated 572. The status type for a selected signal is updated 572 to "selected", meaning that the selected signal is selected for instrumentation. Following operation 572 the selected signal is entered 570 into a signal database (see FIG. 6). Following the operation 570, the sampling signal selection processing 560 is complete and ends.

Patching signal selection processing can also be performed in a similar manner as the sampling signal selection processing 560 illustrated in FIG. 5D. In other words, the patching signal selection processing 514 illustrated in FIG. 5A can also be represented by the processing 560 illustrated in FIG. 5D. Besides selection of sampling or patching signals in accordance with the processing illustrated in FIG. 5D, similar processing can also be performed to de-select sampling or patching signals, with the major exception that the status type of the selected signal would be updated to "non_selected", meaning that no instrumentation shall be performed regarding that particular signal.

Figure 6:
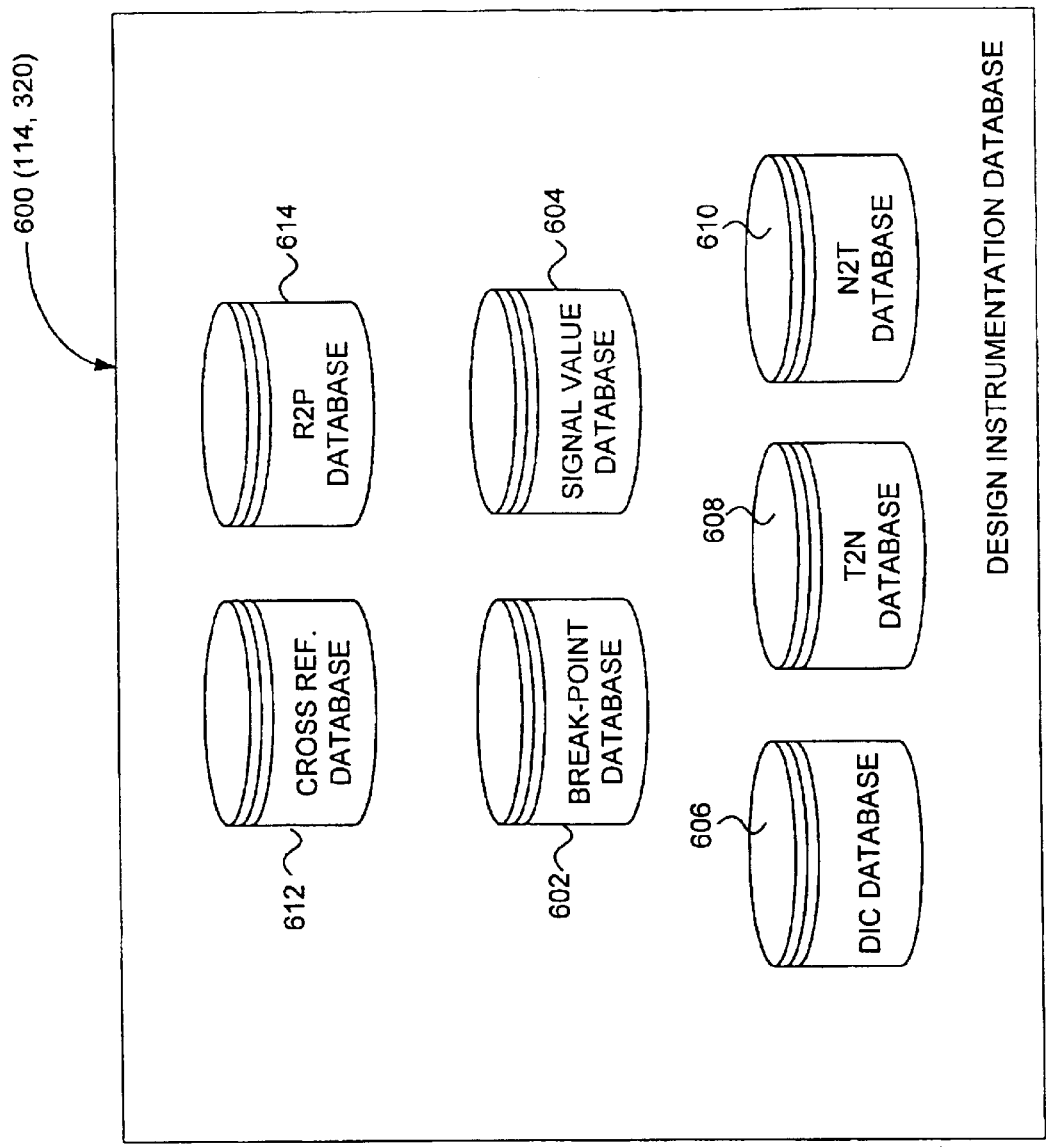
FIG. 6 is a diagram of a design instrumentation database according to one embodiment of the invention.

Design instrumentation databases can be structured in a variety of ways. FIG. 6 is a diagram of a design instrumentation database 600 according to one embodiment of the invention. The design instrumentation database 600 is, for example, suitable for use as the design instrumentation database 114 illustrated in FIGS. 1A and 1B or the design instrumentation database 320 illustrated in FIG. 3.

The design instrumentation database 600 includes a break-point database 602 that stores break-points. The design instrumentation database 600 also includes a signal value database 604 that stores signals within the electronic system that are to be sampled or patched. Hence, the break-points and the signal values, respectively stored in the break-point database 602 and the signal value database 604, represent instrumentation directives (e.g., design visibility, design patching and/or design control criteria) that govern the characteristics of the resulting DIC and its capabilities. Additionally, the design instrumentation database 600 includes a DIC database 606, a cross-reference database 612, and a Register-to-Physical (R2P) database 614. A representation of the resulting DIC that is produced by the instrumentor is stored in the DIC database 606. The cross-reference database 612 stores the associations of HDL identifiers (variables) within the HDL description to broaden the design visibility. The R2P database 614 stores translations from registers to physical addresses. The registers are, for example, registers of the DIC used to configure the DIC and hold the status of the DIC and the DUT during hardware debugging. Physical addresses are given for each register to access that register in its implementation inside the DIC. Further, the design instrumentation database 600 includes a text-to-netlist (T2N) database 608 and a netlist-to-text (N2T) database 610. The T2N database 608 and the N2T database 610 provide for each HDL identifier the associations between the HDL location and elements within the netlist (internal representation of the electronic system).

Figure 7A:
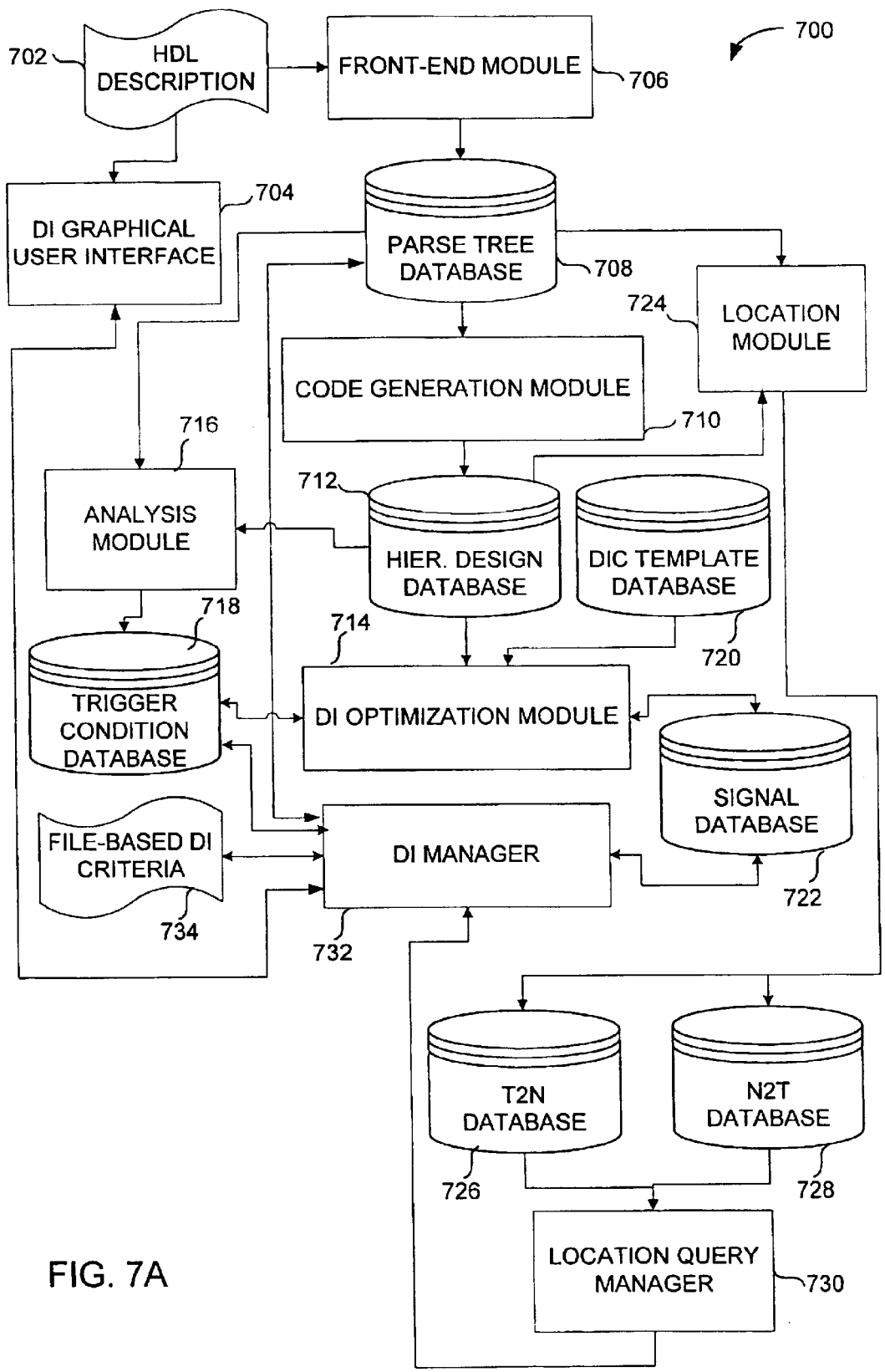
FIG. 7A is a block diagram of an instrumentation system according to one embodiment of the invention.

FIG. 7A is a block diagram of an instrumentation system 700 according to one embodiment of the invention. The instrumentation system 700 represents a more detailed block diagram of an instrumentor together with a design instrumentation database. For example, the instrumentation system 700 can be a more detailed embodiment of the instrumentation system 300 illustrated in FIG. 3.

The instrumentation system 700 receives a HDL description 702 of an electronic system. A Design Instrumentation (DI) graphical user interface 704 can display the HDL description on a display device. A user can interact with the graphical user interface 704 to make or enter instrumentation directives. A front-end module 706 receives the HDL description 702 and parses the HDL description 702 to form a parse-tree structure. The resulting parse-tree structure is stored in a parse-tree database 708. A code generation module 710 reads the parse-tree structure from the parse-tree database 708 and produces a hierarchical design representation associated with the electronic system. The hierarchical design representation provides a description of the designs behavior and structure, such as a hierarchical netlist. The hierarchical design representation is stored in a hierarchical design database 712. A DI optimization module 714 interacts with the information stored in the hierarchical design database 712. The information stored in the hierarchical design database 712 is also supplied to an analysis module 716. The analysis module 716 interacts with the parse-tree database 708 as well as the hierarchical design database 712 to analyze the HDL description of the electronic system design. The analysis includes control flow analysis which determines the feasible break-points which are stored in a trigger condition database 718. Control flow analysis is further described in "High-Level Synthesis" by Daniel D. Gajski et al., Kluwer Academic Publishers, 1992, which is hereby incorporated by reference. For each location in the HDL description which correlates to a control flow branch condition node, a unique combination of the HDL location and the trigger condition given by the control flow condition can be added as a feasible break-point into the trigger condition database 718. The purpose of control flow analysis is to reflect that break-points can be set at very particular locations in the HDL description which pertain to HDL control flow statements.

The instrumentation system 700 also includes a location module 724 that interacts with the parse-tree database 708 and the hierarchical design database 712 to produce source code location information represented as T2N information for a T2N database 726 and N2T information for a N2T database 728. The T2N information provides a method to obtain all elements in the parse-tree database 708 or the hierarchical design database 712 which refer to an identifier at a given location in the HDL description. The N2T information provides a method to relate a given element of the parse-tree database 708 or the hierarchical design database 712 to the originating location in the HDL description. A location query manager 730 interacts with the T2N database 726 and the N2T database 728 to allow a DI manager 732 to relate a location within the HDL description 702 to an element within a netlist (i.e., the parse-tree and/or the hierarchical design representation) and vice versa The DI manager 732 receives the instrumentation directives, processes them and adds them to the appropriate database (i.e., the trigger condition database 718 or the signal database 722). Instrumentation directives can be given using file-based DI criteria 734, interactively by the graphical user interface 704, or via pragmas in the HDL description. The use of instrumentation directives is explained in greater detail below. The DI manager 732 then interacts with the trigger condition database 718, the signal database 722, the location query manager 730, and the DI optimization module 714 to check each instrumentation directive for its validity. The information regarding the validity is available in the trigger condition database 718 and the signal database 722.

The DI optimization module 714 receives trigger conditions from the trigger condition database 718 and also receives a DIC template from a DIC template database 720. Still further, the DI optimization module 714 interacts with a signal database 722 to receive signals that are to be examined and/or modified. The DI optimization module 714 performs various optimizations regarding the instrumentation directives to reduce the hardware overhead and/or broaden the instrumentation coverage. Additional details on DI optimization are provided below.

For the above-mentioned location determinations with respect to selections, the DI manager 732 queries the location query manager 730 to refer to identifiers in the HDL description 702, elements in the parse-tree database 708, and elements in the hierarchical design database 712.

Selection status types are used to hold the selection information (i.e., the instrumentation directives) and exchange the selection information between the DI user interface 704, the DI manager 732 and the DI optimization module 714. The selection status types used for the selection of implicit trigger conditions, explicit trigger conditions, sampling selections and patching selections can comprise: feasible, selected, implied, and not-selected.

The instrumentation directives can be provided in at least three ways, namely, user-based (interactive), file-based, and via pragmas in the HDL description. The user-based approach has been described above. In general, a user (e.g., an electronic system designer) makes design visibility, design patching, and design control selections. More particularly, the designer can select in the HDL description which break-points, watch-points, error-traps, and property checks will be available for activation during HDL-based hardware debugging. These selections are stored in the trigger condition database 718. The designer also selects in the HDL description which signals shall be available for examination during HDL-based hardware debugging. These selections are stored in the signal database 722. The designer selects in the HDL description which signals shall be available for patching during HDL-based hardware debugging. These selections are stored in the signal database 722.

When instrumentation directives are provided in a file, the file-based DI criteria 734 is a human and/or computer readable rule set which describes which signals shall be made visible, which signals shall be made patchable, which break-points are enabled, and which trigger conditions shall be made detectable. The directives in the file-based DI criteria 734 may be expressed in any of the HDL languages that the system accepts as input or may be expressed in a specifically designed language. The directive to select an explicit trigger condition can, for example, comprise a keyword to denote that the selection is a trigger condition, and a conditional expression of HDL identifiers which must be met to issue a trigger event. Implicit trigger conditions, such as break-points, can, for example, be specified by a source code location in the HDL description. The directive to select a signal for sampling can, for example, comprise a keyword to denote that the selection is for a to-be-sampled signal, the unique HDL identifier of the selected signal, and an associated trigger action group. The directive to select a signal for patching can, for example, comprise a keyword to denote that the selection is for a to-be-patched signal, the unique HDL identifier of the selected signal, and an associated trigger action group. The file-based DI criteria 734 can be directly read by the DI manager 732 which stores selections of trigger conditions into the trigger condition database 718 and stores selections of signal values to be made visible and/or patchable into the signal database 722.

As noted above, the instrumentation directives can be provided via pragmas in the HDL description of an electronic system. Pragmas are HDL code fragments which are inserted into the HDL description to define design visibility, design patching and design control. These pragmas are added to the HDL description such that the behavior of the design of the electronic system is not altered. One implementation adds pragmas to a HDL description as specially-marked HDL comments. By placing the pragmas in comments, other tools which read the HDL description containing the pragmas will be unaffected. However, the front-end module 706 can recognize and interpret these pragmas inside the comments. More particularly, providing instrumentation directives via pragmas can be accomplished by the front-end module 706 recognizing the pragmas enclosed within comments and placing the appropriate information into the parse-tree database 708. This information is read by the DI manager 732 which stores the necessary information in the trigger condition database 718 and the signal database 722.

Several examples of pragmas are provided below. These pragmas are written in the form of a HDL comment with an indicator (e.g., "B2SI") to differentiate them from other comments. In the following examples, following the identifier "B2SI", the remainder of the pragma describes either a design control, or a design visibility, or a design patching directive. The exact form of the pragmas depend on the HDL language being used. The following are examples of pragmas written in Verilog HDL.

The following example shows a comment including a pragma for design control.

```
always @( a or b or c or d or e or f ) begin
    if( cond == 4 'b1111 ) begin
        // B2SI trigger("trigger_name", (a == 2 'b10) &&
(d * e < f + 5 'b1100));
    end
end
```

This pragma produces a trigger condition that is active if the expression $(a==2'b10)$ && $(d*e<f+5'b1100)$ evaluates to true. The expression has the same meaning and variable scoping as it would were it a regular HDL expression. This trigger can also be placed in the control flow of the design so the trigger will not be active unless the control flow is active. In this example, (cond==4'b1111) must also be met to issue a trigger event. The trigger condition has a name ("trigger_name") so that other pragmas may refer to this trigger condition.

The following example shows a comment including a pragma for signal visibility.

```
module mod1( in1, in2, in3, out );
    input in1, in2;
    input in3; // B2SI visible
    output out;
    . . .
```

Here, the visibility pragma is being used to mark "in3" as visible.

The following example shows a comment including a pragma for signal patching.

```
module mod2( in1, in2, in3, out );
input in1, in2;
input in3;
output out;
reg [1:0] aa; // B2SI patchable
```

Here, the patching pragma is being used to mark "aa" as patchable. The trigger condition for the sampling and/or patching can be specified by associating it with a trigger action group (by referring to a trigger name, for example "trigger_name"), or during HDL-based hardware debugging.

The optimization of the design instrumentation can enhance its effects and can reduce hardware costs of the DIC. One example of an optimization for enhancing the effects of the instrumentation is implication analysis. One example for an optimization which aims to reduce the hardware costs of the DIC is resource sharing.

The selections of various trigger conditions and signals for sampling and/or patching may potentially imply other signal selections based on their controlability and observability dependencies. Controlability and observability are, for example, commonly used-concepts in Automatic Test Pattern generation of combinational and sequential logic. See D. Bhattacharya and J. P. Hayes, "Hierarchical Modeling for VLSI Circuit Testing," Boston: Kluwer, 1990, p. 159, which is hereby incorporated by reference. Implication analysis works as follows. Initially, the hierarchical design database 712 and the DI optimimization module 714 are consulted to determine whether a trigger condition with the status type "'selected" implies certain other trigger conditions. If so, the implied trigger conditions can also be detected during HDL-based hardware debugging, have their status type set to "implied", and be stored into the trigger condition database 718. Secondly, the hierarchical design database 712 and the DI optimization module 714 can be consulted to determine whether certain other signal values are implied by the selected signals. In particular, the implied signals can be derived from the selected signals plus some calculations during HDL-based hardware debugging. Each implied signal is then stored with its status type set to "implied" into the signal database 722.

Resource sharing is a widely used optimization which is, for example, used in synthesis. Although resource sharing can be performed using many different approaches, in one approach to resource sharing, the DI optimization module 714 operates to share resources in the DIC as follows. First, by consulting the DIC template database 720, the DI optimization module 714 knows about the structure and the cost model of the DIC and can determine whether trigger conditions and signals to be sampled have commonalities which can be utilized for resource sharing. Second, the hierarchical design database 712 and the DIC template database 720 can be consulted by the DI optimization module 714 when determining whether other signals should instead be sampled, since such signals imply all the selected signals, but their sampling requires less hardware overhead or leads to additional signal visibility. Third, by consulting the DIC template database 720, the DI optimization module 714 knows about the structure and the cost model of the DIC and can determine whether trigger conditions and signals to be sampled have commonalities which can be utilized for resource sharing. Fourth, by consulting the DIC template database 720, the DI optimization module 714 knows about the structure and the cost model of the DIC and can determine whether signals to be patched have commonalities which can be utilized for resource sharing.

Once the trigger conditions and the signals to be sampled and/or patched are determined, other portions of the HDL design can be integrated even if such portions are not described by a synthesizable HDL description but are available as synthesized and physically realized hard blocks, such as previously designed hard blocks. If the hard blocks are synthesized from instrumented HDL and include DIC, regardless whether the DIC is a complete or a partial, the previously inserted DIC can be re-used for debugging the hard blocks. The distinction between partial versus complete DIC is described in greater detail below.

Figure 7B:
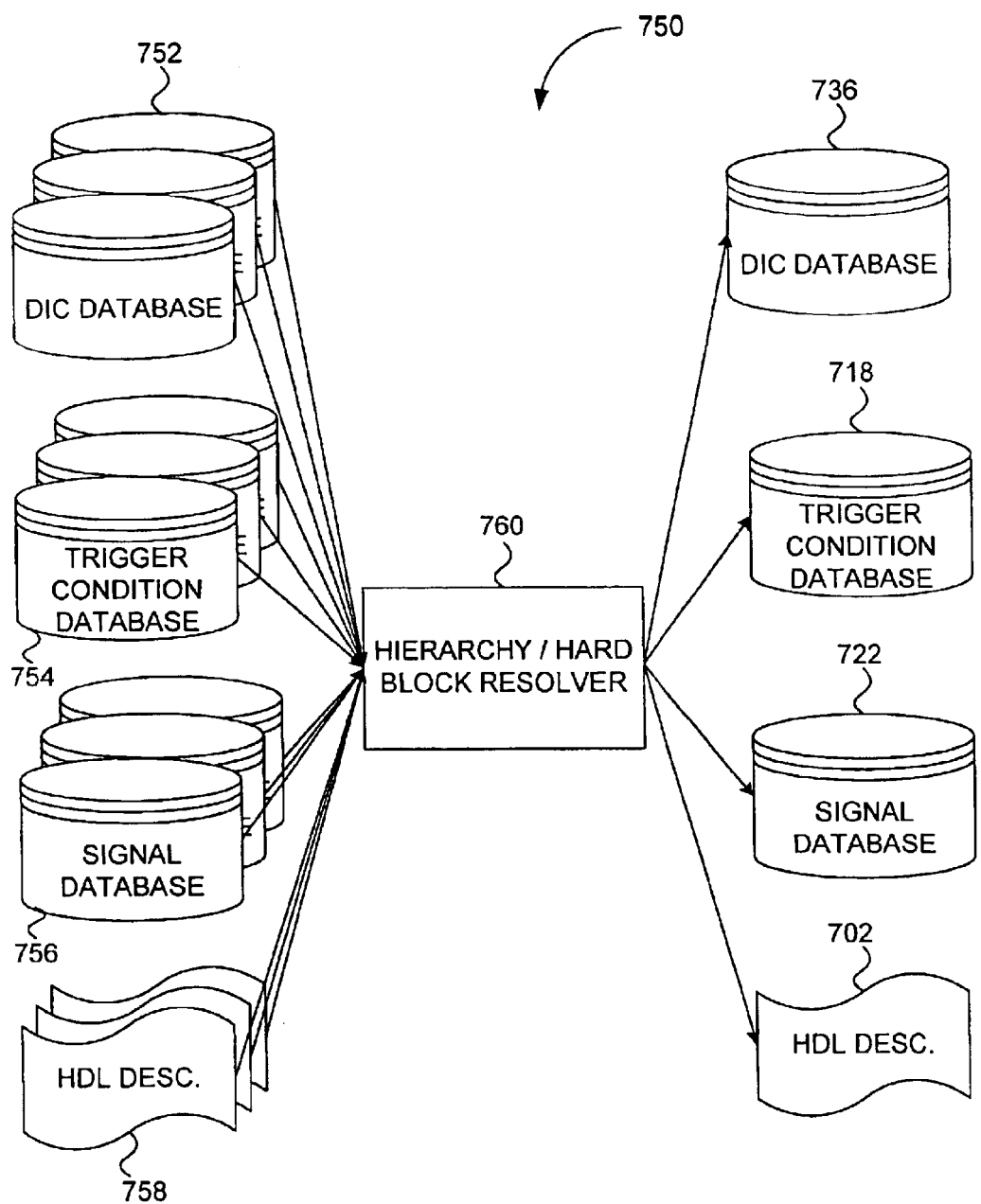
FIG. 7B is a diagram of a hard block resolution system according to one embodiment of the invention.

In order for a hard block to be re-used, it should have associated DI data stored in an associated design instrumentation database. FIG. 7B is a diagram of a hard block resolution system 750 according to one embodiment of the invention. The data needed are a hard block's DIC database 752, a hard block's trigger condition database 754, a hard block's signal database 756, and optionally HDL description 758. Often, vendors of hard blocks do not want to expose the internal workings of their design by showing its HDL description (e.g., source code). To accommodate this need, the HDL description is not required to describe the entire hard block's functionality. Some minimal HDL description providing just enough text to examine signals, to set watch-point expressions for the signals, and to set break-points at HDL locations which refer to implemented trigger detection circuitry is enough to enable HDL-based hardware debugging of the hard blocks. For example, a hard block implementing a simple controller might expose the controller state variable for sampling and for triggering on its value. It might also allow a user to set a break-point when the machine makes certain transitions or receives certain signals from the circuitry to which it is connected. A hierarchy and hard block resolver 760 processes the information from the hard block's DIC database 752, the hard block's trigger condition database 754, the hard block's signal database 756 and the optional HDL description 758, and merges same into the current HDL design's DIC database 736, the trigger condition database 718, the signal database 722, and the original HDL description 702. As a result, the resolved information will be available during HDL-based hardware debugging.

The instrumentor 700 can also perform cross-reference analysis to gather and store data in the design instrumentation phase such that the HDL-based hardware debugger will be capable of examining signals in the HDL description. Additionally, if the design instrumentation optimization determines that other signals could be derived from the sampled signals, the HDL-based hardware debugger needs the HDL expressions to compute the derived signals "on the fly" from the sampled signals. The expressions are calculated during cross-reference analysis and stored in the cross-reference database 1504.

Figure 15:
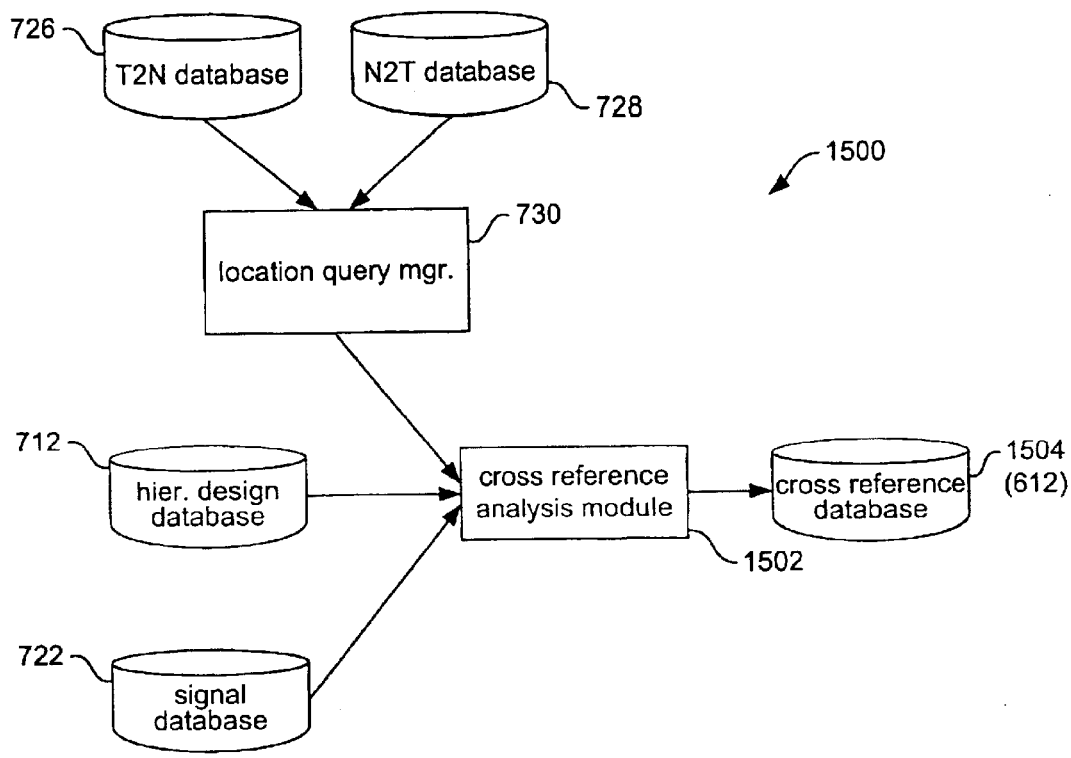
FIG. 15 is a block diagram of a portion of an instrumentation system which includes a cross-reference analysis module and a cross-reference database according to one embodiment of the invention.

FIG. 15 is a block diagram of a portion of an instrumentation system 1500 which includes a cross-reference analysis module 1502 and a cross-reference database 1504 according to one embodiment of the invention. The cross-reference analysis module 1502 can be provided within the instrumentation system 700, and the cross-reference database 1504 can be provided within the design instrumentation database 612 and utilized by the instrumentation system 700. The cross-reference analysis module 1502 can couple to the location query manager 730, the hierarchical design database 712 and the signal database 722. The cross-reference analysis module 1502 reads signal information from the signal database 722. Each entry in the signal database 722 corresponds to one signal that is either selected or implied to be made visible. Each entry in the signal database 722 also comprises information on whether the signal is to be sampled and/or patched in the DIC or whether the signal is derived from other to-be-sampled signals. In one embodiment, for each signal that is derived from other to-be-sampled signals, the following operations are performed. First, the cross-reference analysis module 1502 queries the HDL location information of the signal from the location query manager 730. The cross-reference analysis module 1502 looks up the signal in the hierarchical design database 712 and determines the proper HDL expression to compute the derived signal from the set of sampled signals. The cross-reference analysis module 1502 then writes the HDL expression into the cross-reference database 1504.

The instrumentor 700 can also perform Design-for-Test (DFT) analysis. If the electronic system contains additional circuitry for testability such as scan-chains, boundary scan logic, JTAG tap-controllers or similar DFT features, and if such circuitry is described in the DFT information (file) 310, then the circuitry can be shared to reduce the hardware overhead of the DIC. Example formats of such a DFT information file is the Boundary-Scan Description Language (BSDL) or Hierarchical Scan Description Language (HSDL), both defined by the IEEE 1149.1 JTAG standard available from the Institute of Electrical and Electronic Engineers (IEEE) in Piscataway, N.J., which is hereby incorporated by reference.

Figure 16:
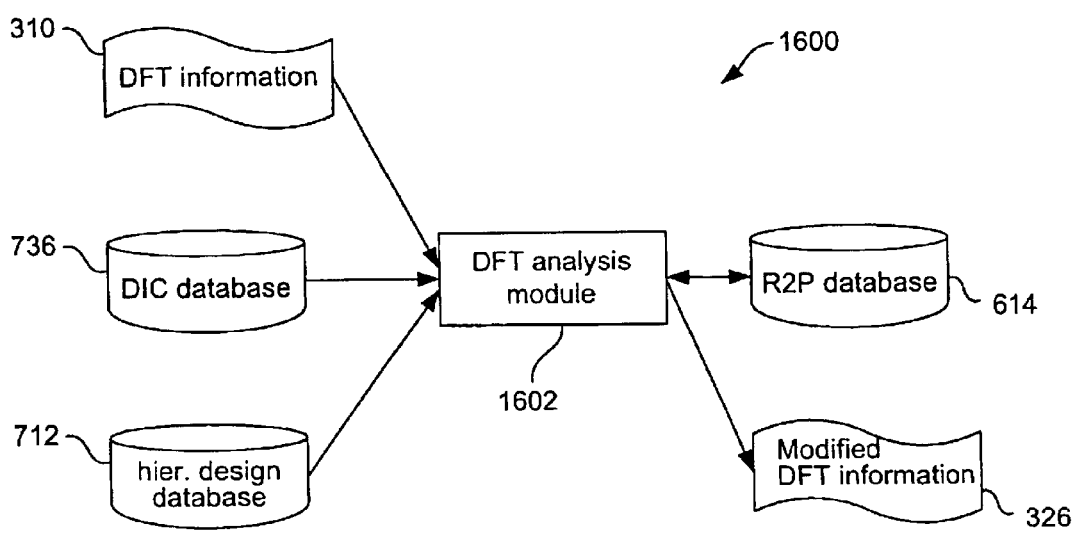
FIG. 16 is a block diagram of a portion of an instrumentation system which includes a DFT analysis module according to one embodiment of the invention.

FIG. 16 is a block diagram of a portion of an instrumentation system 1600 which includes a DFT analysis module 1602 according to one embodiment of the invention. The DFT analysis module 1602 receives information about the DFT information 310, the current implementation of the DIC as stored in the DIC database 736 and the hierarchical design database 712, and the register-to-physical (R2P) address translation information (e.g., table) provided in the R2P database 614. The result produced by the DFT analysis module 1602 is the modified DFT information 326, namely, altered register-to-physical address translation information (e.g., table), which is needed by post-processing DFT tools. The R2P database 614 needs to be updated each time DIC registers have been moved to different physical locations.

Figure 17:
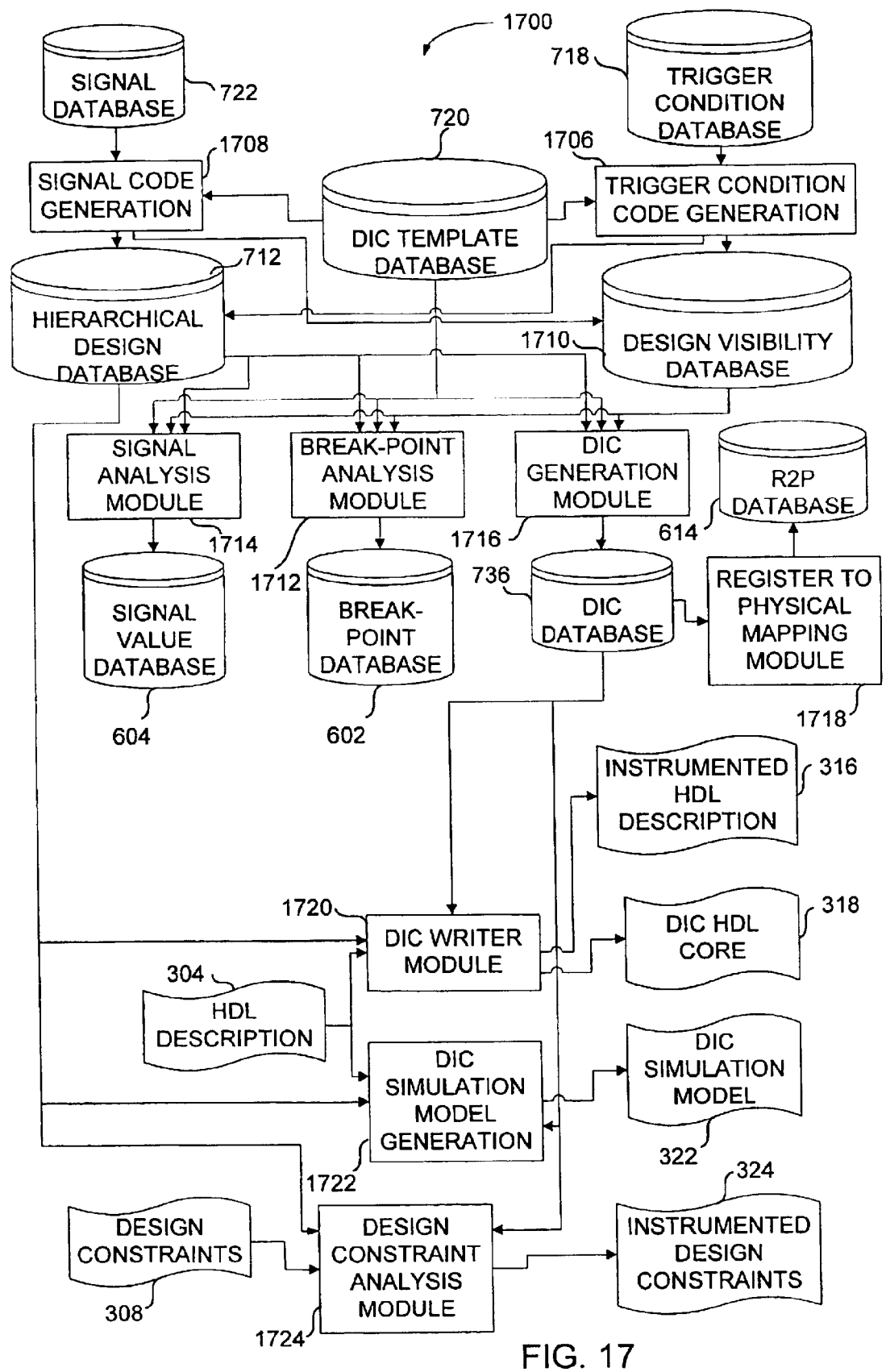
FIG. 17 is a data flow diagram illustrating DIC creation processing according to one embodiment of the invention.

FIG. 17 is a data flow diagram illustrating DIC creation processing 1700 according to one embodiment of the invention. The DIC and the instrumented design is created at the end of the design instrumentation process. The DIC is described by the DIC HDL description 318. The instrumented design is described by the instrumented HDL description 316. Additionally, various components of the design instrumentation database 600 are established, including the R2P database 614, the DIC database 736, the signal value database 604, and the break-point database 602. The DIC creation processing 1700 has a data flow described as follows.

First, the trigger condition database 718 and the signal database 722 (which can result from the DI manager 732) are processed by a trigger condition code generation module 1706 and a signal code generation module 1708, respectively.

Second, for each entry in the trigger condition database 718, the trigger condition code generation module 1706 generates the structures of the trigger detection circuitry for the DIC according to the DIC template database 720. Then, such structures are added to the hierarchical design database 712. In addition, proper DIC register configuration rules can be added to a DI rule database 1710.

Third, for each signal designated as to-be-sampled in the signal database 722, the signal code generation module 1708 creates circuitry to sample such signal according to the structure in the DIC template database 720, and adds the structures to the hierarchical design database 712 and the proper DIC register configuration rules to the DI rules database 1710.

Fourth, for each signal designated as to-be-patched in the signal database 722, the signal code generation module 1708 generates the circuitry to patch such signal according to the structure in the DIC template database 720, and adds such structures to the hierarchical design database 712 and the proper DIC register configuration rules to the DI rule database 1710.

Fifth, a break-point analysis module 1712 then reads the trigger detection circuitry from the hierarchical design database 712 and the register configuration rules from the DI rule database 1710. Knowing the structure of the DIC from the DIC template database 720, the break-point analysis module 1712 creates the break-point database 602. The break-point database 602 comprises all the rules for which the location break-points are possible to be set. The break-point database 602 also comprises rules about mutual exclusivities between break-points due to hardware restrictions in the DIC. For example, a certain break-point may not be used with another break-point because both break-points require the same hardware resource in the DIC.

Sixth, signal analysis module 1714 then reads the signal sampling/patching circuitry from the hierarchical design database 712 and the register configuration rules from the DI rule database 1710, and knowing the structure of the DIC from the DIC template database 720, the signal value database 604 is created. The signal value database 604 comprises all the rules about mutual exclusivities between signal values for sampling and/or patching due to hardware restrictions in the DIC.

Figure 8:
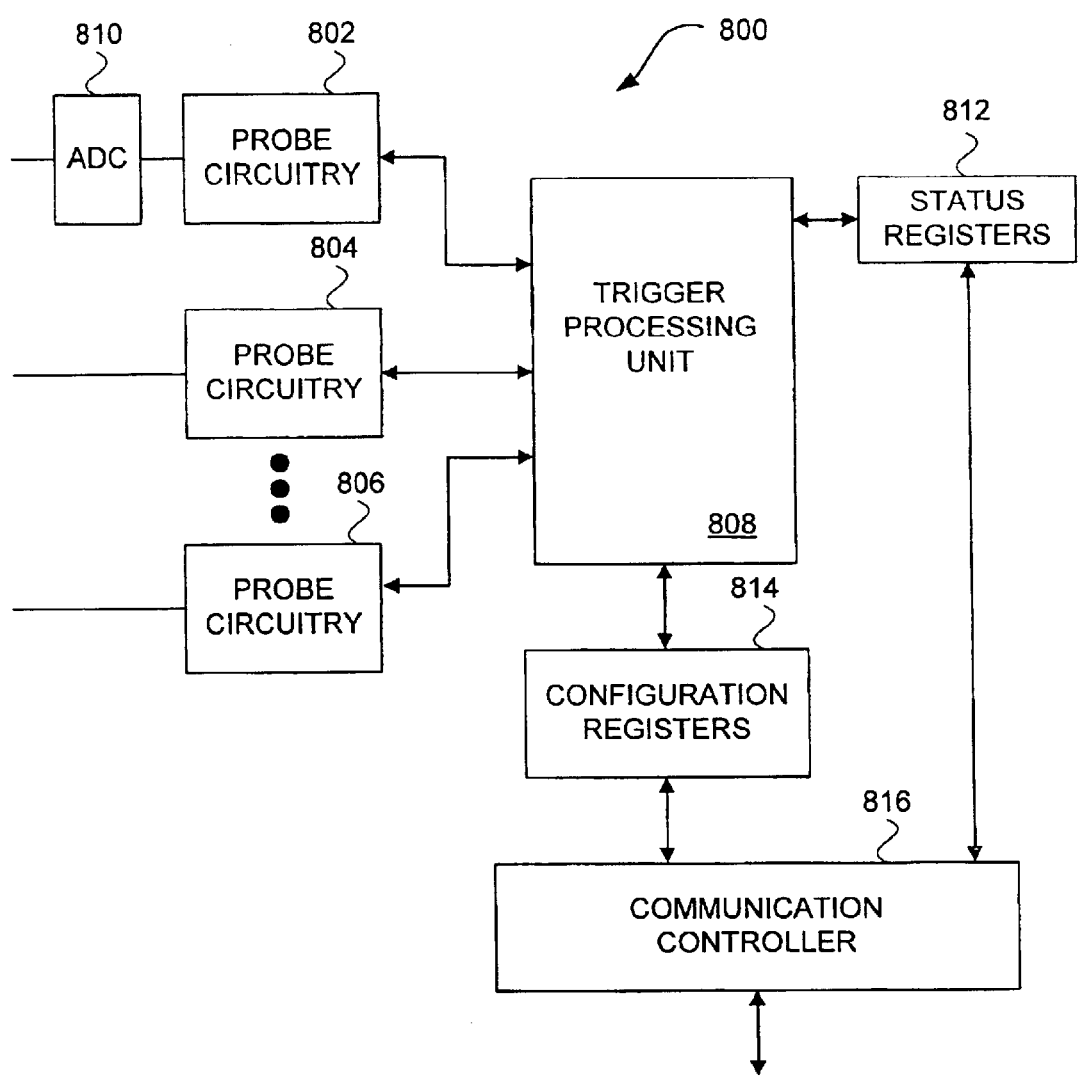
FIG. 8 is a block diagram of a representative Design Instrumentation Circuit (DIC) according to one embodiment of the invention.

Seventh, the DIC generation module 1716 then reads the DI rule database 1710 and the DIC template database 720 and connects all trigger detection circuitry and all signal sampling/patching circuitry to a trigger processing unit (TPU)(see FIG. 8). Also, the configuration and the status registers, and the communication controller are added and connected. The complete structure of the DIC is then written to the hierarchical design database 712 and the entire and complete rule set to configure the registers of the DIC is written to the DIC database 736.

Eighth, a DIC register-to-physical mapping module 1718 maps each register configuration and each status register in the DIC into an address space of physical memory in the design to produce the R2P database 614. For example, the physical memory could be implemented as a set of scan-chains, in which case the physical address of a configuration or status register would be given by the index of the scan-chain used and the bit position within the scan-chain.

Ninth, a DIC writer module 1720 produces the synthesizable HDL description of the DIC (e.g., DIC HDL description 318), defined by the configuration and status information in the DIC database 736 and the DIC structure stored in the hierarchical design database 712.

Tenth, the DIC writer module 1720 also reads in the original HDL description 304, annotates it with the information about the DIC from the hierarchical design database 712 and the DIC database 736, and writes out the instrumented HDL description 316 (e.g., annotated HDL source code) of the instrumented design for further processing by synthesis and place-and-route tools.

Eleventh, to support regression testing of the instrumented design using functional simulation, the optional DIC simulation model 322, including the necessary HDL wrapper files, is written by a DIC simulation model generation module 1722.

Twelfth, a design constraint analysis module 1724 reads the design constraint file 308 which holds all constraints created by the designer. The design constraint analysis module 1724 then adjusts the original set of constraints to produce the instrumented design constraint file 324 for the instrumented design. Design constraint analysis is described in greater detail below.

Annotating the HDL description adds the HDL description of the DIC to the original HDL description and connects the DIC to the portions of the original HDL description for which design visibility, design patching, and design control has been selected. The annotation can be performed automatically. The result of the annotation is the instrumented HDL description. The instrumented HDL description is the original HDL description together with a small amount of HDL description added for the DIC. The annotations may be added to the hierarchical original HDL description in two ways: distributed or monolithic. Distributed annotations are added to each hierarchical element of the original HDL description. Monolithic annotations are added to the top-level element of the HDL design and then connect to other parts of the design. Since distributed annotations are more powerful and more complex than monolithic annotations, distributed annotations will be described in detail below.

A HDL description can be composed of one or more HDL Building Blocks (BBs). Similarly, the DIC is composed of one or more specially-tailored HDL BBs, the DICBBs. One such DICBB can be inserted into each BB in the original HDL description. The BB in the original HDL design is termed the DICBB's host BB (HBB). An example provided below is a Verilog description of a simple building block which consists of some simple logic.

```
module mod3( in1, in2, out );
    input in1, in2;
    output out;
    assign out = ( in1 > in2 );
endmodule
```

Another example provided below is a Verilog description of the Host Building Block (HBB) above following annotation (i.e., instrumented building block) to include one of the DICBBs with some simple building blocks which consist of one HBB and some simple logic. In the Verilog language the DICBB is an instantiation of a specially-tailored DIC Verilog module.

```
module mod3( in1, in2, out );
input in1, in2;
output out;
assign out = ( in1 > in2 );
DIC_mod1 DIC_instance( in1, in2 );
endmodule
module DIC_mod1( in1, in2 );
input in1, in2;
// specially-tailored DIC goes here
endmodule
```

Each DICBB communicates with its associated HBB by connecting to the HBB's signals. Design visibility of a particular HDL identifier residing in a HBB can be accomplished by connecting the identifier to the associated DICBB. The internal circuitry of the DICBB is created using the knowledge of the signal connections. This mechanism allows design visibility, design patching, and design control to be supported by the DIC. The above example shows a DICBB connected to two HDL identifiers "in1" and "in2". The circuitry inside DIC_mod1 can utilize the signals for the purpose of design visibility of one or both the signals and/or for creating watch-points which monitor one or both of the signals.

If a symbolically-encoded HDL identifier is made visible, symbolic values can be displayed for it during HDL-based hardware debugging. To do this, each symbolic value needs to be associated with the actual binary code assigned to it during synthesis (116 in FIG. 1A.). Since it is desirable for the instrumentation to be independent of the synthesis, the HDL-based hardware debugger cannot rely on any information from the synthesis about the association between binary codes and symbolic values. Consequently, each of the symbolic values must be connected to the DICBB so that the circuitry inside the DICBB can explicitly know the binary codes assigned to each symbolic value. During HDL-based hardware debugging, the encoding information is obtained from the instrumented HDL design.

Break-points are supported by adding signals to the HBB which are active when the control flow which the break-point is modeling is active, and are inactive otherwise. The added signals are then connected to the DIC associated with the HBB and are used when the circuitry of the DIC is created. The following example shows the Verilog HDL fragment of a HBB which has simple control flow logic.

```
1    module mod4( in1, in2, out );
2    input in1, in2;
3    output out;
4
5        always@ ( in1 or in2 ) begin
6            if (( in1 == 1 'b0 ) || ( in2 == 1 'b1 ) ) begin
7                out = 1 'b1;
8            end else begin
9                out = 1 'b0;
10           end
11       end
12
13   endmodule
```

Line numbers have been added to the above example for reference purposes, the line numbers are not part of the Verilog description. There are two lines, line 6 and line 8, which can have a break-point. These lines correspond to the two control flow branches which arise from the "if" conditional statement on line 6.

The next example shows the Verilog HDL fragment of the above example annotated such that the added circuitry supports two break-points.

```
module mod4( in1, in2, out );
    input in1, in2;
    output out;
    reg bp1, bp2; // Added during instrumentation
    always@ ( in1 or in2 ) begin
        bp1 = 1 'b0;
        bp2 = 1 'b0;
        if ( ( in1 == 1 'b0 ) || ( in2 == 1 'b1 ) ) begin
            out = 1 'b1;
            bp1 = 1 'b1;
        end else begin
            out = 1 'b0;
            bp2 = 1 'b1;
        end
    end
    DIC_mod2 DIC_instance( bp1, bp2 );
endmodule
module DIC_mod2( bp1, bp2 );
input bp1, bp2;
// specially-tailored DIC goes here
endmodule
```

Note signals "bp1" and "bp2" have been added to the HBB. Each signal is active (set to logical 1) only when the control flow branch that the signal is modeling is active. The signals are connected to the associated DICBB DIC_mod2 and can be used by the circuitry inside the DICBB to create break-point circuitry.

The DICBBs in the instrumented HDL design communicate with each other by connecting to identifiers that have been added to their respective HBBs and which are also connected to the HBB's ports. The following example shows the Verilog HDL fragment which consists of two BBs. BB mod6 is instantiated by BB.

```
module mod5( in1, in2, in3, out );
input in1, in2, in3;
output out;
wire tmp_out;
assign out = ( in1 > tmp_out );
```

-continued

```
mod6 instance( in2, in3, tmp_out );
endmodule
module mod6( com1, com2, out );
input com1, com2;
output out;
assign out = com1 ^ com2;
endmodule
```

The following example shows the Verilog HDL fragment of the above example after being annotated.

```
module mod5( in1, in2, in3, out );
input in1, in2, in3;
output out;
wire tmp_out;
wire DIC_com2; // Added during instrumentation
assign out = ( in1 > tmp_out );
mod6 instance( in2, in3, tmp_out, DIC_com2 );
DIC_mod3 DIC_inst3( DIC_com2 );
endmodule
module mod6( com1, com2, out, DIC_com1 );
input com1, com2;
output out;
inout DIC_com1; // Added during instrumentation
assign out = com1 ^ com2;
DIC_mod4 DIC_inst4( DIC_com1 );
endmodule
```

The annotation consists of: (1) DICBBs DIC_mod3 and DIC_mod4 which have been added to their respective HBBs mod5 and mod6. (2) Signal DIC_com1 which has been added to HBB mod6, added to the port list of HBB mod6, and connected to DIC_mod4. (3) Signal DIC_com2 which has been added to the HBB mod5 and connected to the DIC_com1 port of the DIC_mod4 DICBB and to the DIC_mod3 DICBB. Consequently, the DIC_mod_4 DICBB communicates with the DIC_mod3 DICBB via the connection of DIC_mod4 to signal DIC_com1 which is connected through port $DIC_{13}$ com1 of mod6 to signal DIC_com2 of mod5 which is connected to DIC_mod3.

An original design of the electronic system (e.g., original HDL description) can be instrumented with either a complete DIC or a partial DIC. A complete DIC comprises a communication controller and a trigger processing unit (TPU). While a complete DIC, such as shown in FIG. 8, includes a communication controller and a TPU, a partial DIC does not include these components. An original HDL design may be instrumented with a partial DIC if it is to be used inside another instrumented HDL design which has a complete DIC. For example, an original HDL description could be instrumented with a partial DIC if it were to be used as a hard block. Although an instrumented HDL design with a complete DIC can be used as a hard block if its communication controller and TPU are disabled, this wastes hardware and thus space.

Instrumenting with a complete DIC can be accomplished by adding a special DICBB which is referred to as the "master" DICBB (MDICBB) which comprises a communication controller and a TPU. The MDICBB is placed into an HBB of the original HDL design which allows the MDICBB to communicate with the host communication controller. For example, in a Verilog design, the HBB of the MDICBB would be the Verilog module which is the top-level module in the design hierarchy—the HBB would be the one module in the design which is not instantiated in the Verilog design. The MDICBB is connected to the DICBB in the MDICBB's HBB. Consequently, the MDICBB can communicate with all other DICBBs in the instrumented HDL design so that said MDICBB can gather, process, and transmit to the host communication controller information from the other DICBBs. The following example shows the Verilog HDL fragment of an above example for a basic building block (re module mod3) after it has been annotated.

```
module mod7( in1, in2, out, DIC_com3 );
input in1, in2;
output out;
inout DIC_com3; // Added during instrumentation
assign out = ( in1 > in2 );
DIC_mod5 MDICBB_inst( DIC_com3 );
endmodule
```

Note that in this example, mod7 is the top-level module of the original HDL design and DIC_mod5 is the MDICBB. DIC_mod5 communicates to the environment by connecting with signal DIC_com3 which has also been made a port of the HBB mod7.

In performing design constraint analysis, the design constraint analysis module 1724 reads the design constraint file 308 which holds all constraints that ensure the HDL design meets the area, delay, power consumption, routability, and/or testability specifications made by the designer of the electronic system. The design constraint analysis module 1724 then analyzes the instrumented HDL design stored in the hierarchical design database 712 and adjusts the original set of constraints to the inserted DIC and possibly adds additional constraints. Both sets of the constraints together can be written into the instrumented design constraint file 324 for the instrumented HDL design. The additional constraints attempt to minimize the impact of the DIC on the area, delay, power consumption, routability, and/or testability of the HDL design.

FIG. 8 is a block diagram of a representative design instrumentation circuit (DIC) according to one embodiment of the invention. The representative DIC 800 includes a plurality of probe circuits, namely probe circuitry 802, probe circuitry 804 and probe circuitry 806. The probe circuitry 802–806 couple to a trigger processing unit 808. The trigger processing unit 808 is configurable circuitry which is used to process trigger events and issue corresponding trigger actions. Such correspondance between the trigger events and the trigger actions can be given as complex trigger conditions. A complex trigger condition can be a complex conditional expression between two or more trigger events. Propositional or temporal logic may be used to describe such expressions. The trigger processing unit 808 controls the ability of the DIC 800 to detect trigger conditions and to sample and/or patch signal values. The acts of detection, sampling and patching can be independent from each other. When trigger conditions are detected, the trigger processing unit 808 triggers sampling (visibility) or patching of signals within the DUT. In this regard, the probe circuitry 802–806 couple to electrical signals within the DUT. Each of the probe circuitry 802–806 is designed to perform a sampling of a signal, a modification to a signal, or a detection of a trigger condition. Typically, these signals or conditions are digital conditions. However, in the case in which the DUT includes analog and digital portions, the probe circuitry 802 can include an analog-to-digital (A/D) converter 810 so as to convert analog signals to digital signals prior to being received at the probe circuitry 802. The representative DIC 800 also includes status registers 812 and configuration registers 814. The status registers 812 store certain status information and the configuration registers 814 store certain configuration information.

A communication controller 816 couples to the status registers 812 and the configuration registers 814. Hence, a HDL-based hardware debugger is able to communicate with the DIC via the communication controller 816. More particularly, the HDL-based hardware debugger can read and set registers within the status registers 812 as well as within the configuration registers 814. As a result, the communication controller 816 allows configuration data to be sent to the DIC 800 and status data to be retrieved from the DIC 800. The communication controller 816 can implement a method (i.e., run-time method) for externally reading and writing the configuration registers 814 which configure the DIC 800 and externally reading the status registers 812 (memory) which store the sample values. In one embodiment, the register values can be read or set using a standard connection defined by the IEEE 1149.1 JTAG standard, available from the Institute of Electrical and Electronic Engineers in Piscataway, N.J., which is hereby incorporated by reference.

In order to maintain flexibility in HDL-based hardware debugging, the DIC is configurable at run-time. Externally configurable registers are used to change the detection of HDL-based trigger conditions and the selection of signals to be sampled and/or patched without the need to re-implement the design of the electronic system.

There is also a general need for the DIC to communicate with components which are not instrumented. This external communication can be implemented by connecting signals between the DIC and the other components. One example would be an external signal that the DIC activates when any trigger condition is met. In another example, the DIC has external connections to notify and be notified about certain conditions which occur in an optional embedded processing unit (e.g., CPU) and thus support hardware/software co-debugging.

Additional details concerning representative implementations for the trigger processing unit 808 and the probe circuitry 802–806 are provided below. This circuitry is added to the original design of the electronic system. For the purposes of the discussion below, it is assumed that the hardware debugging system 100 of FIG. 1A is being used. Hence, the circuitry for the DIC is added to the original HDL description as additional HDL by the instrumentor 100 in producing the instrumented HDL description 112.

Figure 9:
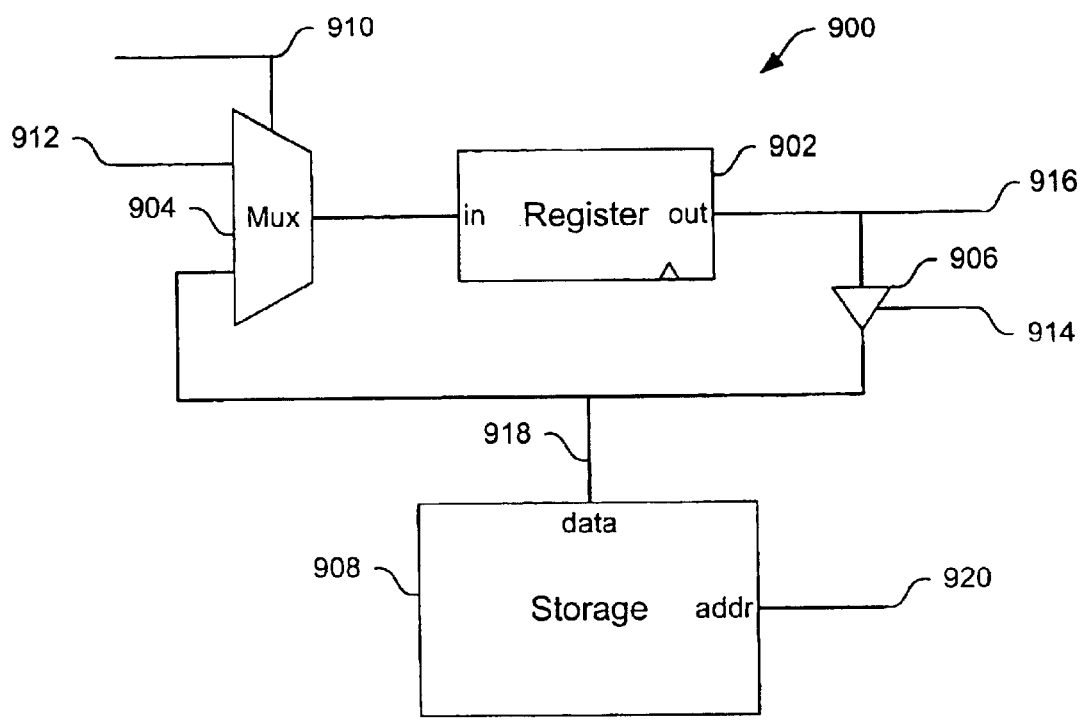
FIG. 9 describes a representative generic configurable circuitry which can implement design sampling and design patching according to one embodiment of the invention.

FIG. 9 describes a representative generic configurable circuitry 900 which can implement design sampling and design patching according to one embodiment of the invention. The circuitry 900 includes a register 902, a multiplexer 904, a tri-state register 906, and a storage 908. When the register 902 is to be sampled, a selector signal 910 selects a register input 912 to drive the register 902 via multiplexor 904. A sample enable signal 914 enables the tri-state buffer 906 to drive a register output 916 onto a data bus 918. The storage 908 couples to the data bus 918 and can thus store the value at the register output 916. For each successive sample, the value on an address bus 920 is incremented. Alternatively, when the circuitry 900 is to be patched, the address bus 920 selects the proper patch value from the storage 908. The multiplexor selector signal 910 selects the data bus 918 to drive the input to the register 902 via the multiplexor 904, and the selector signal 914 disables the tri-state buffer 906, thereby driving the value from the storage 908 into the register 902.

Storage 908 can also be implemented by sampling circuitry. Sampling circuitry can use sets of registers or Random Access Memory (RAM) as storage for sampling predetermined signals. The sampled values can thereafter be read from the storage and communicated to the HDL-based hardware debugger. One implementation of storage 908 is a circular buffer of depth M which continuously samples predetermined signals. When a predetermined trigger action occurs, sampling is stopped. At which point the circular buffer contains the M last values of all sampled signals. To save circuitry, the sampling circuitry can be shared for many signals. For example, a configurable crossbar, implemented either as a full crossbar or as a multiplexor network, will allow many signals to share the same storage (e.g., circular buffer).

Design patching can also be implemented by patching circuitry. According to one embodiment, the patching circuitry provides a method for patching predetermined internal signal registers. For each register in the design of the electronic system which is to be made patchable, the patching circuitry can include a companion register and simple control circuitry. The companion register holds the patch value(s) and is run-time configurable. The patching circuitry operates as follows: First, during configuration of the DIC, the companion storage is loaded with a desired value. Second, under the control of a particular trigger action, the patching circuitry forces the patched register to take some configured value from the companion storage. This patching circuitry thus allows patching to be used for many applications including, but not limited to, debugging and fixing previously fabricated hardware.

Figure 10:
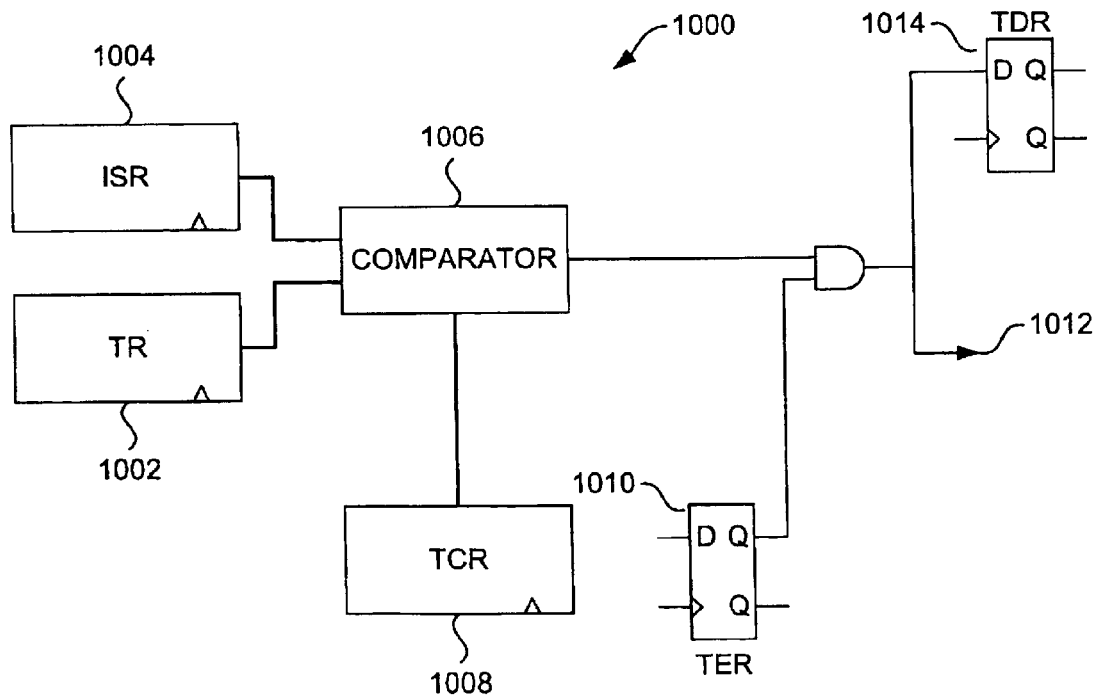
FIG. 10 illustrates a representative generic configurable trigger detection circuit according to one embodiment of the invention.

Design visibility and design patching are controlled by particular trigger actions which are determined by design control circuitry. FIG. 10 illustrates a representative generic configurable trigger detection circuit 1000 according to one embodiment of the invention. The trigger detection circuit 1000 operates to detect trigger conditions and issue trigger events.

The trigger detection circuit 1000 includes a configurable trigger register (TR) 1002 that stores a trigger value that is compared to a monitored signal (ISR) 1004 by a comparator 1006. The mode of the comparator 1006 can be controlled by a configurable trigger comparison register (TCR) 1008. Examples of different comparison modes are test for equivalence, test for smaller-than, etc. The ability to configure the trigger register (TR) 1002 and the trigger comparison register (TCR) 1008 allows the electronic system designer the flexability to check for a wide variety of trigger conditions during HDL-based hardware debugging. A configurable trigger enable register (TER) 1010 allows the trigger condition to be activated or disabled. If the trigger condition implemented by comparing the monitored signal (ISR) 1004 to the trigger register (TR) 1002 is met and the trigger enable register (TER) 1010 is enabled, a trigger condition signal 1012 becomes active to denote a trigger event. A trigger detected register (TDR) 1014 can be used to store such a trigger event, which can be subsequently read during HDL-based hardware debugging to determine whether a trigger event has occurred.

While FIG. 10 illustrates the representative generic configurable trigger detection circuit 1000, for various more specific situations, specialized design control circuitry provides more efficient hardware. Examples of these specific situations, including state based Finite State Machines (FSMs), transition based FSMs, data-path registers, and temporal logic, are described below.

Figure 11:
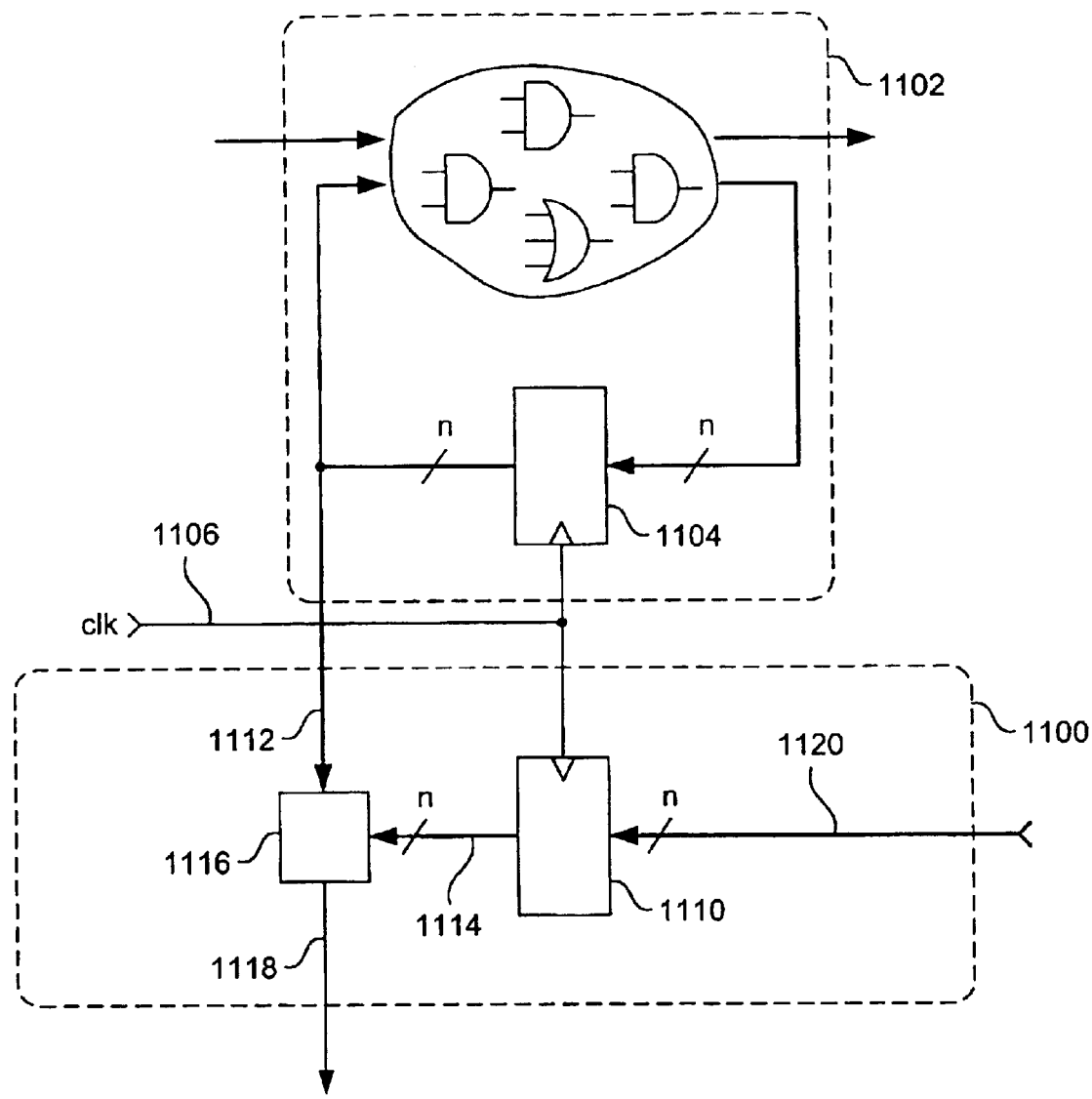
FIG. 11 illustrates a representative state based Finite State Machine design control circuit according to one embodiment of the invention.

State based FSM design control circuitry provides a configurable method to detect whether an FSM is in a particular state—a condition which depends on the value of the FSM's state register. For simplicity, a one-hot encoded state-machine is described herein. For other state encodings, the design control circuitry can be implemented similarly. FIG. 11 illustrates a representative state based FSM design control circuit 100 according to one embodiment of the invention. For each FSM state register that is to be instrumented to detect particular states, the state based FSM design control circuit 1100 is added. A to-be-instrumented one-hot encoded FSM 1102 has a state register 1104 which is n bits wide and which is sensitive to the clock signal 1106. The state based FSM design control circuit 1100 that is added includes a trigger register 100 which has the same bit-width n as the state register 1104 and which is sensitive to the same clock signal 1106. An output 1112 of the state register 1104 is compared to an output 114 of the trigger register 110 using a combinatorial network 1116. The combinatorial network 1116 implements a trigger condition signal 1118. The trigger condition signal 1118 produced by the state based FSM design control circuit 1100 can be a single bit output function and can be described in its behavior by the following Verilog code:

```
module m1116 (n1112, n1114, n1118);
    parameter n = 32;
    input [n-1:0]   n1112;
    input [n-1:0]   n1112;
    output          n1118;
    wire            n1118 = | (n1112 & n1114);
endmodule
```

Thus to detect a particular current state in the one-hot encoded FSM 102, one can set the corresponding bit in the trigger register 110 to logical "1". The trigger register 1110 can be configured with appropriate values through a connection (link) 1120. The trigger condition signal 1118 will then be logically "1" to denote the trigger event.

Transition based FSM design control circuitry provides a configurable method to detect whether a FSM is undergoing a particular state transition—a condition which depends on the value of the state register and also on the activity and values of the input signals of the FSM. For simplicity, a one-hot encoded state-machine is described herein. For other state encodings, the design control circuitry can be implemented similarly.

Figure 12:
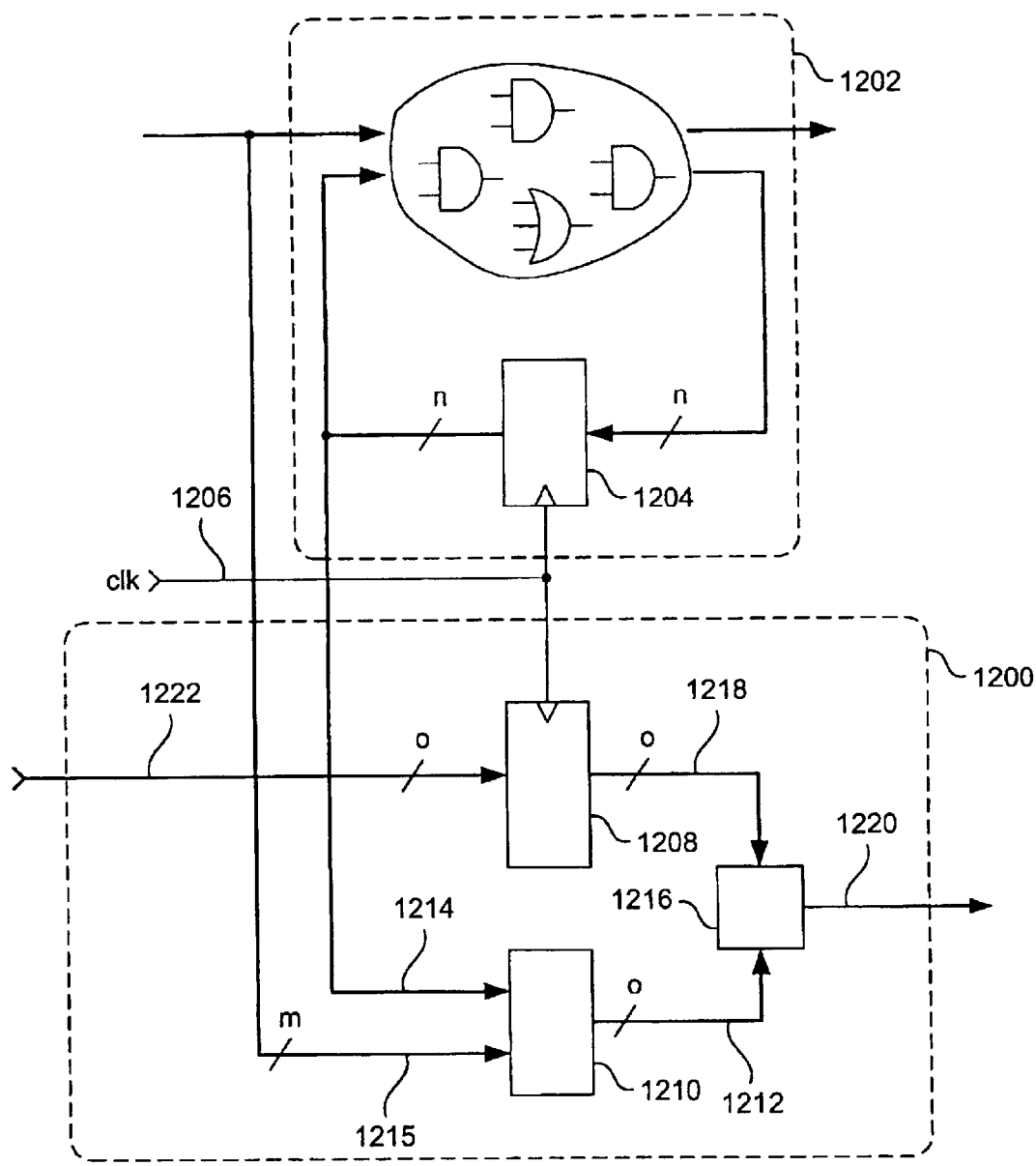
FIG. 12 illustrates a representative transition based Finite State Machine design control circuit according to one embodiment of the invention.

FIG. 12 illustrates a representative transition based FSM design control circuit 1200 according to one embodiment of the invention. For each FSM that is to be instrumented for detecting particular state transitions, the transition based FSM design control circuit 1200 is added. The to-be-instrumented one-hot encoded FSM 1202 has a state register 1204 which is n bits wide and which is sensitive to a clock signal 1206. The transition based FSM design control circuit 1200 that is added includes a trigger register 1208 which is sensitive to the clock signal 1206, and is o bits wide where o is the number of different state transitions of the FSM 1202. A combinatorial network 1210 performs a unique one-hot encoding of each different state transition into output 1212 and thus is connected to the n bit wide output 1214 of the state register 1204 as well as to the m bit wide input 1214 of the FSM 1202. A combinatorial network 1216 is connected to a o bit wide output 1218 of the trigger register 1208 and the o bit wide output 1212 of the combinatorial network 1210. A trigger condition signal 1220 is the single bit output of the combinatorial network 1216 and can be described in its behavior by the following Verilog code:

```
module m1216 (n1218, n1212, n1220);
    parameter o = 32;
    input [o-1:0]   n1218;
    input [o-1:0]   n1212;
    output          n1220;
    wire            n1220 = | (n1218 & n1212);
endmodule
```

Thus to detect a particular state transition in the one-hot encoded FSM 1202, the bit in the trigger register 1208 corresponding to the one-hot code of the particular state transition must be set to logical "1". A o bit wide connection 1222 can be used to configure the trigger register 1208 with appropriate values. The trigger condition signal 1220 becomes a logical "1" whenever a state transition is active, which denotes the trigger event.

Figure 13:
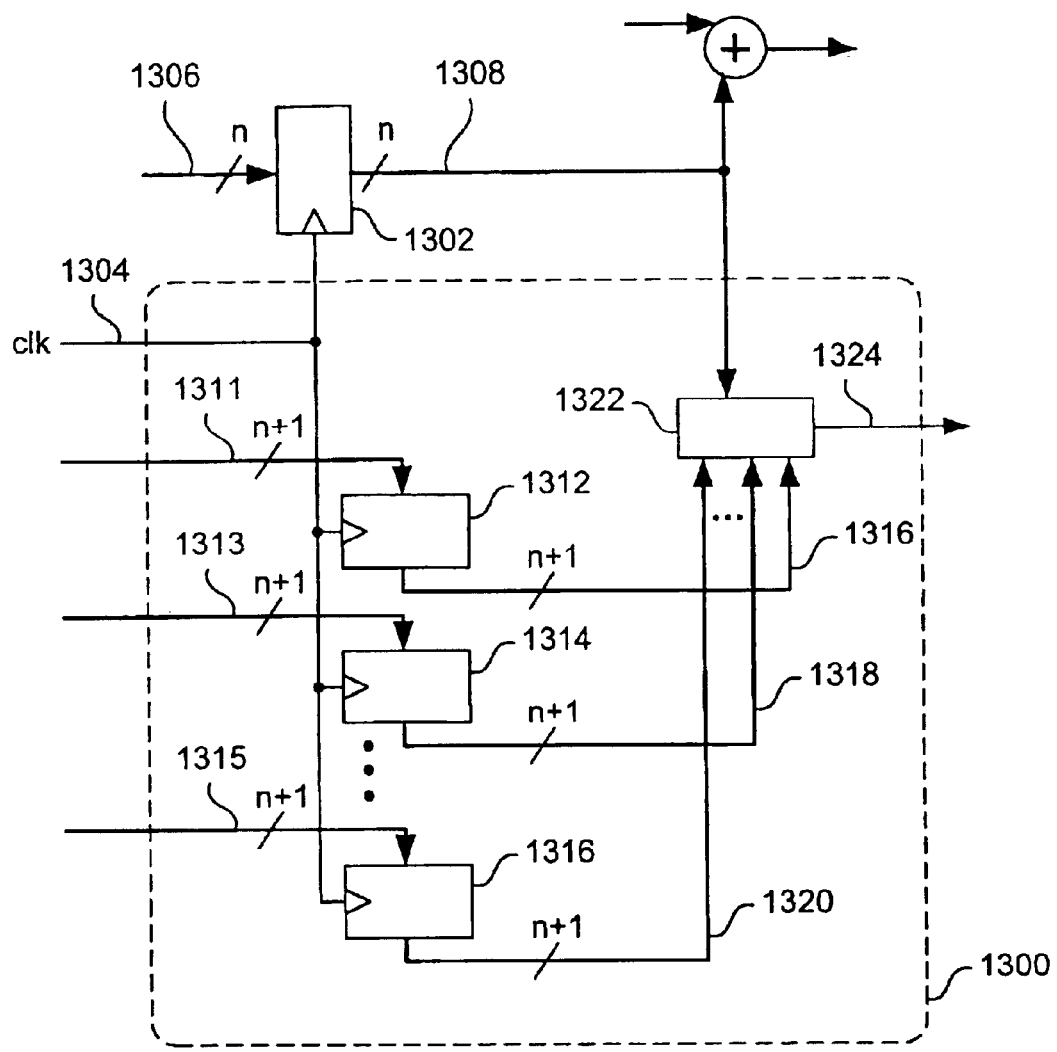
FIG. 13 illustrates a representative data-path register design control circuit according to one embodiment of the invention.

For data-path registers, data-path register design control circuitry provides a configurable method to detect whether a data-path register has a particular current value, whether a data-path register has a particular relationship to other values, or whether a data-path register has just changed its value. FIG. 13 illustrates a representative data-path register design control circuit 1300 according to one embodiment of the invention. The data-path register design control circuit 1300 is coupled to a data-path register 1302 which is sensitive to a clock signal 1304 and which latches the n bit wide input net 1306 into a n bit wide output net 1308. The data-path register design control circuit 1300 includes one or more of n+1 bit wide trigger registers 1310, 1312, 1314 which all are sensitive to the clock signal 1304. The n bit wide output 1308 of the data-path register 1302 and all the n+1 bit wide outputs 1316, 1318, 1320 of the trigger registers 1310, 1312, 1314 are then connected as inputs to a combinatorial network 1322. The combinatorial network 1322 provides configurable pair-wise checking relations between the current value of the data-path register 1302 and the n least significant bits of one of the trigger registers 1310, 1312, 1314. The relation being checked for can be the equality, non-equality, less than, greater than, etc., and such relation can be determined by the user. The most significant bit within each of the n+1 bit wide trigger registers 1310, 1312, 1314 is used for enabling (if the bit is set to "1") or disabling (if the bit is set to "0") the checking of the relation and can be described in its behavior by the following Verilog code:

```
module m1322 (n1308, n1316, n1318, n1320, n1324);
    parameter n = 32;
    input [n-1:0]   n1308;
    input [n:0]     n1316;
    input [n:0]     n1318;
    input [n:0]     n1320;
    output          n1324;
    wire check0 = n1316[n] & compare0(n12190, n1316[n-1:0]);
    wire check1 = n1318[n] & compare1(n12190, n1318[n-1:0]);
    wire check2 = n1320[n] & compare2(n12190, n1320[n-1:0]);
    wire          n1324 = check0 | check1 | check2;
endmodule
```

If one of the relations is satisfied, the trigger condition signal 1324 becomes logical "1" to denote a trigger event.

Figure 14:
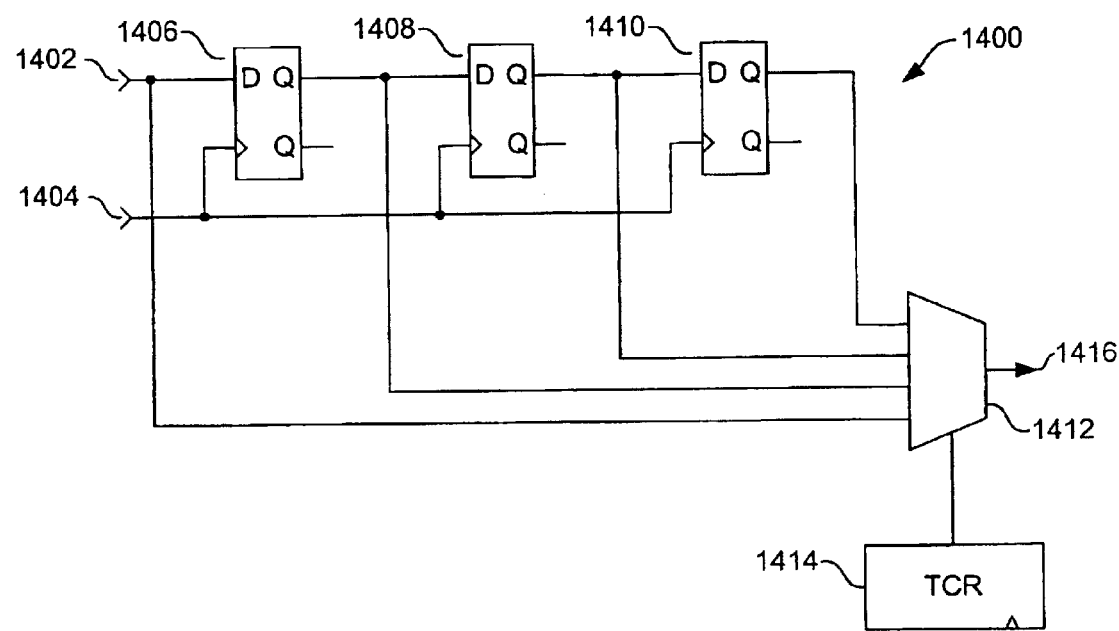
FIG. 14 illustrates a representative part of the design control circuit according to one embodiment of the invention.

Temporal logic is an extension of conventional propositional logic which incorporates special operators that operate with time as a variable. Using temporal logic, one can specify how functions behave as time progresses. In particular, temporal logic statements can make assertions about values and relationships in the past, present, and the future. A subset of temporal logic can be used to describe interdependencies between trigger events over a certain time period relative to a given event, at one or more cycles, or for trigger events of the past. FIG. 14 illustrates a representative design control circuit 1400 according to one embodiment of the invention that can be used to implement temporal logic needed for relationships which include signals or trigger events from previous clock cycles. The trigger condition signal 1402 can be delayed by a configurable number of cycles of clock 1404 using delay registers 1406, 1408 and 1410. A multiplexor 1412, under the control of a trigger control register (TCR) 1414, selects which current or previous value of the signal 1402 is sent to output 1416. The output 1416 can be used as an input to temporal logic equations.

The selection of the signal to drive the clock input 1404 of the delay registers 1406, 1408 and 1410 offers powerful functionality as follows. First, when one of the system clock signals is connected to the clock input 1404 of the delay registers 1406, 1408 and 1410, events can be delayed relative to the system clock. Second, when a particular trigger condition-signal is connected to the clock input 1404 of the delay registers 1406, 1408 and 1410, the signal 1402 is delayed relative to the trigger condition signal.

To implement the capability to control the processing of particular trigger events over relatively longer periods of time, counters can be used. The counters operate by loading a configured value, counting down from the loaded value to zero, and then issuing an event when zero is reached. The selection of the signal to drive the clock input of the counter offers powerful functionality. First, when one of the system clock signals is connected to the clock input of the counter, trigger events can be delayed relative to the system clock. Hence, trigger events can be made to depend on the system time. For example, trigger events might be enabled for a certain time period and become disabled otherwise, or become enabled after some time period. Second, when a particular trigger condition signal is connected to the clock input of the counter registers, the operation of the counter is dependent on the trigger condition signal.

As noted previously, a DIC includes a trigger processing unit (TPU) to process all incoming trigger events and to issue appropriate outgoing trigger actions based on the incoming trigger events. The TPU provides a configurable method for calculating complex trigger combinations and other relationships between one or more of the trigger events to produce the trigger actions. The trigger events for processing by the TPU are the trigger condition signals of the design control circuitry of the DIC as described above or signals from circuitry external to the DIC. For example, in hardware/software codebugging of embedded CPUs, such external signals may be the error signals of the CPUs. In another example, when multiple DICs are coupled (e.g., daisy-chained) to support debugging of multi-chip systems, another such trigger event could be the trigger action generated by the other DIC.

In any case, trigger actions computed by the TPU can be used for (but not limited to) the following uses: (i) determine the beginning and/or the end of the sampling period of one or more sampled signals for design visibility; (ii) initiate the overwrite of one or more patch registers for design patching; (iii) provide a sampling clock in case none of the system clock signals shall be used; (iv) notify the communication controller within the DIC that one or more trigger events have occurred, thereby notifying the HDL-based hardware debugger; (v) communicate trigger events outside the electronic system to attached devices through externally connected signals; (vi) communicate with sub-systems inside the electronic system (e.g., during hardware/software co-debugging of embedded CPUs, trigger actions may be used as notification signals going into interrupt inputs of the CPUs); and (vii) connecting with the trigger event inputs of another DIC (e.g., when multiple DICs are daisy-chained to support debugging of multi-chip systems).

A trigger action can also be used to trigger multiple components. A trigger action group is a unique combination which comprises one or more units of design visibility and/or design patching circuitry which is/are controlled by the same trigger action. The internal structure of the TPU can be (but is not limited to) the following: (i) A simple TPU can be used where each trigger event issues exactly one and only one trigger action. (ii) A TPU can include a configurable combinational network where all the trigger events are inputs to the combinational network and trigger actions are outputs of the combinational network. For example, the configurability can be provided by a Random Access Memory (RAM) which can be configured by the HDL-based hardware debugger and act as look-up tables to implement a wide range of different boolean combinational functions. (iii) A TPU can be a configurable finite state machine where trigger events are inputs to the state machine and trigger actions are outputs of the state machine. In one example, the configurability is provided by a set of registers or a Random Access Memory (RAM) which defines the behavior of the finite state machine and which can be configured by the HDL-based hardware debugger. (iv) A TPU can be a pipelined CPU. The trigger events to be processed can flow into the TPU as input data, the trigger actions to be issued can be represented as output data of the CPU, the instruction code of the CPU can implement complex relationships between the trigger events which produce the trigger actions. The trigger action computations may not be finished until a number of clock cycles after the the trigger events flow into the TPU. Consequently, the design visibility circuitry should have enough memory to store the data which corresponds to the latent trigger actions. Also, the HDL-based hardware debugger should understand the latency of the trigger actions to correctly associate non-latent sampling data to the latent trigger actions.

Although the instrumentation techniques discussed above pertain to digital signals, it should be understood that these same techniques can also apply to the digital portion of mixed-signal designs. Still further, with respect to the analog portion of mixed signal designs, an analog signal can be made visible and also can be used to form trigger conditions. In one embodiment, the analog signal can be made visible by connecting it to an analog-to-digital converter (ADC) which has been added to the DIC. The digital outputs of the analog-to-digital converter can then be monitored using the design visibility techniques previously mentioned. A user interface can convert the digital data back to an analog representation for display to the designer. The analog signal can be used to form a trigger condition by expressing the trigger condition in terms of the digital outputs of the analog-to-digital converter. Additionally, a graphical user interface (e.g., the graphical user interface 704 of FIG. 7A) can convert an analog trigger threshold set by the electronic system designer to an appropriate set of digital values which can be used to configure the trigger condition.

As noted above, the DIC can be provided within the DUT in either a centralized or distributed manner. More particularly, in order to minimize the impact of the DIC on the electronic system hardware, the DIC can be structured as a monolithic block or as distributed circuitry. The option to choose between these two structures allows the trade-off of area, delay, power consumption, routability, and/or testability of the hardware required for the DIC. As a monolithic block, all signals to be monitored for trigger detection or to be sampled and/or patched are physically routed from their source to the DIC region where the trigger condition detection and/or the signal value sampling/patching is physically placed. As a distributed DIC, the circuitry comprising the DIC is placed close to the signals used for triggering, sampling, and/or patching. For a monolithic DIC block, resource sharing to reduce the area and power consumption overhead becomes an option. These gains are offset by the increased delay and area needed for the long routes to the DIC block. A distributed DIC, however, will not offer any resource sharing, but promises short routes and therefore less impact on the delays and the routability.

Moreover, the monolithic or the distributed structure for the trigger detection circuitry can be selected independently from the monolithic or the distributed structure for the signal value sampling, patching, and storing circuitry. A special case of DIC structure is a DIC with monolithic trigger detection circuitry and monolithic signal value sampling and/or patching circuitry. The trigger detection and signal value sampling and/or patching circuitry share the same signals. In such a structure, trigger conditions can only be expressed using signals which are also sampled.

Figure 18:
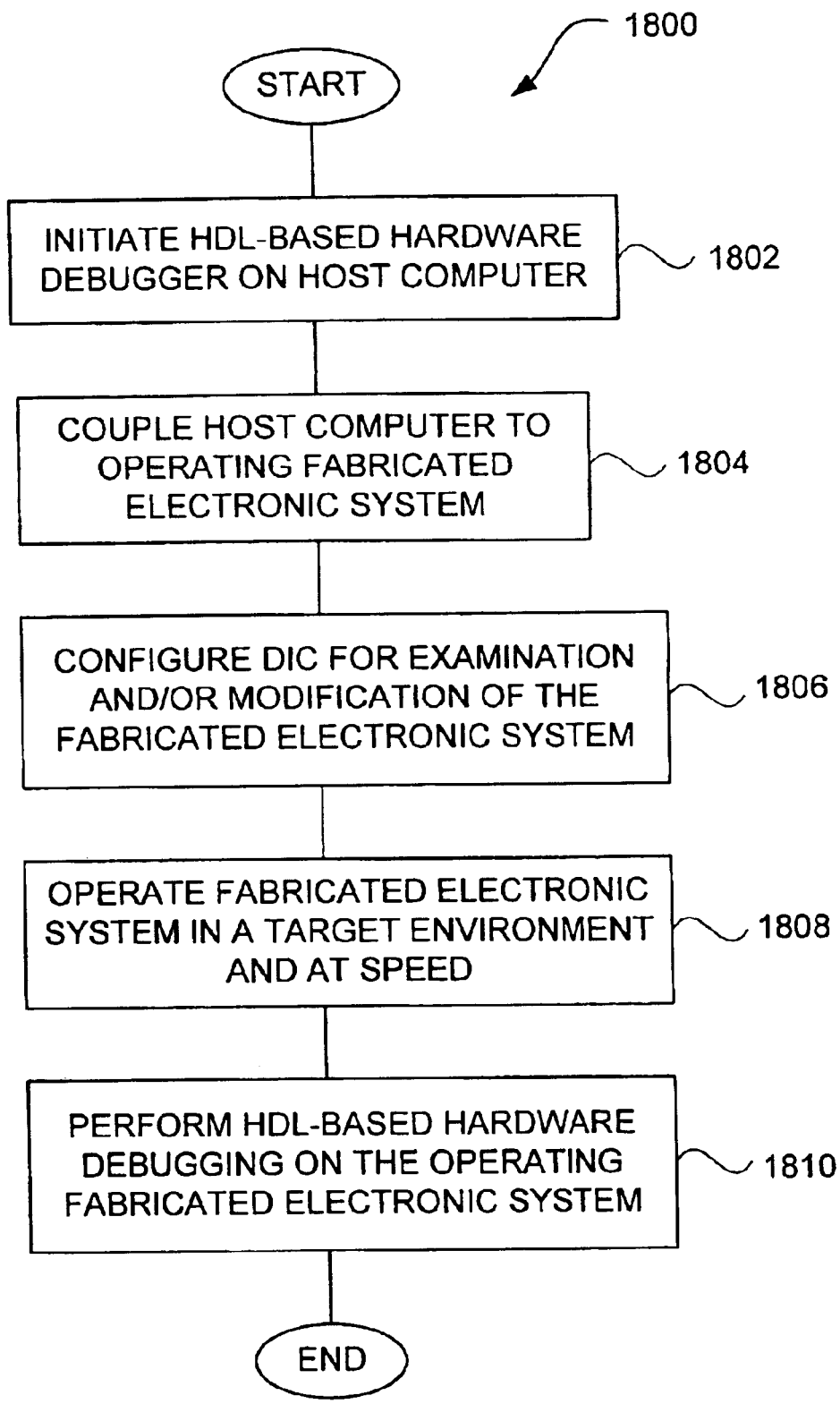
FIG. 18 is a flow diagram of HDL-based hardware debugging processing according to one embodiment of the invention.

FIG. 18 is a flow diagram of HDL-based hardware debugging processing 1800 according to one embodiment of the invention. The hardware debugging processing 1800 is performed after the electronic system has been fabricated to include a customized DIC.

The hardware debugging processing 1800 initially starts when the HDL-based hardware debugger is initiated 1802 on a host computer. The HDL-based hardware debugger is preferably a software program that operates on the host computer. Next, the host computer couples 1804 with the operating fabricated electronic system. For example, this coupling 1804 can occur through cables that couple the host computer to the communication controller 816 of the DIC 800. The DIC 800 can be considered part of the DUT or part of the electronic system. Thereafter, when debugging is to be performed, the DIC is configured 1806 for examination and/or modification of the fabricated electronic system. Here, for example, the configuration registers 814 of the DIC 800 can be configured 1806 to perform the appropriate examination and/or modification of the fabricated electronic system (namely, the DUT therein). Next, the fabricated electronic system is operated 1808 in the target environment and at speed. In other words, the fabricated electronic system is the actual hardware that is produced and then operated in its normal operating environment (target environment) and at its normal speed of operation. Hence, this facilitates debugging of the hardware (e.g., fabricated electronic system) in its actual environment and at its actual speed. Thereafter, HDL-based hardware debugging is performed 1810 on the operating fabricated electronic system. The HDL-based hardware debugging thus interacts with the user to reference lines or areas of the HDL description associated with the electronic system. As a result, users are able to analyze, diagnose, and debug functional failures of the electronic system at the HDL level, and users are able to interact with the electronic system at the HDL level to set trigger conditions and examine and/or modify the electronic systems behavior. Following the operation 1810, the hardware debugging processing 1800 is complete and ends.

Once the electronic system 104 having the DUT 102 with the incorporated DIC 106 has been fabricated, the HDL-based hardware debugger 122 can operate to debug the DUT 102. The HDL-based hardware debugger 122 interacts with a user through one or more user interfaces and interacts with the DIC 106 through a host communication controller. The HDL-based hardware debugger 122 can, for example, operate to support one or more of the following functions: (1) browsing the original HDL description for the HDL design; (2) activating particular trigger conditions out of the set of possible trigger conditions implemented in the DIC; (3) de-activating particular trigger conditions out of the set of activated trigger conditions; (4) temporarily disabling trigger conditions out of the set of previously activated trigger conditions; (5) enabling temporarily disabled trigger conditions; (6) activating signals to be sampled out of the set of possible signals in accordance with the implementation of the DIC; (7) de-activating signals out of the set of signals which were activated for sampling; (8) temporarily disabling signals out of the set of signals activated for sampling; (9) enabling temporarily disabled sampling signals; (10) activating signals to be patched out of the set of possible signals in accordance with the implementation of the DIC; (11) de-activating signals out of the set of to-be-patched signals; (12) temporarily disabling signals out of the set of signals activated for patching; (13) enabling temporarily disabled patching signals; (14) translating HDL-based trigger conditions given by the designer to the proper register configuration of the DIC; (15) associating trigger conditions with the clock/begin/end events of sampling and/or patching circuitry; (16) controlling execution of the DIC at run-time such as starting, stopping, single-stepping, running for a given number of cycles, resetting, etc.; (17) capturing the entire or the partial state of the HDL design, downloading it off the DIC, and storing it in the proper databases; (18) translating the DIC status registers and the sampled signal values back to the HDL source code; (19) displaying the DIC status in one or more formats, including the current data as well as data history; (20) displaying the signal sampling data in one or more formats, including the current data as well as data history; (21) interfacing with other debugging tools, such as functional simulators and software debuggers; (22) performing license checks to determine the legality of running the DIC; and (23) performing version checks of the DIC, and consistency checks of the DIC and the design instrumentation database.

Figures 1, 19:
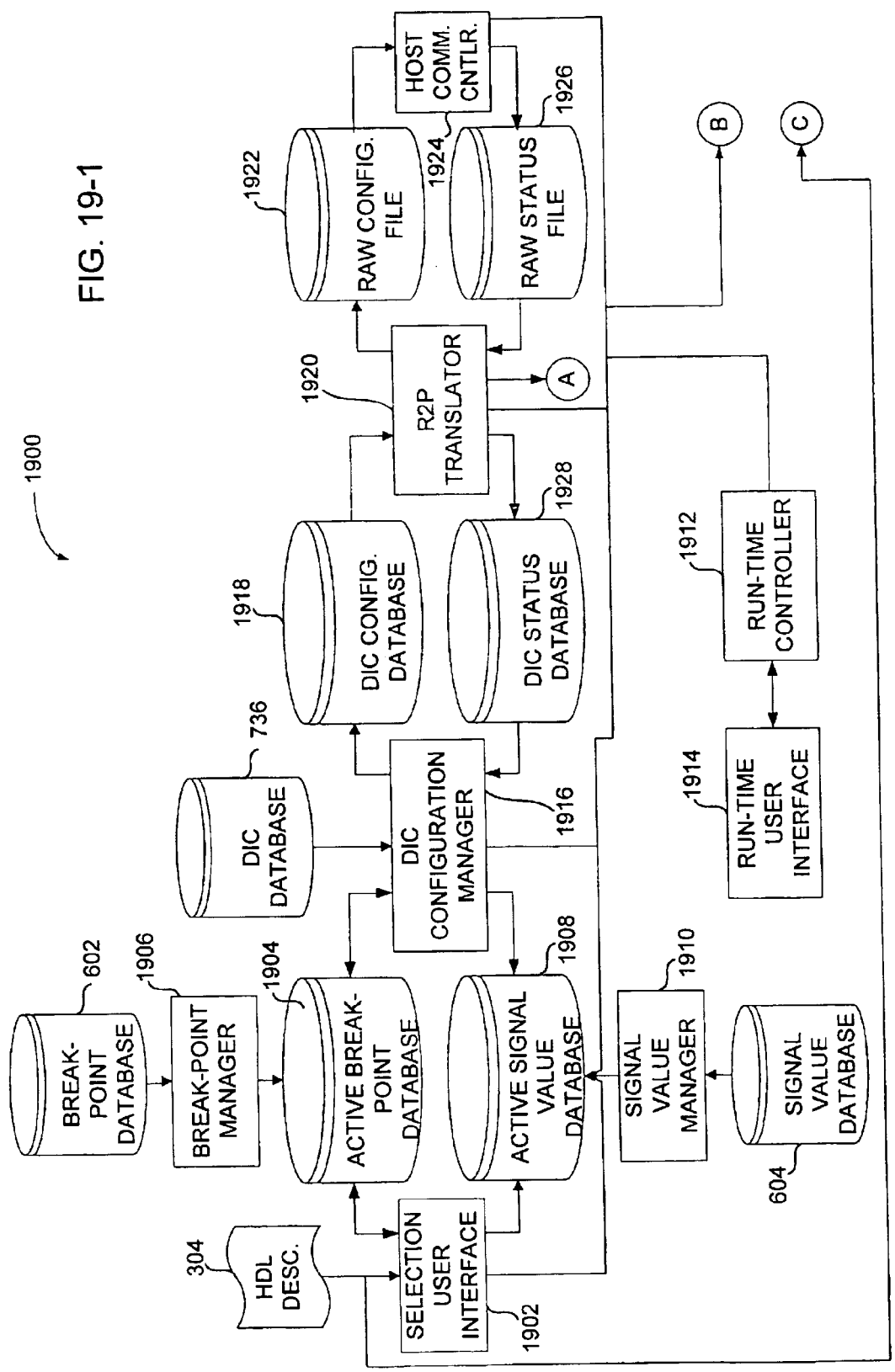
FIG. 19 is a data flow diagram of a debugging process performed by a HDL-based hardware debugger according to one embodiment of the invention.
Figures 2, 19:
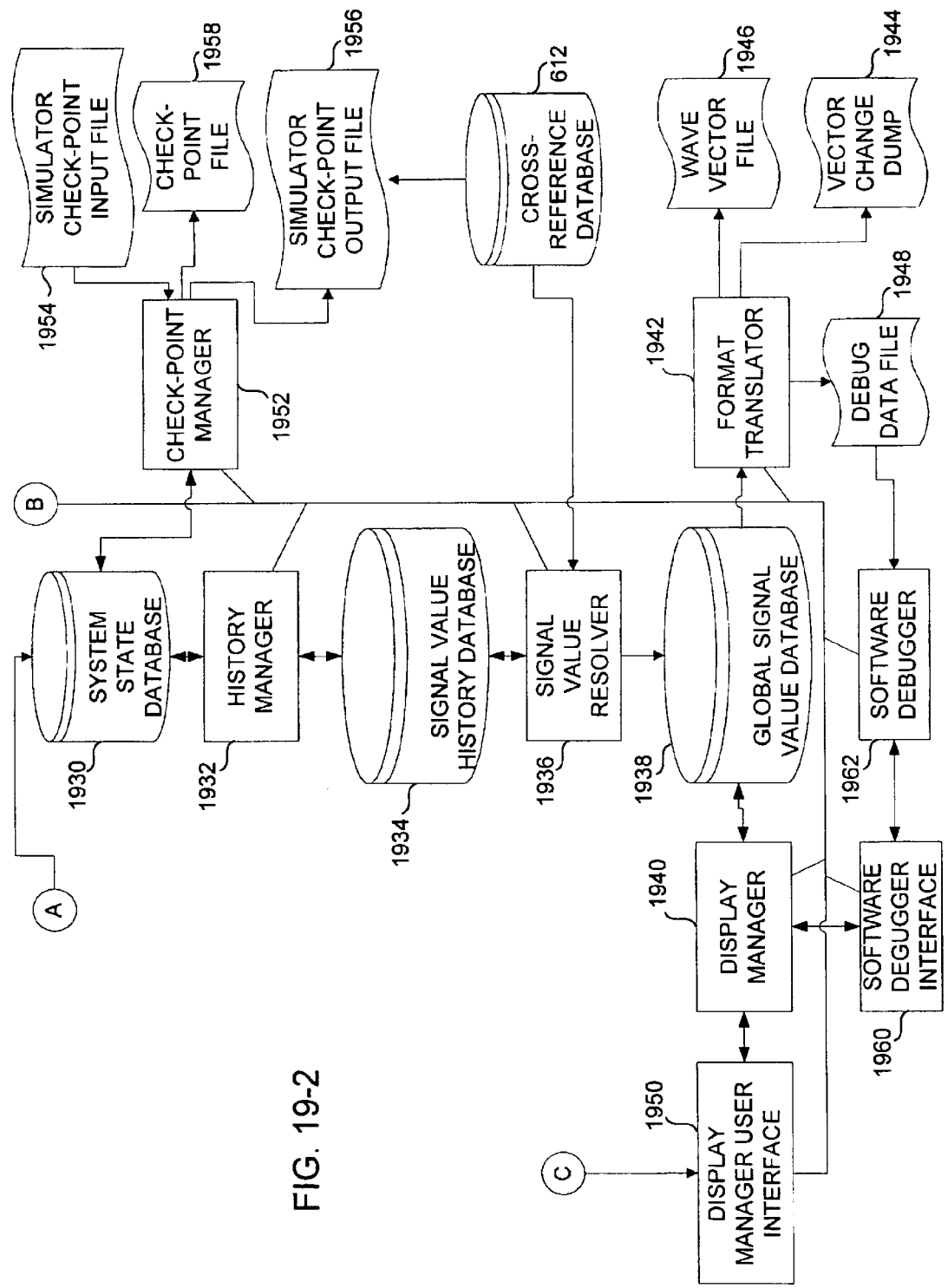

FIG. 19 is a data flow diagram of a debugging process 1900 performed by a HDL-based hardware debugger according to one embodiment of the invention. An activation user interface 1902 displays the original HDL description 304 and provides the designer with a method to activate and de-activate break-points and other trigger conditions and to activate and de-activate signals for sampling and/or patching. Once signals for sampling and/or patching are activated, the activations may be grouped together to form a unique trigger action group. Each trigger action group then gets one or more trigger condition associated therewith that control the trigger action group. These activations are used by the HDL-based hardware debugger to configure the DIC at run-time.

Additional details on trigger condition activations are as follows. The structure of the DIC limits trigger conditions to the set of locations (for break-points) and explicit trigger condition expressions (for watch-points) in the HDL description 304 which were selected or implied during design instrumentation. Additional hardware restrictions of the DIC may also limit the activation of trigger conditions in certain cases. In accordance with the structure of the DIC, an active break-point database 1904 lists the status type of each trigger condition implemented in the DIC as one of: possible (i.e., the corresponding trigger condition can be activated); activated (i.e., designer has activated), and forbidden (i.e., the trigger condition cannot be activated due to a mutual exclusivity relationship with one or more currently activated trigger conditions. Initially, a break-point manager 1906 copies over the set of trigger conditions from the break-point database 602 into the active break-point database 1904 and marks all entries as possible. To guide the designer in his activations, the user interface 1902 reads the active break-point database 1904 and displays the current status for each trigger condition listed. Whenever the designer activates a trigger condition out of the set of possible trigger conditions, the user interface 1902 marks the trigger condition as activated in the active break-point database 1904 and notifies the break-point manager 1906. Likewise, whenever the designer de-activates a trigger condition out of the set of activated trigger conditions, the user interface 1902 marks the trigger condition as de-activated in the active break-point database 1904 and notifies the break-point manager 1906. The break-point manager 1906 applies the rules in the break-point database 602 which describe the interdependencies of all trigger conditions and their mutual exclusivity to the current setting in the active break-point database 1904. Under such rules, any trigger condition which is mutually exclusive with the activated (or de-activated) trigger condition is marked as forbidden (or possible), as appropriate.

Additional details on signal sampling and patching activation are as follows. To utilize the signal sampling and patching circuitry in the DIC, the designer activates signals for sampling and/or patching, groups these activations into one or more trigger action groups, and associates one or more trigger conditions by which each trigger action group is controlled. For patching, the designer also specifies one or more patch values and the trigger condition settings under which each patch value shall be applied. To reflect limitations of the DIC in the sharing of sampling and/or patching resources, a similar activation mechanism for signal values exists as for trigger conditions. An active signal value database 1908 lists the status type of each signal that has been made visible as one of: possible (i.e., the signal can be activated for sampling and/or patching); activated (designer has activated); and forbidden (i.e., the signal cannot be sampled/patched due to a mutual exclusivity relationship with one or more currently sampled/patched signals). Initially, a signal value manager 1910 copies over the set of all signals listed in the signal value database 604 into the active signal value database 1908 and marks them as possible. To guide the designer in making activations, the user interface 1902 reads the active signal value database 1908 and displays the current status for each signal listed. Whenever the designer activates a signal out of the set of possible signals, the user interface 1902 marks the signal as activated in the active signal value database 1908 and notifies the signal value manager 1910. Likewise, whenever the designer de-activates a signal out of the set of possible signals, the user interface 1902 marks the signal as de-activated in the active signal value database 1908 and notifies the signal value manager 1910. The signal value manager 1910 applies the rules in the signal value database 604 which describe the interdependencies of all signals and their mutual exclusivity to the current setting in the active signal value database 1908. Under these rules, any signal which is mutually exclusive with the activated or de-activated signal is marked as forbidden or possible, as appropriate.

After the various activations have been made with respect to run-time configuration of the DIC, the designer notifies a run-time controller 1912 through a run-time user interface 1914 to configure the DIC. Using the rules in the DIC database 736, a DIC configuration manager 1916 translates the information in the active break-point database 1904 and the active signal value database 1908 to the proper values for the DIC's configuration registers and writes a DIC configuration file to a DIC configuration database 1918. A register-to-physical address translator 1920 (R2P translator) then accesses the R2P database 614 (i.e., register-to-physical address translation table) and translates the DIC configuration file to the proper physical memory locations within the DIC and produces a raw configuration file 1922. The raw configuration file 1922 is then uploaded into the DIC by a host communication controller 1924 that communicates with the client communication controller 816 inside the DIC 800. This configures the DIC to detect the proper trigger conditions and to sample/patch the proper signals as specified by the designer. For efficiency, the host communication controller 1924 provides a method of handling incrementally the raw configuration file 1922 and uploads only changed data into the DIC 800. The host communication controller 1924 communicates with the client communication controller 816 by transmitting control signals, uploading data, receiving control signals, and downloading data via one or more connections (communication links). When at least one trigger condition is detected, the trigger processing unit 808 inside the DIC 800 informs the run-time controller 1912 via a communication link connected to the host communication controller 1924.

The HDL-based hardware debugger also performs signal value examination. When the HDL-based hardware debugger has been notified that one or more trigger conditions have been detected, the host communication controller 1924 downloads data from the DIC and stores it in a raw status file 1926. This raw status data is then split by the R2P translator 1920 into data from the DIC status registers and data from the signal value sample memory. The data from the DIC status registers is stored in a DIC status database 1928. The DIC configuration manager 1916 accesses the DIC database 736 and the active break-point database 1904 and determines which of the activated trigger conditions were actually detected. The detected trigger conditions are then marked as triggered in the active break-point database 1904. The activation user interface 1902 thereafter displays the detected trigger conditions as marked. On the other hand, the data (values) of the sampled signals from the signal value sample memory are stored in a system state database 1930. A history manager 1932 picks up values of the sampled signals from the system state database 1930, analyzes the history based on the sample clock periods, and appends them to a signal value history database 1934. The signal value history database 1934 provides a method of storing sampled signals for particular sample times. A signal value resolver 1936 reads the signal value history database 1934, resolves the data back to HDL identifiers by applying the resolution rules of the cross-reference database 612, and writes the data into a global signal value database 1938. Any re-organization and/or transformation of the signal data to support HDL identifiers with complex values (for example multi-bit or symbolically encoded values) can also be performed by the signal value resolver 1936. Signals, whether selected or implied, which have not been directly sampled but which can be derived from sampled values, are calculated by the signal value resolver 1936 and stored in the global signal value database 1938. The global signal value database 1938 comprises the current value and the value history of all the signals, sampled and/or derived. The value history can be used for display to the designer or for further processing. A format translator 1942 accesses the global signal value database 1938 and translates the data into one or more different file formats. For example, the format translator 1942 can produce vector change dump files 1944, wave vector files 1946, or debug data files 1948 suitable for further processing by third party tools such as simulators. The display manager 1940 gets directions from a display user interface 1950 about which values to query for display from the global signal value database 1938. The display user interface 1950 uses the original HDL 304 to provide a method for HDL-based signal examination for the designer.

When software debugging is also to be performed, the debugging process 1900 can include a software debugger interface 1960 and a software debugger 1962. Additional details on software debugging are provided below with respect to FIG. 20.

Still further, the HDL-based hardware debugger can perform check-point processing. The system state of the HDL design including the DIC is represented by the values of the electronic system's registers and inputs. The HDL-based hardware debugger provides a method for saving and restoring the system state to the system state database 1930. Depending on whether all the registers and inputs are sampled, or only some of them, the system state can be saved in full or partially. Sometimes a partial system state is sufficient, sometimes the full system state is necessary. The capability to save and restore the electronic system's state can be used for many applications. As examples, one application can set the electronic system to a known state during HDL-based hardware debugging, and another application can integrate the present invention with functional simulators.

HDL-based hardware debugging using the sampling and trigger detection methods described in the present invention still may not give every detail of every internal signal like an event-driven functional simulator may give. Thus, it may be desirable to combine both approaches and have one system, where the HDL-based hardware debugging techniques are used when there is a need for a high execution speed and/or real-time behavior, and where a functional simulator is used for time periods which are not speed-critical but where a great level of detail is needed. In order to combine both styles, the HDL-based hardware debugger described in FIG. 19 provides a way to exchange information about the system state with a functional simulator. Most functional simulators provide a method for saving the simulation state of a simulation model of the HDL design in a checkpoint file using a variety of different file formats. The file formats can be processed by a checkpoint manager 1952. For uploading the state of the simulation model into the HDL-based hardware debugger, a simulator checkpoint input file 1954 is translated by the checkpoint manager 1952 using the cross-reference database 612 and stored in the system state database 1930. To start the functional simulation from a given state of the HDL design, the checkpoint manager 1952, using the cross-reference database 612, can convert the contents of the system state database 1930 into a simulator checkpoint output file 1956 in a format suitable for a functional simulator. A checkpoint file 1958 can be used for storing and retrieving the system state of the DUT, for example, for subsequent runs of the HDL-based hardware debugger.

Still further, the HDL-based hardware debugger can perform mismatch processing. The mismatches can occur between different runs of the DUT. In some situations it may be useful to find mismatches in the sampling data gained from running the same version of the DUT under different conditions. For example, this could be used for verifying that the functionality of an HDL design has not changed after the HDL design has been modified. In some other situations it may be useful to find mismatches in the sampling data gained from running two different versions of the same DUT under identical conditions. To make it easier for the designer to understand any mismatches found, the HDL-based hardware debugger can relate mismatches back to the original HDL description and display both sets of signal values. The mismatches can also occur between the HDL description and the DUT. In some situations it may be useful to compare the functional behavior of a fabricated electronic system with the functional behavior of the HDL description of the electronic system. A mismatch in the comparison means that some step in the design flow was incorrect. The electronic system need not be fully instrumented since some functional mismatches can be caught with partial instrumentation.

A representative method for performing such a comparison is as follows: First, the HDL design is instrumented. The instrumentation is most useful when the design visibility covers the entire system state. Second, with the instrumentation enabled, run the DUT in an environment and at a speed for which it was targeted. Third, store all sample data gained from the operation of the DUT. Fourth, starting with the earliest clock cycle for which sample data is available, format the sample data so that it will be accepted by a functional simulator. Fifth, use the formatted data to set the initial state of the HDL design in a functional simulation of the HDL design. If the HDL design was partially instrumented, substitute the appropriate "UNKNOWN" simulation value for any un-instrumented inputs or storage elements in the circuit. Sixth, use the functional simulator to calculate the values of the storage elements in the next clock cycle given the initial state set above. Seventh, compare the calculated values of the storage elements with the sample data for the next clock cycle and note any mismatches. If the HDL Design was partially instrumented, any comparisons to an "UNKNOWN" value are NOT a mismatch. Eighth, take the sample data for the inputs and storage elements from the next cycle, format as appropriate, and use such to re-set the initial state of the functional simulator. Ninth, while there is more design visibility data left, return to the sixth operation. The mismatches found in the seventh operation are potential problems and should be investigated by the designer. To make it easier for the designer to understand any mismatches found, the HDL-based hardware debugger can relate the mismatches back to the original HDL description and display both sets of signal values.

In the above representative method, mismatches are found by comparing the sampling data with the values calculated from the HDL description by a functional simulator. Obviously, the full power and generality of a functional simulator is not required here. Any method that can calculate delay-independent functional values from an HDL description can be used to find mismatches. For example, the cross-reference database can contain a representation of the necessary function of the HDL description and can be used to calculate the values directly.

Figure 20:
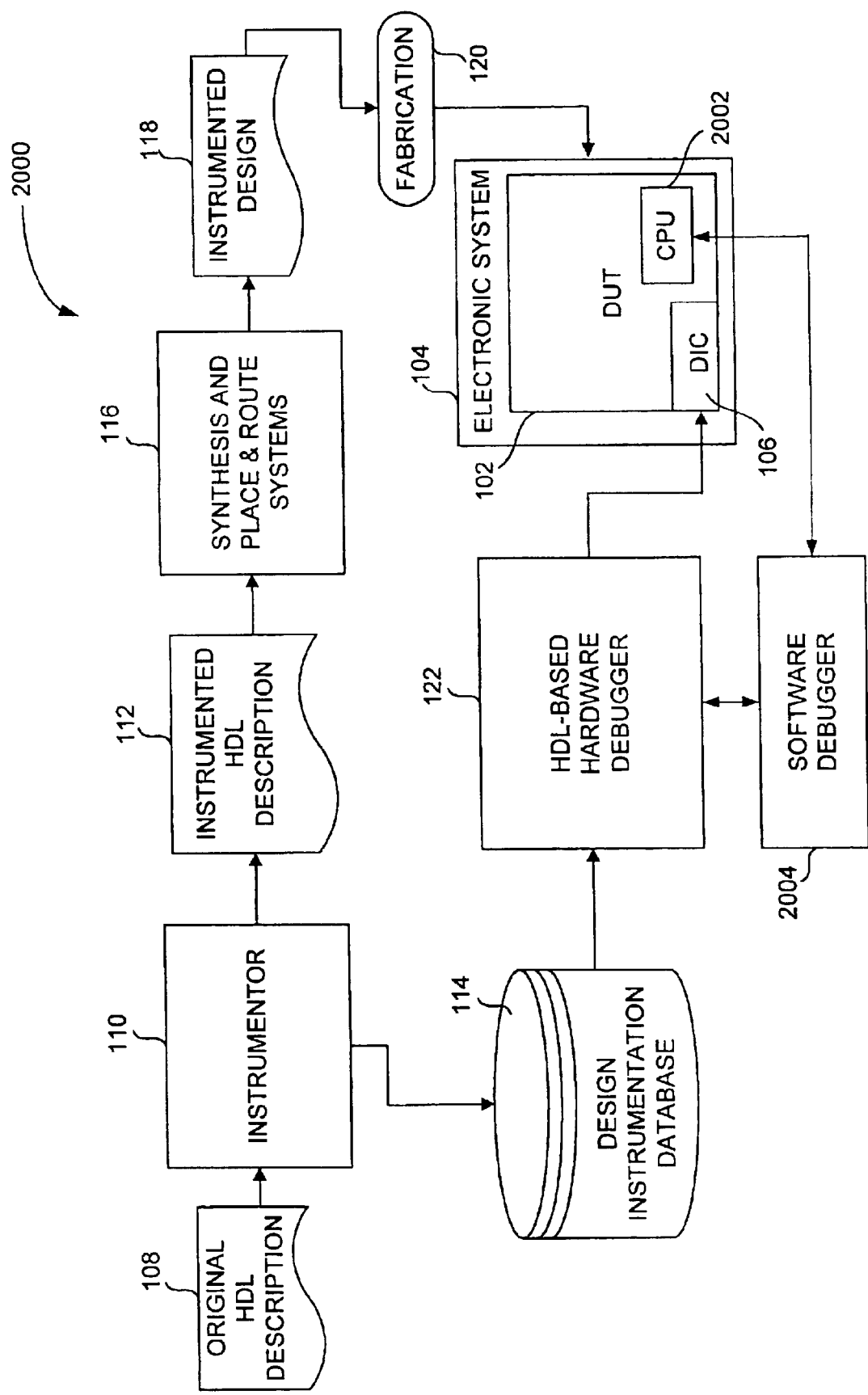
FIG. 20 is a block diagram of a hardware/software co-debugging system according to one embodiment of the invention.

FIG. 20 is a block diagram of a hardware/software co-debugging system 2000 according to one embodiment of the invention. The hardware/software co-debugging system 2000 is generally similar to the hardware debugging system 100 of FIG. 1A or the hardware debugging system 150 of FIG. 1B, but the DUT 102 includes not only the DIC 106 but also a Central Processing Unit (CPU) 2002. The hardware/software co-debugging system 2000 thus permits debugging not only software that runs on the CPU 2002 but also debugging the DUT 102. For debugging the software that runs on the CPU 2002, a software debugger 2004 is used. The software debugger 2004 is a software program that runs on a host computer and controls and observes the execution of the computer software code which runs on the embedded CPU 2002. For example, the software debugger 2004 can be the software debugger 1962 illustrated in FIG. 19. The software debugger 2004 allows program break-points to be set. Those program break-points define the condition upon which the program execution is halted such that the designer can examine the operation of the software program. If the embedded system (CPU 2002) cannot be halted, the software debugger 2004 takes a snapshot of the software program's state for examination instead.

Figure 21:
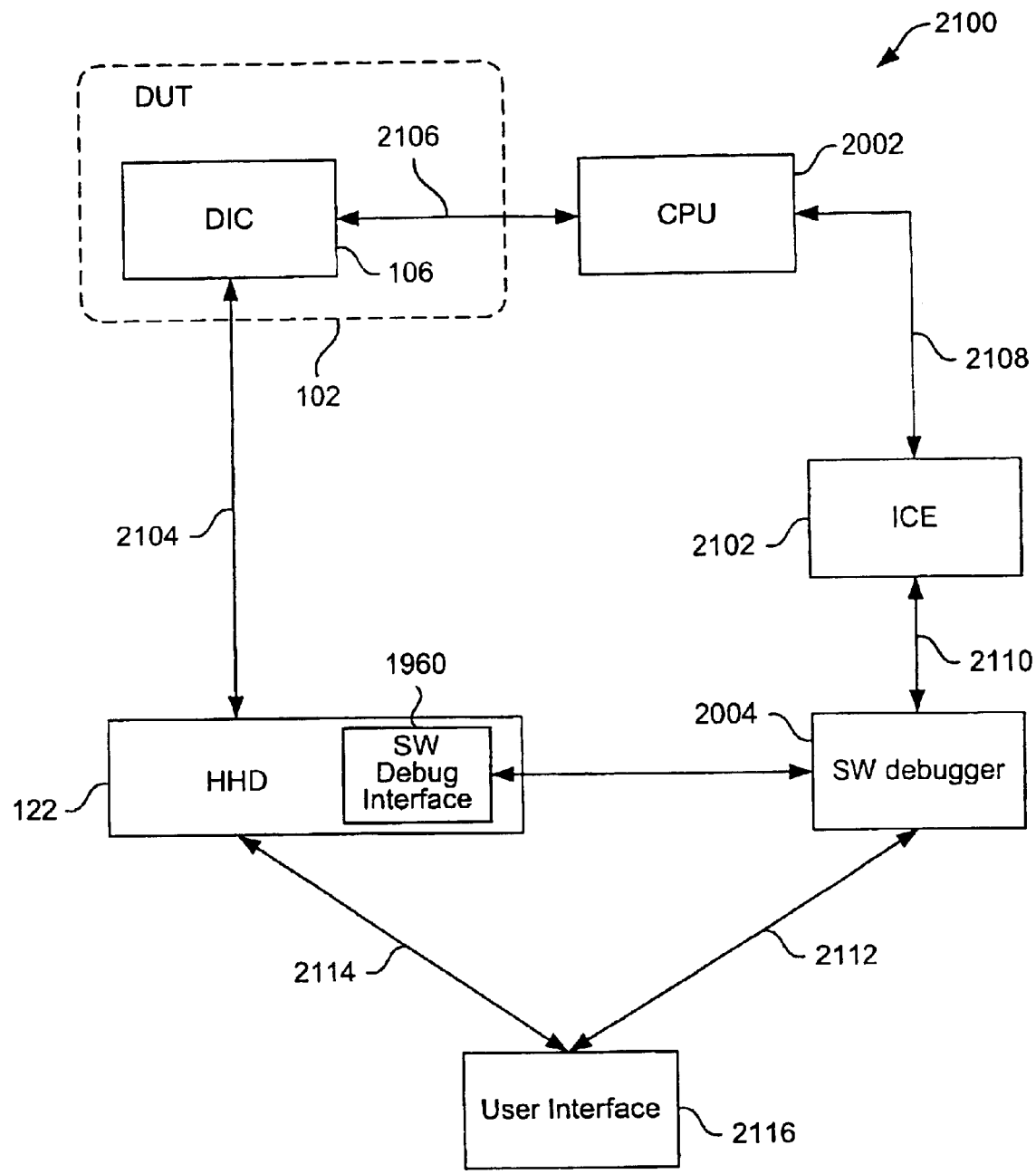
FIG. 21 is a block diagram of a hardware/software co-debugging system according to one embodiment of the invention.

FIG. 21 is a block diagram of a hardware/software co-debugging system 2100 according to one embodiment of the invention. The hardware/software co-debugging system 2100 is generally similar to the hardware/software co-debugging system 2000 of FIG. 20 with the addition of an In-Circuit Emulator (ICE) 2102. The ICE 2102 interfaces the software debugger 2004 with the CPU 2002. The ICE 2102 is, more generally, a debugger interface. An example of such a debugger interface is described in "*The Nexus 5001 Forum Standard for a Global Embedded Processor Debug Interface*," which is available by the IEEE-ISTO in Piscataway, N.J., and which is hereby incorporated by reference. It should also be noted that as shown in FIG. 21 the CPU 2002 may not be part of the DUT 102. In general, the software being debugged can execute on the CPU 2002. The CPU 2002 need not be within the DUT 102. In other words, the CPU 2002 can be part of the electronic system 104 or can even be external to the electronic system 104 if coupled thereto.

Concurrent debugging of the HDL design and the CPU software deals with the following two cases: (i) a trigger condition set in the HDL-based hardware debugger and detected at run-time in the DIC; and (ii) a program break-point is set in the software debugger 2004 and detected in the CPU 2002 and/or the ICE 2102.

The setting and detecting of at least one trigger condition in the DIC and examining the operation of the HDL design and/or the software program can be done in the following operations. First, a trigger condition is set in the HDL-based hardware debugger (HHD) 122. Second, the HHD 122 configures the DIC 106 via a communication link 2104. Third, if the trigger condition is met, one or more trigger actions are issued in the DIC 106. One trigger action in the DIC 106 notifies the HHD 122 via the communication link 2104. One trigger action in the DIC 106 notifies the CPU 2002 via a communication link 2106. On the CPU side, the communication link 2106 may be connected to an interrupt input. Fourth, the HHD 122 then downloads the DIC status and the sample values for processing and display. Fifth, the CPU 2002 then notifies the ICE 2102 via a communication link 2108. Sixth, the ICE 2102 then notifies the software debugger 2004 via the communication link 2110 that a trigger condition was detected. Alternatively, the HHD 122 can directly notify the software debugger 2004 via the software debugger interface 1960. Seventh, the software debugger 2004 then takes a snapshot of the current status of the software program and/or halts the program's execution. Eighth, the status and the history of the operation of the HDL design and the software program can then be examined in the user interface 2116.

The setting and detecting of at least one trigger condition in the software debugger 2004 and examining the operation of the HDL design and/or the software program can be done in the following operations. First, a program break-point is set in the software debugger 2004. Second, the software debugger 2004 sets up the ICE 2102 via the communication link 2110. The ICE 2102 monitors some internal portions of the CPU 2002 (for example the instruction pointer counter) to determine whether the program break-point is reached. Third, if the program break-point is reached, the following actions are issued: (i) one action issued by the ICE 2102 notifies the software debugger 2004 via the communication link 2110; and (ii) another action issued by the CPU 2002 notifies the DIC 106 via the communication link 2106. On the DIC's side the communication link 2106 can be connected to an external trigger event input. Fourth, the software debugger 2004 then takes a snapshot of the current status of the software program and/or halts the program's execution. Fifth, the DIC 106 then processes the trigger event(s) and informs the HHD 122 via the communication link 2104. Sixth, the HHD 122 then downloads the DIC status and the sample values for processing and display. Seventh, the status and the history of the operation of the HDL design and the software program can then be examined in the user interface 2116. Depending on the debugging tools utilized, the user interface 2116 can be either integrated into the HHD 122 and/or into the software debugger 2004.

The hardware debugging system according to the invention can have numerous features. The hardware debugging system can, for example, be the hardware debugging system 100 illustrated in FIG. 1A or the hardware debugging system 150 illustrated in FIG. 1B. Exemplary features of the hardware debugging system might include one or more of those features examined below.

One exemplary feature pertains to HDL-based hardware debugging. While debugging an electronic system, the values of numerous signals may be examined. Relating these values of numerous signals back to the HDL description of the electronic system allows a user (e.g., designer) to gain an understanding of the operation of the electronic system. This enables the debugging to be performed at the same level of abstraction and using the same text description that the designer of the electronic system used to design and implement the electronic system. During the design phase of an electronic system, there are many transformations made to the HDL description to produce the fabricated electronic system. While such transformations conventionally often make it very difficult to difficult to relate a signal in the fabricated electronic system to the HDL description, the invention is able to relate the signals automatically and thus provides an efficient and effective approach to debugging the electronic system.

Another exemplary feature pertains to the ability to debug in a target environment at target speed. Performing HDL-based hardware debugging, while the electronic system is running in an environment and at a speed for which the HDL design is targeted, provides the following benefits: high processing bandwidth, real-time debugging, and no need for testbenches. During debugging, all operations may take the same time as in normal (non-debugging) operation which provides high processing bandwidth. For example, booting an operating system is a task which requires many clock cycles and is usually too time consuming to be done in functional simulation. In HDL-based hardware debugging, booting may take the same amount of time which it takes in normal (non-debugging) operation of the electronic system. Consequently, the designer can re-run the booting as often as necessary to fully debug the electronic system. Real-time debugging is useful for debugging electronic systems which have to maintain a specified real-time behavior in the sense that certain operations must be performed within a very well-defined time limit. Further, since a failure within the electronic system can be observed, analyzed and diagnosed within the target environment, there is no need to reproduce the failure in a model of the target environment, such as a testbench, for functional simulation or emulation.

Another exemplary feature pertains to the ability to communicate with hardware not instrumented. In some cases it may be important for a DIC to communicate with other hardware that was not, or could not be, instrumented. Such communication can be done via dedicated ports of the DIC which can be connected to other devices in the electronic system, or to portions within the same device the DIC resides in. These ports can be uni-directional or bi-directional. One example use of such ports is to communicate one or more trigger actions to another part of the electronic system. Another example is to connect an interrupt signal from another device to the DIC. The interrupt signal can then be used as a trigger event inside the DIC.

Still another exemplary feature pertains to the ability of the HDL-based hardware debugger to communicate with other systems. The HDL-based hardware debugger is a software system which can communicate with other software or hardware systems. The communications can allow transfer of information into, or out of, the HDL-based hardware debugger. For example, an electronic system may be able to execute a software program and in such case the HDL-based hardware debugger can communicate with a software tool which can debug the software program. The HDL-based hardware debugger may also communicate with hardware devices. For example, the HDL-based hardware debugger may send reset signals to hardware devices which connect to the DUT being debugged. In one embodiment, the connection to other hardware devices is used to form a JTAG daisy-chain.

Yet another exemplary feature pertains to the ability to provide hardware and/or software debugging. Some electronic systems have the capability to execute a software program. Software tools exist to debug the programmable hardware. It is advantageous for the designer of the electronic system to have the capability to debug both the hardware and software aspects of the electronic system concurrently. The HDL-based hardware debugger can enable such a capability by debugging the hardware of the electronic system and interfacing with software debugging tools. Interfacing with the software debugging tools can be done by using communication methods previously described. The combined hardware and software debugging system allows the designer to concurrently debug an entire electronic system including both hardware and software aspects.

The HDL-based hardware debugging can be used in many different applications. Different embodiments or implementations of the invention may be used in one or more of the following applications. Several example applications for the HDL-based hardware debugging are examined below.

One exemplary application for the HDL-based hardware debugging is property checking at target speed. Functional simulation alone cannot guarantee that a HDL design meets a functional specification for the HDL design. Consequently, additional methods of gaining confidence in the correctness of the functionality of a HDL design are necessary. A designer can increase the level of confidence in the function of the HDL design by adding DIC which can detect when the HDL design is operating contrary to its functional specification. The DIC can provide property checks to assist the designer with identifying various conditions. The designer might also build in property checks to handle anticipated difficulties. Typically, during HDL-based hardware debugging, the property checks are activated and the electronic system is allowed to run in an environment and at a speed for which it is targeted. If the electronic system operates in a manner that causes a property check to issue a trigger event, the designer has found a potential problem.

Software tools exist that formally prove that certain property checks will never be triggered under any operating conditions of the design. Unfortunately, such tools may have tremendously long run-times since they must exhaustively analyze the design. The HDL-based hardware debugging approach does not have the problem of long run-times since all property checking is done in hardware that is running at target speed.

Another exemplary application for the HDL-based hardware debugging is HDL-based hardware debugging of errors in functional specifications. Some of the hardest functional failures to diagnose are misunderstandings of the target environment the electronic system is designed to work in. Such misunderstandings may lead to mistakes in the functional specification of the electronic system. Hence, comparing the implementation of the electronic system with its specification will not reveal such functional failure. However, the functional failure will become apparent when the electronic system is run in its target environment. While conventional methods for debugging, such as logic analyzers, can connect to accessible pins to monitor the operation of the electronic system within its target environment, these conventional methods do so only at a very low level of abstraction. In contrast, the HDL-based hardware debugging system according to the invention supports analysis, diagnosis and debugging of functional failures due to mistakes in the functional specification. First, there is no need to reproduce the problem in a testbench because the hardware itself is tested in its target environment. The ability to observe the HDL design while it is running in its target environment at the targeted speed allows the designer to immediately gather information about the electronic system as well as the environment the system is running in. Second, the information gathered is related back to the HDL description, which is the highest level of abstraction.

Another exemplary application for the HDL-based hardware debugging is HDL-based hardware debugging of design errors. Design errors stem from mismatches in the behavior of the HDL description written by the designer and the functional specification. Conventionally, such problems are normally debugged by reproducing the observed error in a testbench for a functional simulator. Though functional simulation gives information at a very detailed level, creating and enhancing a testbench to reproduce a functional failure is often a very tedious and difficult task. In contrast, with HDL-based hardware debugging provided by the invention, there is no need to reproduce the problem in a simulation model. By running the electronic system in the environment where the design error becomes apparent, sampling the desired portions of the system state, and analyzing the observed behavior which is related back to HDL identifiers, a functional failure can quickly be diagnosed. Having gained an understanding of the operation of the system, the designer then can use patching to apply a fix. Then, by re-running the patched HDL design in the target environment, the designer can check whether the problem is fixed. In addition, the HDL-based hardware debugger can write out the sampled information in a format suitable for a functional simulator tool (check-pointing) so that the designer can use their preferred analysis tools. The above-described check-pointing mechanism to forward the sampled information to functional simulation can additionally be used.

Another exemplary application for the HDL-based hardware debugging is HDL-based hardware debugging of tool errors. Tool errors are functional failures which happen when, for example, a synthesis tool involved in HDL design process does not transform the HDL description into a correct fabricated design. Such errors manifest themselves as mismatches between the functional specification and the functionality of the fabricated design, therefore debug techniques which work on the HDL description cannot be used to debug such errors. However, since HDL-based hardware debugging works on the instrumented design which was produced by the erroneous tool, the symptoms are able to be displayed to the designer for diagnosis.

Another exemplary application for the HDL-based hardware debugging is HDL-based hardware timing error analysis. Examples of timing errors in an HDL design are race conditions as well as setup and hold time violations in the hardware implementation. One symptom of a timing error is that some registers do not store the correct, expected values. This symptom is easily detected using the method of checking for mismatches between the functional simulation result and the values sampled by the DIC. When the designer examines the values of the circuitry that drive the erroneous register, the cause for the symptom can be quickly diagnosed. The impact of signal noise on the behavior of the electronic system can also be similarly analyzed and diagnosed.

Another exemplary application for the HDL-based hardware debugging is HDL-based hardware fault analysis. Faults stem from manufacturing defects. When faults show up occasionally in a non-reproducible manner for one particular device or for only certain devices out of a batch of other devices, diagnosis becomes very difficult. The HDL-based hardware debugging can be used to diagnose faults, and relate them back to HDL identifiers to provide leads for the fault analysis. Detection of faults is identical to the detection of timing errors and is done by checking for mismatches between functional simulation results and values sampled by the DIC. The ability to relate sample values to the HDL description is a significant advantage since the designer can quickly identify the problem. Once the problem is located in the HDL description, the designer can trace the problem all the way to the layout level to determine the physical location of the defect or defects that caused the fault. The designer can then perform very precise design rule checks. The ability to limit the area for the design rule checks to the neighborhood of the defect location greatly reduces the effort. If the fault is caused by a design rule violation, it thus can be quickly found and fixed. Knowing the context of the fault may also help to improve the manufacturing test program and/or improve the manufacturing yield.

Another exemplary application for the HDL-based hardware debugging is HDL-based critical-path analysis of hardware. To analyze the timing and identify critical paths in the HDL design, the following is one method that can be used. Initially, the HDL design is run at the target speed in the target environment and using some predetermined trigger conditions, some predetermined signals are sampled and the value history is stored. Then, iteratively, the frequency of one or more clock signals is step-wise increased, the HDL design is run at the increased clock speed/speeds while the HDL-based hardware debugger samples the very same signals under the very same trigger conditions as performed in the initial operation. For each iteration, the HDL-based hardware debugger checks for a mismatch between the current sampling values and the initial sampling values. If a mismatch is detected, the HDL-based hardware debugger informs the designer about the mismatch and the designer can then analyze the portion of the HDL design in which the mismatch occurred. The portion of the HDL design in which the mismatch occurred is likely to be a part of the critical path of the electronic system.

Another exemplary application for the HDL-based hardware debugging is analysis, diagnosis and debugging of environmental errors. Environmental factors such as temperature, pressure, radiation, electromagnetic fields, and aging effects may cause transient or permanent failures of the electronic system. Sometimes an electronic system works reliably in the field for years until aging and/or environmental factors cause functional failures. If parts of the electronic system have been instrumented, the invention can be used to diagnose the problem quickly by looking for mismatches between the function of the electronic system and sampled data taken from the fabricated design. If the electronic system has been instrumented with design patching, the electronic system might be patched to restore the proper behavior.

Another exemplary application for the HDL-based hardware debugging is HDL-based hardware power analysis. Power analysis of the electronic system needs to know about the realistic stimuli and transitions in the electronic system to come up with an accurate estimation of the power consumption. In a hardware power analysis application according to the invention, the system state of the HDL design running in the target environment at target speed is sampled and stored by the HDL-based hardware debugger and transformed into the proper format for describing such stimuli and transitions which can be processed by tools which are specialized for power calculations.

Another exemplary application for the HDL-based hardware debugging is HDL-based hardware regression testing. For regression testing of changes to the hardware design, the invention can be used as follows. An initial version of the instrumented HDL design, which itself has been tested and found correct, is run with some predetermined trigger conditions and some predetermined signals to be sampled. The sample values and their history are stored as a "golden" reference file. Each HDL design which includes a design change is then run again using the same trigger conditions and sampling the same signals at the same events. The HDL-based hardware debugger then checks for mismatches between the reference file and the current sampling data and issues warnings if mismatches are detected. Accordingly, the design change that introduced the mismatched behavior can be quickly isolated and fixed.

Another exemplary application for the HDL-based hardware debugging is HDL-based testbench optimization. The reference file of the hardware regression testing application can be used as stimuli to create a new testbench for functional simulation, or optimize an existing testbench to more closely mimic the behavior of the target environment.

Another exemplary application for the HDL-based hardware debugging is HDL-based hardware device driver debugging. The debugging of a particular device driver which interacts with the HDL design is similar to hardware/software co-debugging. The designer is thus able to see the effects of the device driver on the HDL design it interacts with immediately. In numerous applications of the invention, an electronic system shall be debugged after it has initially executed certain setup operations. Having the electronic system execute the operations for setup can be slow, tedious, and cumbersome. For example, an operating system may be booted and many other device drivers may be loaded before a particular device driver and the hardware used by it can be debugged. Now, if the designer has to iterate over the initialization many times, it is advantageous that the system state right after the initialization be saved and restored before each iteration (e.g., system state database 1930 of FIG. 19). The restoring will operate to bring the HDL design into exactly the same post-initialization state.

Another exemplary application for the HDL-based hardware debugging is HDL-based software quality analysis in target hardware. The invention can also be used in regression testing and software quality assurance of the software that runs on the HDL design. If one or more software regression tests fail, the HDL-based hardware debugger can be used to quickly diagnose the failure.

Another exemplary application for the HDL-based hardware debugging is HDL-based embedded systems debugging. Software that runs on an embedded CPU within the HDL design is able to be debugged by a software debugger. The software debugger can communicate with a HDL-based hardware debugger that debugs the hardware of the HDL design.

Still another exemplary application for the HDL-based hardware debugging is in-field support. A common use of the HDL-based hardware debugging system is to instrument an electronic system and then use the HHD 122 to debug the system. After debugging and fabrication, copies of the fabricated electronic system can be distributed to the designer's customers. At this point, the DIC 106 can be used in an in-field mode. In the in-field mode, the DIC 106 is used to diagnose failures that occur while the electronic system is being used by customers. The DIC 106 still resides in the fabricated electronic system but the DIC's normal state is disabled. It will be enabled if there is a problem with the electronic system. In addition, a specially trained service personnel can be sent to the customer's site. The personnel can attach the instrumented electronic system to a portable host computer which runs the HHD 122, activate the DIC 106, and debug the HDL design in the customer's environment. If the instrumented electronic system has been designed with a telecommunications link between the DIC 106 and the HHD 122, remote debugging may avoid the need for service personnel to be sent to the customer's site.

Yet another exemplary application for the HDL-based hardware debugging is hardware performance monitoring. Often it is important for a hardware system designer to monitor the performance of a hardware system in order to understand and optimize the system. This can be done by a software simulation of the system. Unfortunately, this has the drawback that it requires a model of both the electronic system and of the environment it operates in. By adding performance monitoring circuitry to the DIC 106 of the electronic system, the designer can monitor the performance of the fabricated electronic system operating in its target environment and at its target speed. The process of adding the monitoring circuitry begins with the instrumentor. The instrumentor displays the HDL description and enables the designer to add performance monitoring circuitry which relates to the HDL description. During debugging, the data from the performance monitoring circuitry is loaded from the DIC 106 to the HHD 122 after a specified number of clock cycles or in response to some trigger event. The HHD 122 then displays the data for the designer in the proper format. The circuit performance that can be monitored by this added circuitry is quite broad; for example, a circuit performance parameter in which there are events that can be counted—the number of times a First-In-First-Out (FIFO) queue overflows, a number of cache misses, etc. Further, average values, such as average stack depth, can also be monitored by using more complex circuitry.

Portions of the invention are preferably implemented in software. Such portions of the invention can also be embodied as computer readable code on a computer readable medium. The computer readable medium is any data storage device that can store data which can be thereafter be read by a computer system. Examples of the computer readable medium include read-only memory, random-access memory, CD-ROMs, magnetic tape, optical data storage devices, carrier waves. The computer readable medium can also be distributed over a network coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method for debugging a fabricated electronic system having instrumentation circuitry included therein, wherein the electronic system is described with an HDL description, said method comprising:

as part of the electronic system's design process: generating the instrumentation circuitry at least by activating certain design visibility, design patching or design control aspects of the instrumentation circuit;

determining configuration information of said instrumentation circuitry based on the certain activated design visibility, design patching or design control aspects;

after the electronic system has been fabricated with the instrumentation circuitry to form an integrated circuit product, configuring the instrumentation circuitry in accordance with the configuration information;

receiving debug data from the configured instrumentation circuitry operating within the integrated circuit product;

translating the debug data into HDL-related debug information; and relating the HDL-related debug information to the HDL description.

2. A method as recited in claim 1, wherein the HDL description is a high-level HDL description.

3. A method as recited in claim 2, wherein the HDL-related debug information is described in a high-level HDL.

4. A method as recited in claim 1, wherein said translating is performed automatically.

5. A method as recited in claim 1, wherein said method operates without any requirement for a test bench.

6. A method as recited in claim 1, wherein the debug data includes at least status information or sampling data.

7. A method as recited in claim 1, wherein said activating is performed using a graphical user interface.

8. A method as recited in claim 1, wherein said method further comprises:
displaying the high-level HDL description with the HDL-related debug information related thereto.

9. A method as recited in claim 1, wherein the design control aspects include trigger conditions, and wherein said activating operates to enable a user to set one or more trigger conditions from the trigger conditions available by way of the instrumentation circuitry.

10. A method as recited in claim 1, wherein the electronic system comprises an integrated circuit.

11. A method as recited in claim 1, wherein the electronic system comprises a programmable integrated circuit.

12. A method as recited in claim 1, wherein the electronic system includes a hardware portion and a software portion, and
wherein said method further comprises:
interacting with a software debugger which debugs the software of the electronic system.

13. A method as recited in claim 1, wherein said method further comprises:
interacting with a functional simulator which simulates a portion of the electronic system.

14. A method as recited in claim 1, wherein the electronic system is operated in its target environment and running at its target speed during said debugging.

15. A method as recited in claim 14, wherein the target environment includes real-time characteristics.

16. A method as recited in claim 1, wherein while debugging the electronic system, the electronic system is operating in its target environment without interruption for the purpose of debugging.

17. A method as recited in claim 1, wherein said debugging operates to identify at least one fault of the electronic system.

18. A method as recited in claim 17, wherein the at least one fault is selected from the group consisting of: specification error, design error, tool error, device driver error, timing error, manufacturing fault, and environment error.

19. A method as recited in claim 1, wherein the instrumentation circuitry comprises design instrumentation circuitry.

20. A method for debugging a fabricated integrated circuit product having instrumentation circuitry included therein, the integrated circuit product being designed with a high-level HDL description, said method comprising:
as part of the integrated circuit product's design process: generating the instrumentation circuitry at least by activating certain aspects of the instrumentation circuitry for examining and/or modifying the integrated circuit product;
determining configuration information of said instrumentation circuitry based on the certain activated aspects;
after the integrated circuit product has been fabricated:
configuring the instrumentation circuitry in accordance with the configuration information;
receiving debug data from the configured instrumentation circuitry operating within the integrated circuit product;
translating the debug data into HDL-related debug information;
relating the HDL-related debug information to the high-level HDL description and thereafter retrieving circuit status information for the integrated circuit product via the instrumentation circuitry;
displaying state information concerning the integrated circuit product based on the retrieved circuit status information.

21. A method as recited in claim 20, wherein the HDL-related debug information is described in a high-level HDL.

22. A method as recited in claim 20, wherein said displaying comprises:
relating the state information to the high-level HDL description; and displaying the high-level HDL description of the integrated circuit product with the state information related thereto.

23. A method as recited in claim 20, wherein the state information includes signal values for signals, and
wherein said relating operates to relate the signal values to HDL identifiers within the high-level HDL description that correspond to the signals.

24. An article of manufacture including program code which, when executed by a machine, causes the machine to perform method for debugging a fabricated electronic system having instrumentation circuitry included therein, wherein the electronic system is described with an HDL description, said method comprising:
as part of the electronic system's design process: generating the instrumentation circuitry at least by activating certain design visibility, design patching or design control aspects of the instrumentation circuitry;
determining configuration information of said instrumentation circuitry based on the certain activated design visibility, design patching or design control aspects;
after the electronic system has been fabricated with the instrumentation circuitry to form an integrated circuit product, configuring the instrumentation circuitry in accordance with the configuration information;
receiving debug data from the configured instrumentation circuitry operating within the integrated circuit product;
translating the debug data into HDL-related debug information; and
relating the HDL-related debug information to the HDL description.

25. A article of manufacture as recited in claim 24, wherein the HDL description is a high-level HDL description.

26. A article of manufacture as recited in claim 25, wherein the HDL-related debug information is described in a high-level HDL.

27. A article of manufacture as recited in claim 24, wherein said translating is performed automatically.

28. A article of manufacture as recited in claim 24, wherein said method operates without any requirement for a test bench.

29. A article of manufacture as recited in claim 24, wherein the debug data includes at least status information or sampling data.

30. A article of manufacture as recited in claim 23, wherein said activating is performed using a graphical user interface.

31. A article of manufacture as recited in claim 24, wherein said method further comprises:
displaying the high-level HDL description with the HDL-related debug information related thereto.

32. A article of manufacture as recited in claim 24, wherein the design control aspects include trigger conditions, and wherein said activating operates to enable a user to set one or more trigger conditions from the trigger conditions available by the instrumentation circuitry.

33. A article of manufacture as recited in claim 24, wherein the electronic system comprises an integrated circuit.

34. A article of manufacture as recited in claim 24, wherein the electronic system comprises a programmable integrated circuit.

35. A article of manufacture as recited in claim 24, wherein the electronic system includes a hardware portion and a software portion, and
  wherein said method further comprises:
    interacting with a software debugger which debugs the software of the electronic system.

36. A article of manufacture as recited in claim 24, wherein said method further comprises:
  interacting with a functional simulator which simulates a portion of the electronic system.

37. A article of manufacture as recited in claim 24, wherein the electronic system is operated in its target environment and running at its target speed during said debugging.

38. A article of manufacture as recited in claim 37, wherein the target environment includes real-time characteristics.

39. A article of manufacture as recited in claim 24, wherein while debugging the electronic system, the electronic system is operating in its target environment without interruption for the purpose of debugging.

40. A article of manufacture as recited in claim 24, wherein said debugging operates to identify at least one fault of the electronic system.

41. A article of manufacture as recited in claim 40, wherein the at least one fault is selected from the group consisting of: specification error, design error, tool error, device driver error, timing error, manufacturing fault, and environment error.

42. A article of manufacture as recited in claim 24, wherein the instrumentation circuitry comprises design instrumentation circuitry.

43. An article of manufacture including program code which, when executed by a machine, causes the machine to perform a method for debugging a fabricated integrated circuit product having instrumentation circuitry included therein, the integrated circuit product being designed with a high-level HDL description, said method comprising:
  as part of the integrated circuit product's design process:
    generating the instrumentation circuitry at least by activating certain aspects of the instrumentation circuitry for examining and/or modifying the integrated circuit product;
  determining configuration information of said instrumentation circuitry based on the certain activated aspects;
  after the integrated circuit product has been fabricated:
    configuring the instrumentation circuitry in accordance with the configuration information;
  receiving debug data from the configured instrumentation circuitry operating within the integrated circuit product;
  translating the debug data into HDL-related debug information;
  relating the HDL-related debug information to the high-level HDL description and thereafter retrieving circuit status information for the integrated circuit product via the instrumentation circuitry;
  displaying state information concerning the integrated circuit product based on the retrieved circuit status information.

44. A article of manufacture as recited in claim 43, wherein the HDL-related debug information is described in a high-level HDL.

45. A article of manufacture as recited in claim 43, wherein said displaying comprises:
  relating the state information to the high-level HDL description; and displaying the high-level HDL description of the integrated circuit product with the state information related thereto.

46. A article of manufacture as recited in claim 43, wherein the state information includes signal values for signals, and
wherein said relating operates to relate the signal values to HDL identifiers within the high-level HDL description that correspond to the signals.

* * * * *